(12) United States Patent
Yeh et al.

(10) Patent No.: US 12,224,204 B2
(45) Date of Patent: Feb. 11, 2025

(54) SEMICONDUCTOR DEVICE AND METHOD

(71) Applicant: Taiwan Semiconductor Manufacturing Company, Ltd., Hsinchu (TW)

(72) Inventors: Po-Nan Yeh, Hsinchu (TW); Yu-Shih Wang, Tainan (TW); Ming-Hsi Yeh, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 166 days.

(21) Appl. No.: 17/873,353

(22) Filed: Jul. 26, 2022

(65) Prior Publication Data

US 2022/0367258 A1 Nov. 17, 2022

Related U.S. Application Data

(62) Division of application No. 16/728,145, filed on Dec. 27, 2019, now Pat. No. 11,488,859.

(51) Int. Cl.
*H01L 29/78* (2006.01)
*H01L 21/768* (2006.01)
*H01L 21/8234* (2006.01)
*H01L 23/532* (2006.01)
(Continued)

(52) U.S. Cl.
CPC ............... *H01L 21/76834* (2013.01); *H01L 21/823418* (2013.01); *H01L 21/823431* (2013.01); *H01L 21/823475* (2013.01); *H01L 23/53266* (2013.01); *H01L 23/53295* (2013.01);
(Continued)

(58) Field of Classification Search
None
See application file for complete search history.

(56) References Cited

U.S. PATENT DOCUMENTS

| 6,440,833 | B1 | 8/2002 | Lee et al. |
| 6,852,592 | B2 | 2/2005 | Lee et al. |
| 7,541,276 | B2 | 6/2009 | Kim et al. |

(Continued)

FOREIGN PATENT DOCUMENTS

| CN | 105280591 A | 1/2016 |
| JP | 2004015058 A | 1/2004 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

In an embodiment, a device includes: a semiconductor substrate; a first inter-layer dielectric (ILD) over the semiconductor substrate; a first conductive feature extending through the first ILD; a first etch stop layer over the first conductive feature and the first ILD, the first etch stop layer being a first dielectric material; a second ILD over the first etch stop layer; a contact having a first portion extending through the second ILD and a second portion extending through the first etch stop layer, the contact being physically and electrically coupled to the first conductive feature; and a first protective layer surrounding the second portion of the contact, the first portion of the contact being free from the first protective layer, the first protective layer being a second dielectric material, the second dielectric material being different from the first dielectric material.

20 Claims, 59 Drawing Sheets

(51) Int. Cl.
 *H01L 27/088* (2006.01)
 *H01L 29/66* (2006.01)
(52) U.S. Cl.
 CPC .... *H01L 27/0886* (2013.01); *H01L 29/66795* (2013.01); *H01L 29/785* (2013.01)

(56) References Cited

U.S. PATENT DOCUMENTS

| | | | |
|---|---|---|---|
| 7,998,825 | B2 | 8/2011 | Song et al. |
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,659,857 | B2 | 5/2017 | Huang et al. |
| 9,831,183 | B2 | 11/2017 | Lin et al. |
| 9,859,386 | B2 | 1/2018 | Ho et al. |
| 10,998,228 | B2 | 5/2021 | Yen et al. |
| 11,145,541 | B2 | 10/2021 | Wallace et al. |
| 2008/0224238 | A1 | 9/2008 | Kanakasabapathy et al. |
| 2009/0197404 | A1 | 8/2009 | Yang |
| 2009/0291542 | A1 | 11/2009 | Song et al. |
| 2015/0171007 | A1 | 6/2015 | Huang et al. |
| 2015/0235862 | A1 | 8/2015 | Takahashi et al. |
| 2016/0071799 | A1 | 3/2016 | Hsieh et al. |
| 2016/0172186 | A1 | 6/2016 | Suen et al. |
| 2018/0033866 | A1* | 2/2018 | Liao .................. H01L 29/42376 |
| 2018/0151560 | A1 | 5/2018 | Hsu et al. |
| 2019/0136161 | A1 | 5/2019 | Kamimura et al. |
| 2019/0148226 | A1* | 5/2019 | Yim .................... H01L 29/6656 257/383 |
| 2019/0148287 | A1 | 5/2019 | Chang et al. |
| 2019/0333807 | A1 | 10/2019 | Tung et al. |

FOREIGN PATENT DOCUMENTS

| | | |
|---|---|---|
| JP | 2010251640 A | 11/2010 |
| KR | 20040053841 A | 6/2004 |
| KR | 20060090449 A | 8/2006 |
| KR | 20090120921 A | 11/2009 |
| KR | 20100008556 A | 1/2010 |
| KR | 20150069565 A | 6/2015 |
| KR | 20190071829 A | 6/2019 |
| TW | 201924004 | 6/2019 |
| WO | 2009079657 A2 | 6/2009 |

\* cited by examiner

SEMICONDUCTOR DEVICE AND METHOD

PRIORITY CLAIM AND CROSS-REFERENCE

This application is a divisional of U.S. patent application Ser. No. 16/728,145, filed on Dec. 27, 2019, entitled "Semiconductor Device and Method," which application is hereby incorporated herein by reference.

BACKGROUND

Generally, active devices and passive devices are formed on and in a semiconductor substrate. Once formed, these active devices and passive devices may be connected to each other and to external devices using a series of conductive and insulative layers. These layers may help to interconnect the various active devices and passive devices as well as provide an electrical connection to external devices through, for example, a contact pad.

To form these interconnections within these layers, a series of photolithographic, etching, deposition, and planarization techniques may be employed. However, the use of such techniques has become more complicated as the size of active and passive devices have been reduced, causing a reduction in the size of the interconnects to be desired as well. As such, improvements in the formation and structure of the interconnects is desired in order to make the overall devices smaller, cheaper, and more efficient with fewer defects or problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
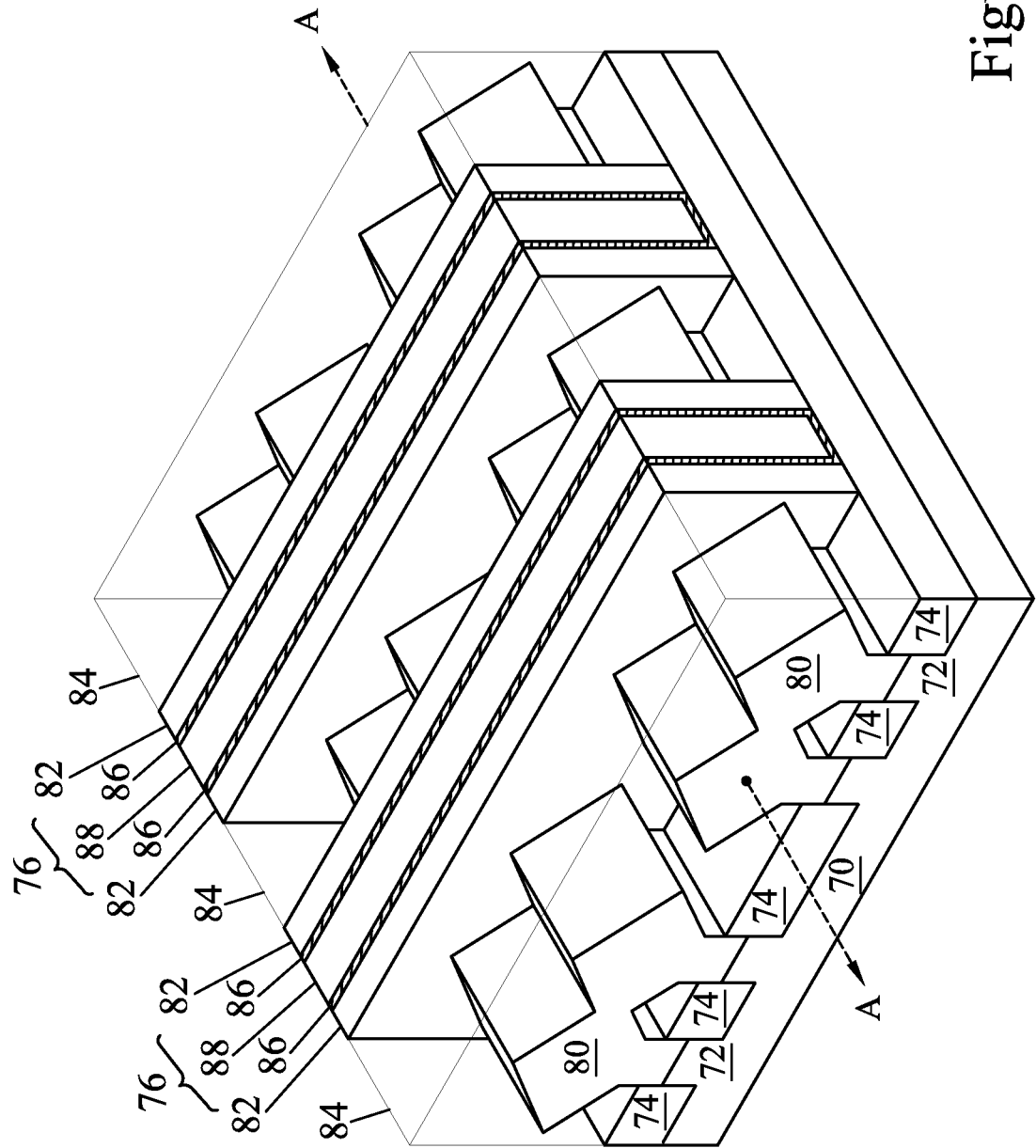
FIG. 1 illustrates an example of simplified Fin Field-Effect Transistors (FinFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an etch-stop layer (ESL) is formed between adjacent dielectric layers, such as between inter-layer dielectric (ILDs). The ESL is formed of aluminum oxide, and the ILDs are formed of silicon oxide, allowing the ESL and ILDs to have high etch selectivity relative a set of etching processes. Over-etching of the ESL may thus be avoided, decreasing pattern loading effects. When forming openings for source/drain or gate contacts, a multi-step etch is performed. In particular, a dry etch is performed to pattern the overlying ILD, and a wet etch is then performed to extending the openings through the ESL. The wet etch includes a dielectric protective agent, which helps control the amount of lateral etching of the ESL by forming protective layers on sidewalls of the ESL during etching. By controlling the amount of lateral etching, the amount of the lateral etching of the ESL may be reduced, which helps reduce the amount of current leakage from the contacts subsequently formed in the openings.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The FinFETs may be electrically connected or coupled in a manner to operate as, for example, one transistor or more, such as four transistors. The FinFETs comprise a substrate 70 and fins 72 extending from the substrate 70. Shallow trench isolation (STI) regions 74 are disposed over the substrate 70, and the fins 72 protrude above and from between neighboring STI regions 74. The FinFETs further comprise gate stacks 76 disposed on the fins 72 and STI regions 74. The gate stacks 76 extend along the sidewalls and over the top surfaces of the fins 72, and cover respective channel regions 78 (see FIG. 2) of the fins 72. The FinFETs further comprise source/drain regions 80 disposed in the fins 72 on opposite sides of the gate stacks 76, adjoining the channel regions 78 of the fins 72. Gate spacers 82 are disposed along the sidewalls of the gate stacks 76, and physically and electrically separate the source/drain regions 80 from the gate stacks 76. A first inter-layer dielectric (ILD) 84 is disposed over the source/drain regions 80, along opposing sides of the gate stacks 76. As discussed further below, a second ILD can be deposited over the first ILD 84.

The substrate 70 may be a semiconductor substrate, such as a bulk semiconductor, a semiconductor-on-insulator (SOI) substrate, or the like, which may be doped (e.g., with a p-type or an n-type dopant) or undoped. The substrate 70 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 70 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 70 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The fins 72 are semiconductor strips. In some embodiments, the fins 72 may be formed in the substrate 70 by etching trenches in the substrate 70, with remaining material of the substrate 70 between the trenches forming the fins 72. The etching may be any acceptable etch process, such as a reactive ion etch (RIE), neutral beam etch (NBE), the like, or a combination thereof. The etch process may be anisotropic.

The STI regions 74 are formed of an insulation material. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In some embodiments, the insulation material is silicon oxide formed by a FCVD process. In some embodiments a liner (not shown) may first be formed along a surface of the substrate 70 and the fins 72, and a fill material (such as the insulation material described above) may be formed on the liner. A removal process is applied to the insulation material to expose the fins 72. In some embodiments, a planarization process such as a chemical mechanical polish (CMP), an etch back process, combinations thereof, or the like may be utilized to expose the fins 72, with portions of the insulation material remaining after the planarization process forming the STI regions 74.

The process described above is just one example of how the fins 72 may be formed. The fins 72 and STI regions 74 may be formed with any acceptable process. In another embodiment, the fins 72 are formed after the STI regions 74. For example, a layer of insulation material may be formed over the substrate 70, and openings may be formed in the insulation material. The fins 72 may then be grown in the openings by an epitaxial growth process, with the portions of the insulation material remaining between the fins 72 forming the STI regions 74.

Appropriate wells (not shown) may be formed in the fins 72 and/or substrate 70. When n-type devices, such as NMOS transistors, e.g., n-type FinFETs are formed, p-type wells may be formed. When p-type devices, such as PMOS transistors, e.g., p-type FinFETs are formed, n-type wells may be formed. In some embodiments, the wells are formed by implantation doping. In some embodiments, the grown materials of the fins 72 and/or substrate 70 may be in-situ doped during growth, which may obviate the implantation doping, although in-situ and implantation doping may be used together.

The gate stacks 76 may be formed with a gate-first process or a gate-last process. When a gate-first process is used, the gate stacks 76 are initially formed over the respective channel regions 78 of the fins 72, the gate spacers 82 are then deposited along the sidewalls of the gate stacks 76, the source/drain regions 80 are grown adjacent the gate spacers 82, and the first ILD 84 is deposited over the source/drain regions 80. When a gate-last process is used, dummy gate stacks are initially formed on the channel regions 78 of the fins 72, the gate spacers 82 are deposited along the sidewalls of the dummy gate stacks, the source/drain regions 80 are grown adjacent the gate spacers 82, the first ILD 84 is deposited over the source/drain regions 80, and the dummy gate stacks are then replaced with replacement gate stacks 76. The gate stacks 76 include gate dielectrics 86 on the fins 72 and STI regions 74, and gate electrodes 88 over the gate dielectrics 86. When a gate-last process is used, the gate dielectrics 86 can extend along sidewalls of the gate spacers 82; when a gate-first process is used, the gate dielectrics 86 do not extend along sidewalls of the gate spacers 82.

The gate spacers 82 may be formed of a dielectric material, such as silicon nitride, silicon carbon nitride, a combination thereof, or the like. In some embodiments (not shown), the gate spacers 82 are formed of a multi-layered insulating material, and include multiple layers. For example, the gate spacers 82 may include multiple layers of silicon nitride, or may include a layer of silicon oxide disposed between two layers of silicon nitride.

The gate dielectrics 86 may be formed of a dielectric material, such as silicon oxide, silicon nitride, or multilayers thereof. In some embodiments, the gate dielectrics 86 include a high-k dielectric material, and in these embodiments, the gate dielectrics 86 may have a k value greater than about 7.0, and may include a metal oxide or a silicate of Hf, Al, Zr, La, Mg, Ba, Ti, Pb, and combinations thereof. The formation methods of the gate dielectrics 86 may include Molecular-Beam Deposition (MBD), atomic layer deposition (ALD), PECVD, and the like.

The gate electrodes 88 are deposited over the gate dielectrics 86. The gate electrodes 88 may include a metal-containing material such as TiN, TiO, TaN, TaC, Co, Ru, Al, W, combinations thereof, or multi-layers thereof. For example, although single-layered gate electrodes 88 are illustrated in FIG. 1, the gate electrodes 88 may comprise any number of liner layers (not shown), any number of work function tuning layers, and a fill material 88A (see FIG. 2). In some embodiments, the gate electrodes 88 include a capping layer 88B (see FIG. 2), which can help lower the resistance of subsequently formed gate contacts. After the filling of the gate electrodes 88, a planarization process, such as a CMP, may be performed to remove the excess portions of the gate dielectrics 86 and gate electrodes 88 over the gate spacers 82.

The source/drain regions 80 may be formed by an epitaxial growth process. In such embodiments, recesses are formed in the fins 72, adjacent the gate spacers 82. One or more epitaxy processes are performed to grow the source/drain regions 80 in the recesses. The source/drain regions 80 may be formed of any acceptable material for p-type or n-type devices. For example, when n-type devices are desired, the source/drain regions 80 can include materials exerting a tensile strain in the channel regions of the fins 72, such as silicon, SiC, SiCP, SiP, or the like. Likewise, when p-type devices are desired, the source/drain regions 80 can include materials exerting a compressive strain in the channel regions of the fins 72, such as SiGe, SiGeB, Ge, GeSn, or the like. The source/drain regions 80 are doped with n-type and/or p-type impurities, and can be in situ doped during growth, or can be implanted with dopants after growth. In embodiments where multiple transistors are formed, the source/drain regions 80 may be shared between various transistors. For example, in embodiments where one transistor is formed of multiple fins 72, neighboring source/drain regions 80 may be electrically connected, such as through coalescing the source/drain regions 80 during epitaxial growth, or through coupling the source/drain regions 80 with a same source/drain contact.

After formation of the source/drain regions 80, the first ILD 84 is deposited over the source/drain regions 80. The first ILD 84 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) is disposed between the first ILD 84 and the gate stacks 76, source/drain regions 80, and gate spacers 82. A planarization process, such as a CMP, may then be performed to level the top surface of the first ILD 84 with the top surfaces of the gate stacks 76 and gate spacers 82. Top surfaces of the gate stacks 76, gate spacers 82, and first ILD 84 are thus level. Accordingly, the top surfaces of the gate stacks 76 are exposed through the first ILD 84.

FIGS. 2 through 19 are cross-sectional views of intermediate stages in the manufacturing of contacts for FinFETs, in accordance with some embodiments. FIGS. 2 through 19 are shown along a reference cross-section A-A illustrated in FIG. 1, except for multiple FinFETs. Cross-section A-A is along a longitudinal axis of a fin 72 and in a direction of, for example, a current flow between the source/drain regions 80.

Figure 2:
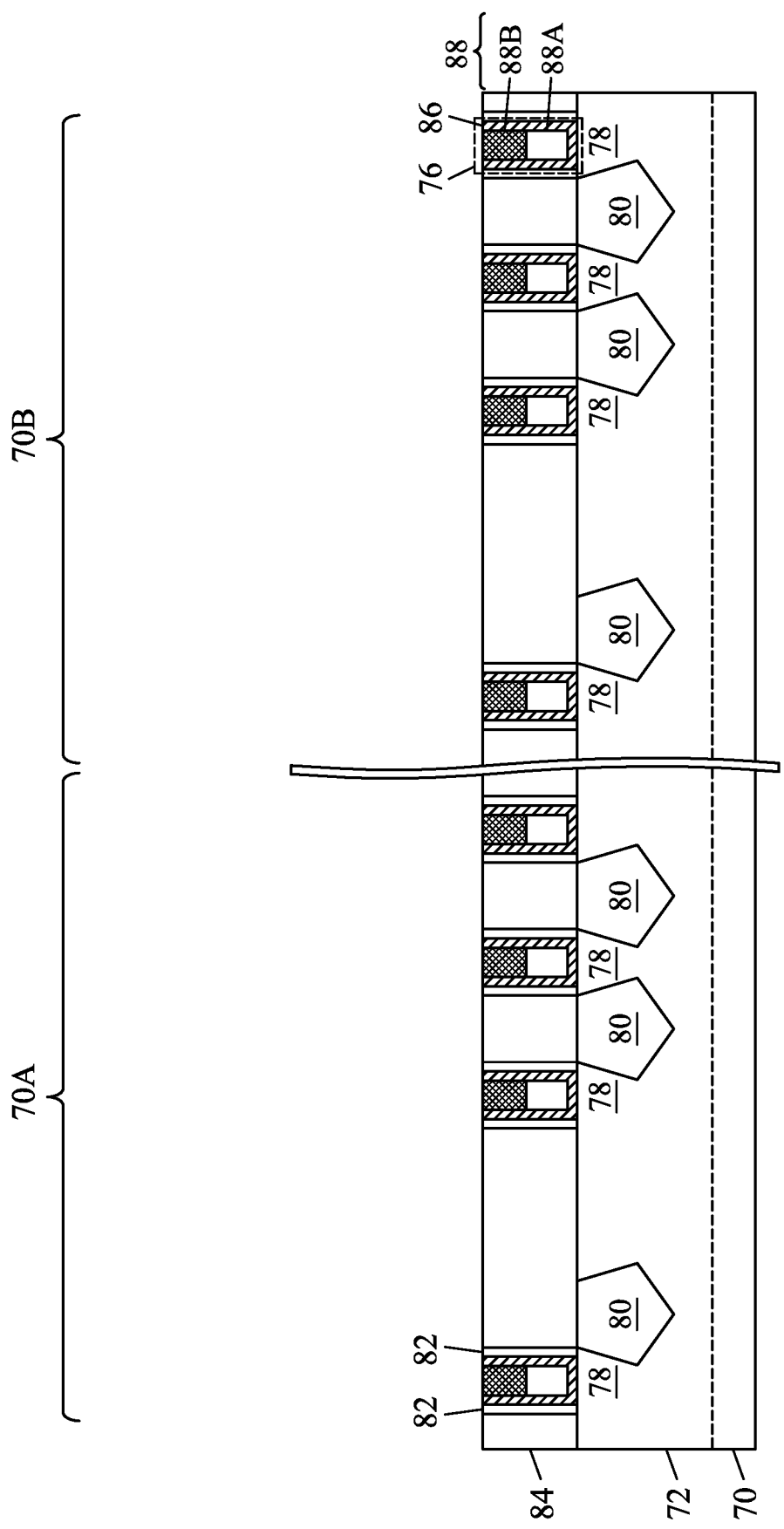
FIGS. 2 through 19 are cross-sectional views of intermediate stages in the manufacturing of contacts for FinFETs, in accordance with some embodiments.

FIG. 2 illustrates a region 70A and a region 70B of the substrate 70, after the formation of features similar to the FinFETs shown in FIG. 1. In some embodiments, the region 70A is used for forming n-type devices, and the region 70B is used for forming p-type devices. In some embodiments, the regions 70A and 70B are used for forming the same types of devices. The regions 70A and 70B may include the same fins 72 or different fins 72.

Figure 3:
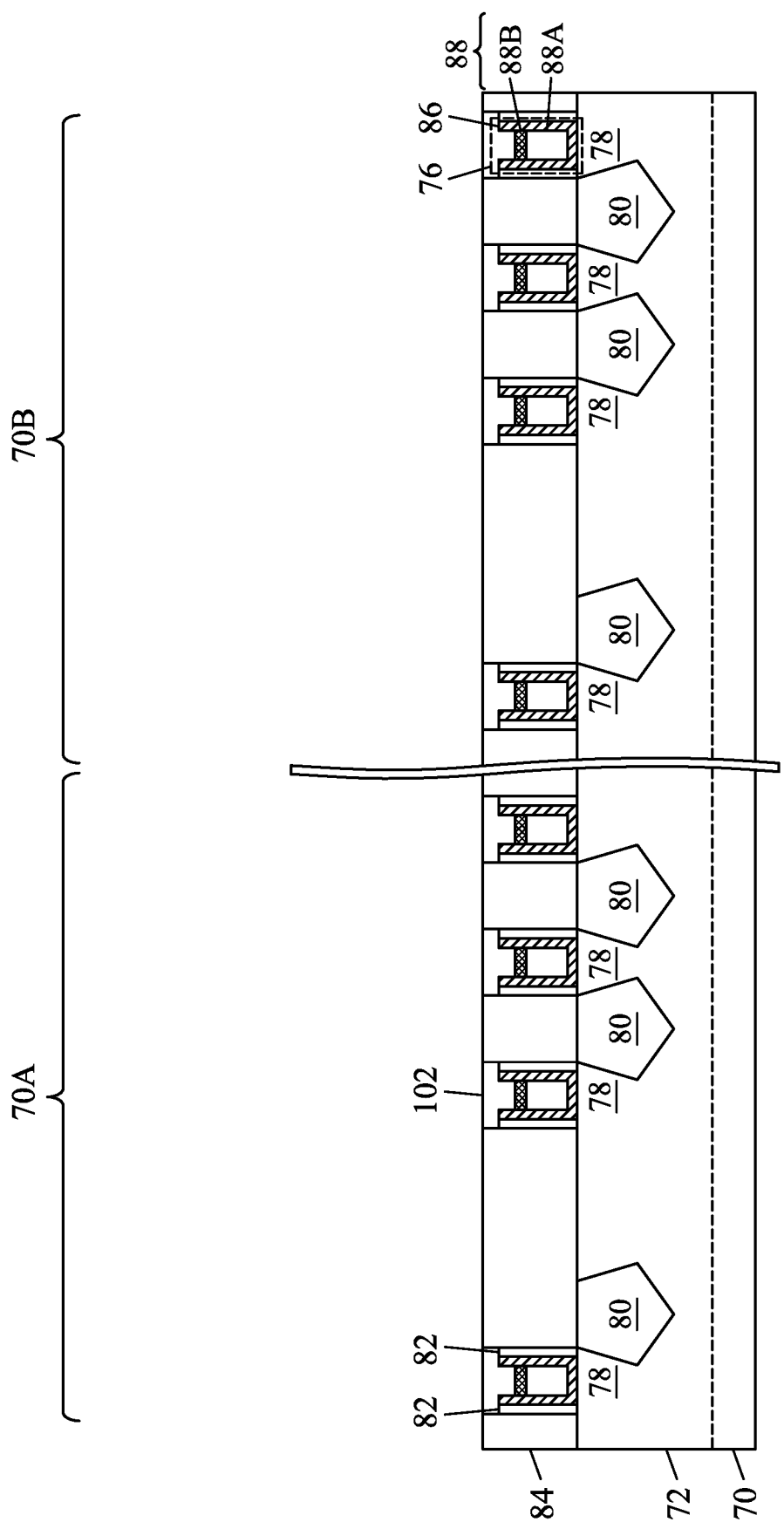

In FIG. 3, gate masks 102 are formed over the gate stacks 76. The gate masks 102 protect the gate stacks 76 during subsequent processing, and subsequently formed gate contacts will penetrate through the gate masks 102 to contact the top surfaces of the gate electrodes 88. The gate masks 102 may also be formed over the gate spacers 82. As an example to form the gate masks 102, the gate dielectrics 86 and gate electrodes 88 are recessed by, e.g., an acceptable etching process, such as a wet or dry etch. The gate spacers 82 may also be partially recessed by the etching process. Due to differences in etching rates of the different materials, the gate electrodes 88 may be recessed further than the gate dielectrics 86 and gate spacers 82. One or more layers of dielectric material, such as silicon nitride, silicon oxynitride, or the like, are filled in the recesses. In some embodiments, the gate masks 102 are formed of silicon nitride. A planarization process may be performed to remove excess portions of the dielectric material extending over the first ILD 84. Remaining portions of the dielectric material in the recesses forms the gate masks 102.

Figure 4A:
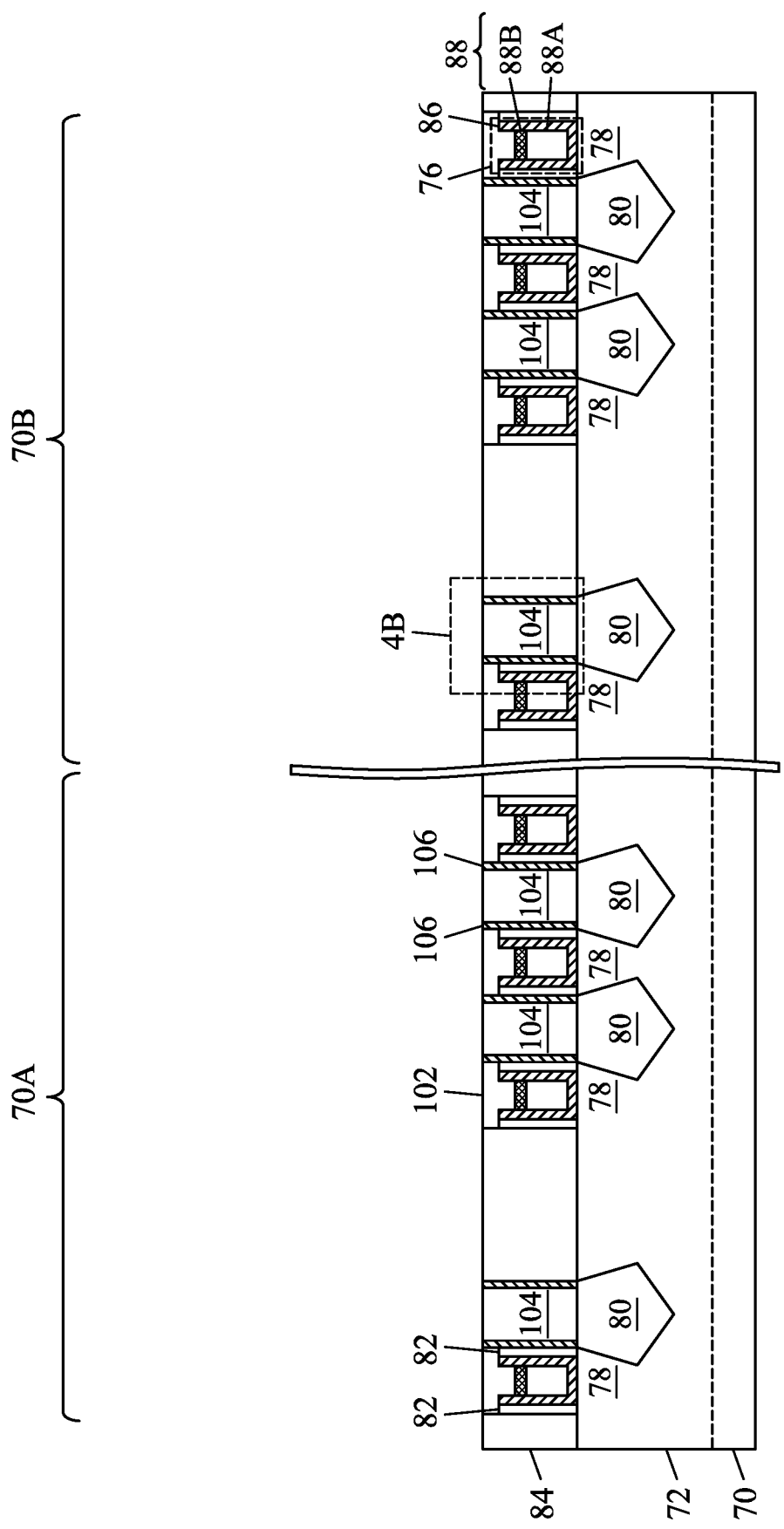
Figure 4B:
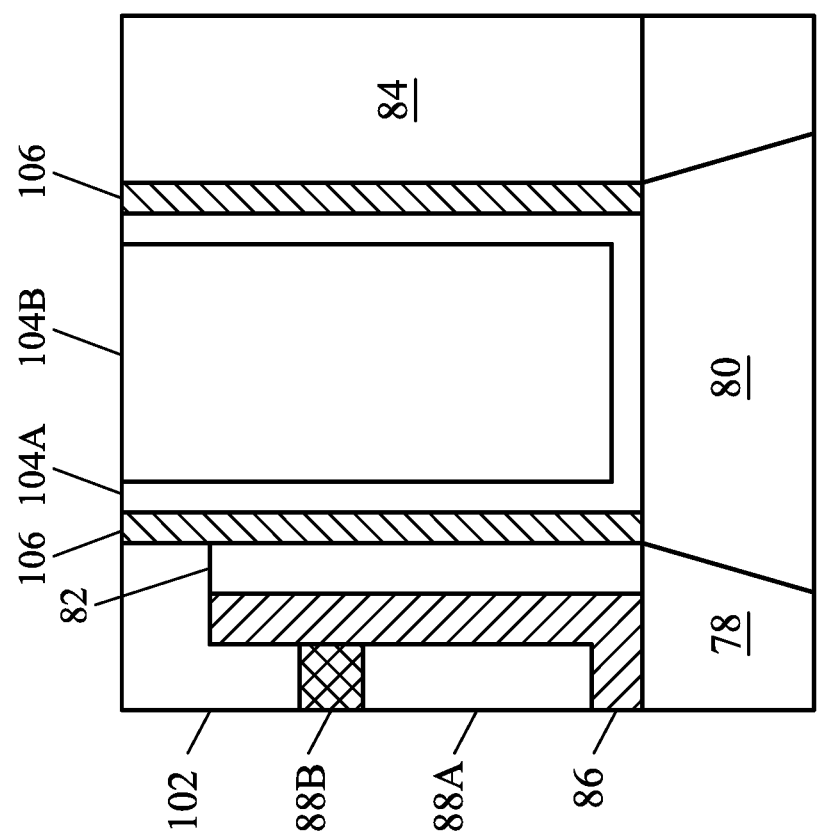

In FIG. 4A, lower source/drain contacts 104 are formed through the first ILD 84 to be physically and electrically coupled to the source/drain regions 80. FIG. 4B is a detailed view of a region 4B in FIG. 4A, showing additional details of the lower source/drain contacts 104. Openings for the lower source/drain contacts 104 are formed through the first ILD 84. The openings may be formed using acceptable photolithography and etching techniques. For example, a liner 104A, such as a diffusion barrier layer, an adhesion layer, or the like, and a conductive material 104B can be formed in the openings. The liner 104A may include titanium, titanium nitride, tantalum, tantalum nitride, or the like. The conductive material 104B may be copper, a copper alloy, silver, gold, tungsten, cobalt, aluminum, nickel, or the like. In some embodiments, the conductive material 104B is cobalt. A planarization process, such as a CMP, may be performed to remove excess material from the top surface of the first ILD 84. The remaining liner 104A and conductive material 104B form the lower source/drain contacts 104. An anneal process may be performed to form a silicide at the interface between the lower source/drain contacts 104 and the source/drain regions 80.

In some embodiments, contact liners 106 are formed around the lower source/drain contacts 104. The contact liners 106 may be formed by conformally depositing a layer of dielectric material such as silicon nitride, silicon oxynitride, or the like in the openings for the lower source/drain contacts 104. The deposition may be by MBD, ALD, PECVD, or the like. An acceptable etch, such as an anisotropic etch, may then be performed to remove horizontal portions of the dielectric layer, with remaining portions along the sidewalls of the openings forming the contact liners 106. The lower source/drain contacts 104 may then be formed in the openings. The contact liners 106 are additional layers that help physically and electrically separate the lower source/drain contacts 104 from the gate stacks 76.

Figure 5:
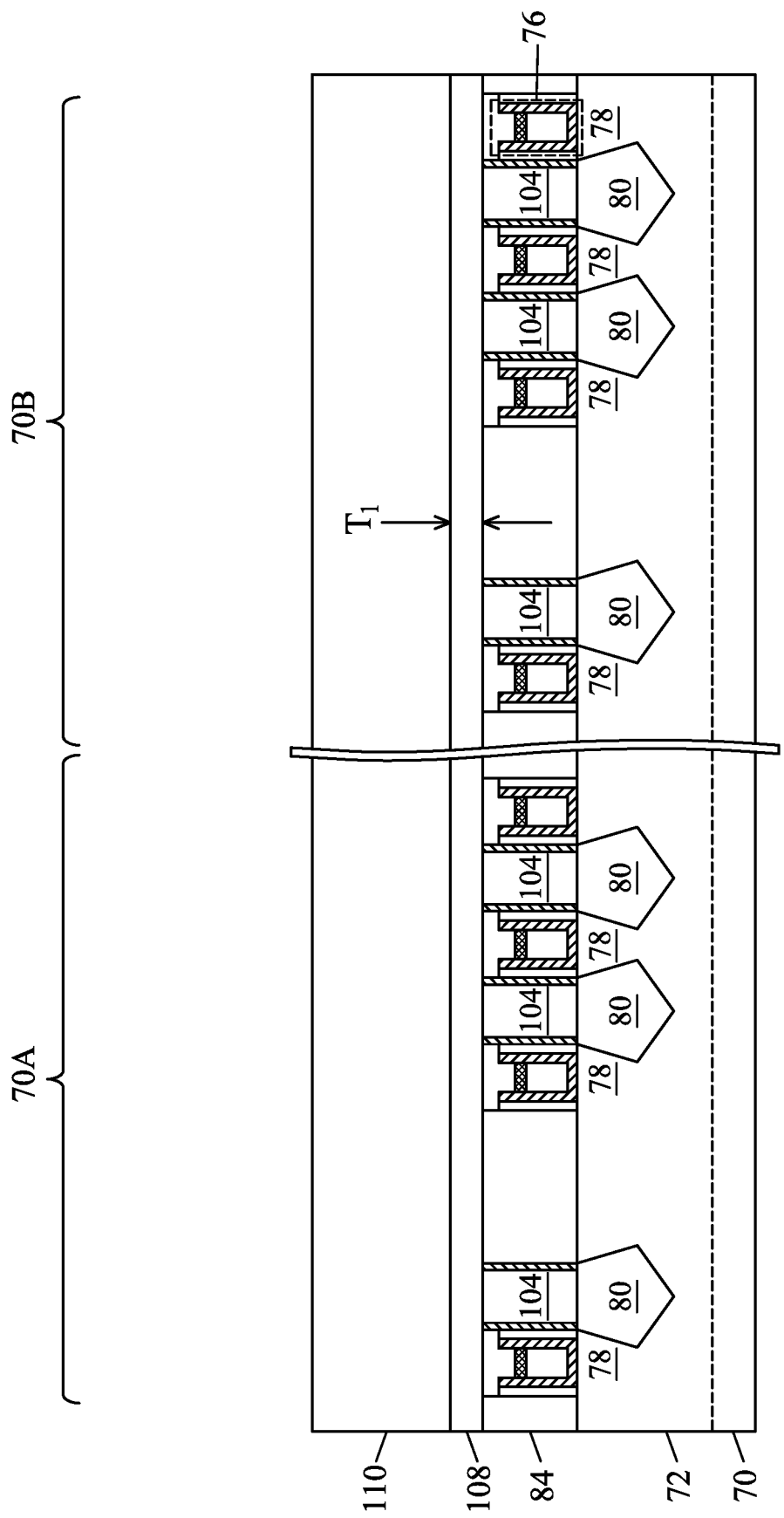

In FIG. 5, an etch stop layer 108 is formed over the first ILD 84, gate masks 102, lower source/drain contacts 104, and contact liners 106 (when formed). A second ILD 110 is then formed over the etch stop layer 108. The etch stop layer 108 is formed of a material that has a high etch selectivity with the second ILD 110, such that the second ILD 110 is etched at a higher rate than the etch stop layer 108 relative a same etching process. For example, the etch stop layer 108 is formed of an insulating material, such as a single layer of aluminum oxide. The etch stop layer 108 may be formed by a deposition process such as ALD, CVD, PECVD, or the like. Because the etch stop layer 108 has a high etch selectivity with the second ILD 110 relative a same etching process, it can be formed to a small thickness $T_1$. For example, the etch stop layer 108 can have a thickness $T_1$ in the range of about 20 Å to about 50 Å.

The second ILD 110 is a flowable film that can be formed by a flowable CVD method. In some embodiments, the second ILD 110 is formed of a dielectric material such as PSG, BSG, BPSG, USG, or the like, and may be deposited by any suitable method, such as CVD and PECVD.

Figure 6:
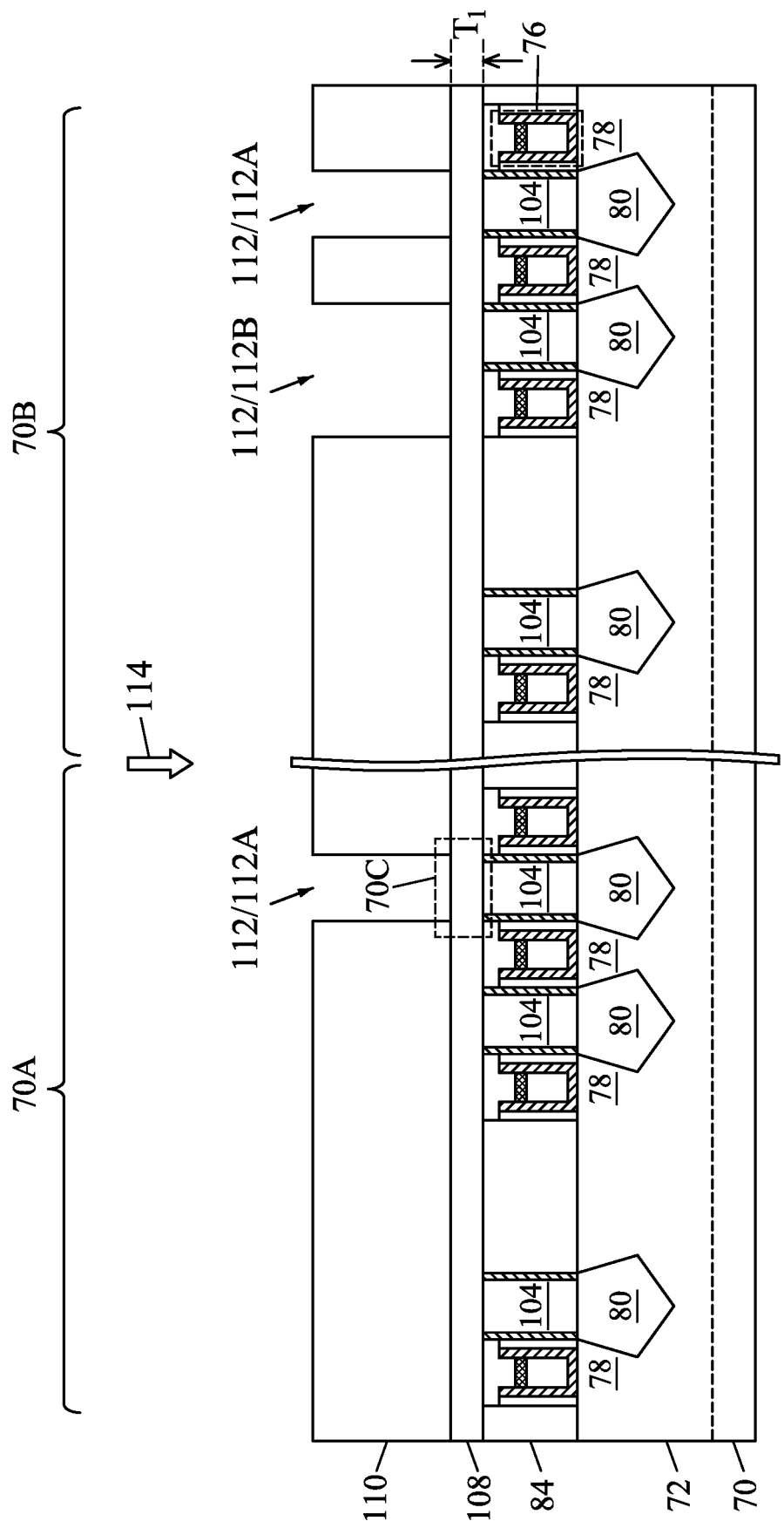

In FIG. 6, source/drain contact openings 112 are formed through second ILD 110. The source/drain contact openings 112 expose the etch stop layer 108. The source/drain contact openings 112 may be formed using acceptable photolithography and etching techniques. A photoresist (not shown) is formed over the second ILD 110 and patterned with the pattern of the source/drain contact openings 112. In some embodiments, a dry etch process 114 is performed to transfer the pattern of the photoresist to the second ILD 110, thus forming the source/drain contact openings 112. For example, in some embodiments the dry etch process 114 comprises generating a plasma sheath over the second ILD 110 using chlorine or bromine gas. The dry etch process 114 can be performed in an environment comprising argon or nitrogen, and can be performed for a duration in the range of about 10 seconds and about 150 seconds.

The material of the etch stop layer 108 (e.g., aluminum oxide) has a high etch selectivity with the material of the second ILD 110 (e.g., silicon oxide), such that the second ILD 110 is etched at a higher rate than the etch stop layer 108 relative the dry etch process 114. For example, the ratio of the etching rate of the second ILD 110 to the etching rate of the etch stop layer 108, relative the dry etch process 114, can be in the range of about 10:1 to about 100:1. As such, substantially no reduction or very little reduction in thickness $T_1$ of the etch stop layer 108 occurs during the dry etch process 114. Loading effects in subsequent processing may be reduced by reducing over-etching of the etch stop layer 108

Figure 7:
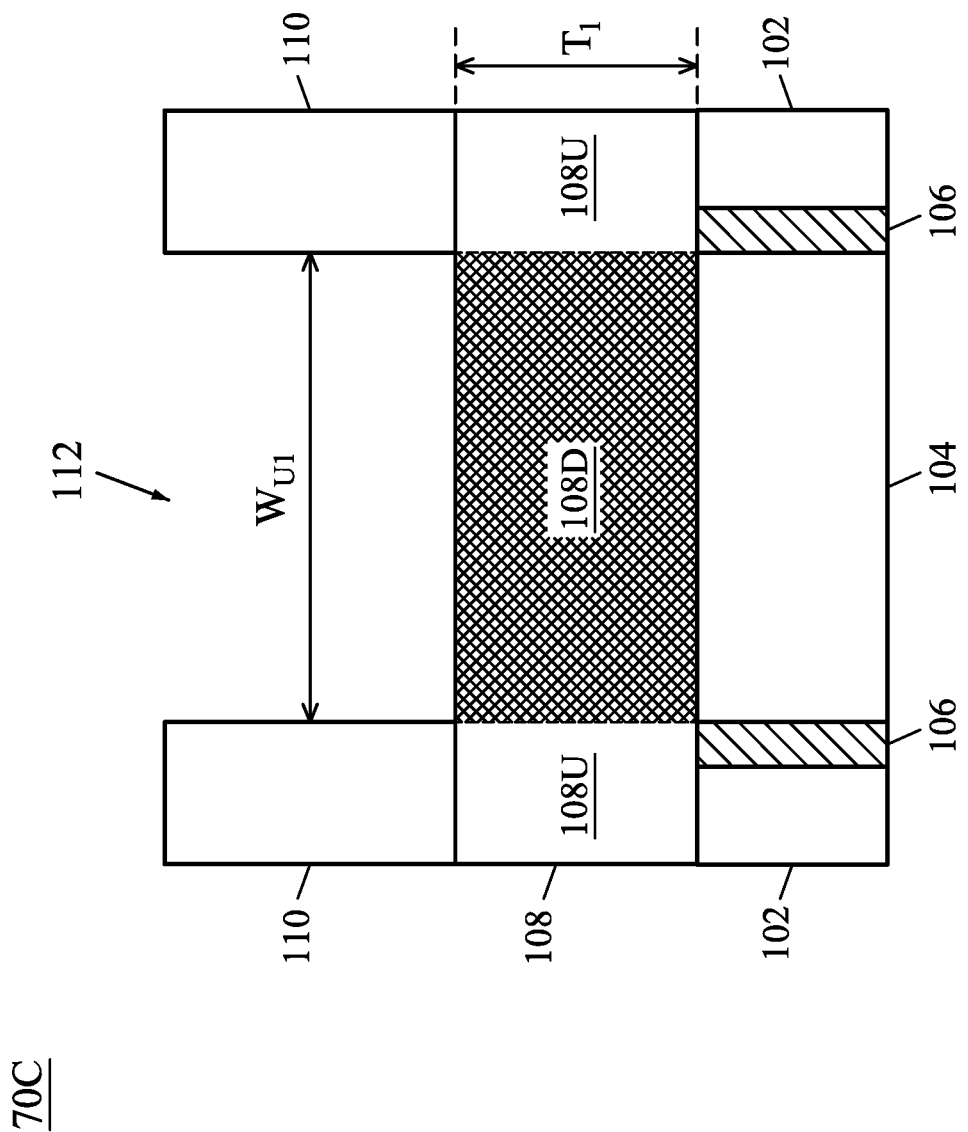

FIG. 7 illustrates additional details of a region 70C of FIG. 6, after the dry etch process 114 is performed. Although substantially no reduction in thickness $T_1$ of the etch stop layer 108 occurs during the dry etch process 114, some regions 108D of the etch stop layer 108 are damaged (or more generally, modified) by the dry etch process 114. For example, the etchants of the dry etch process 114 may react with the material of the etch stop layer 108, changing the material composition of the damaged etch stop layer regions 108D. Depending on the precise parameters of the dry etch process 114, the new material composition of the damaged etch stop layer regions 108D may be more porous. In some embodiments, the dry etch process 114 replaces oxygen in the damaged etch stop layer regions 108D with fluoride or bromide compounds. Thus, the damaged etch stop layer regions 108D are a different material than undamaged etch stop layer regions 108U. For example, the undamaged etch stop layer regions 108U may still be formed of aluminum oxide, but the damaged etch stop layer regions 108D may be formed of aluminum chloride, aluminum bromide, or the like. As discussed further below, the damaged etch stop layer regions 108D will be more quickly etched in subsequent processing.

Figure 8:
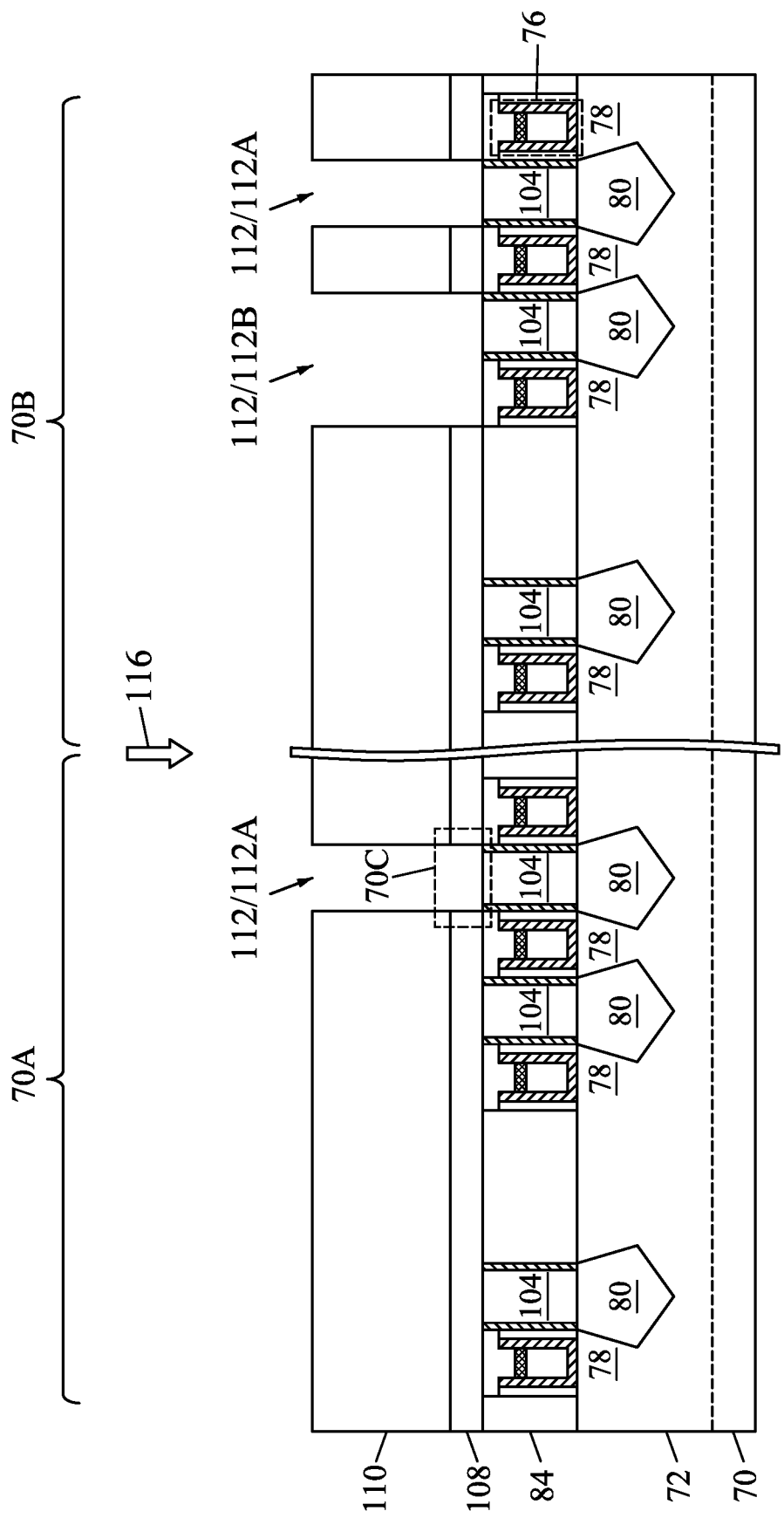

In FIG. 8, the source/drain contact openings 112 are extended through the etch stop layer 108. The extended source/drain contact openings 112 expose the lower source/drain contacts 104. The source/drain contact openings 112 may be extended using an acceptable etching technique. In some embodiments, a wet etch process 116 is performed to extend the source/drain contact openings 112 through the etch stop layer 108.

Figure 9A:
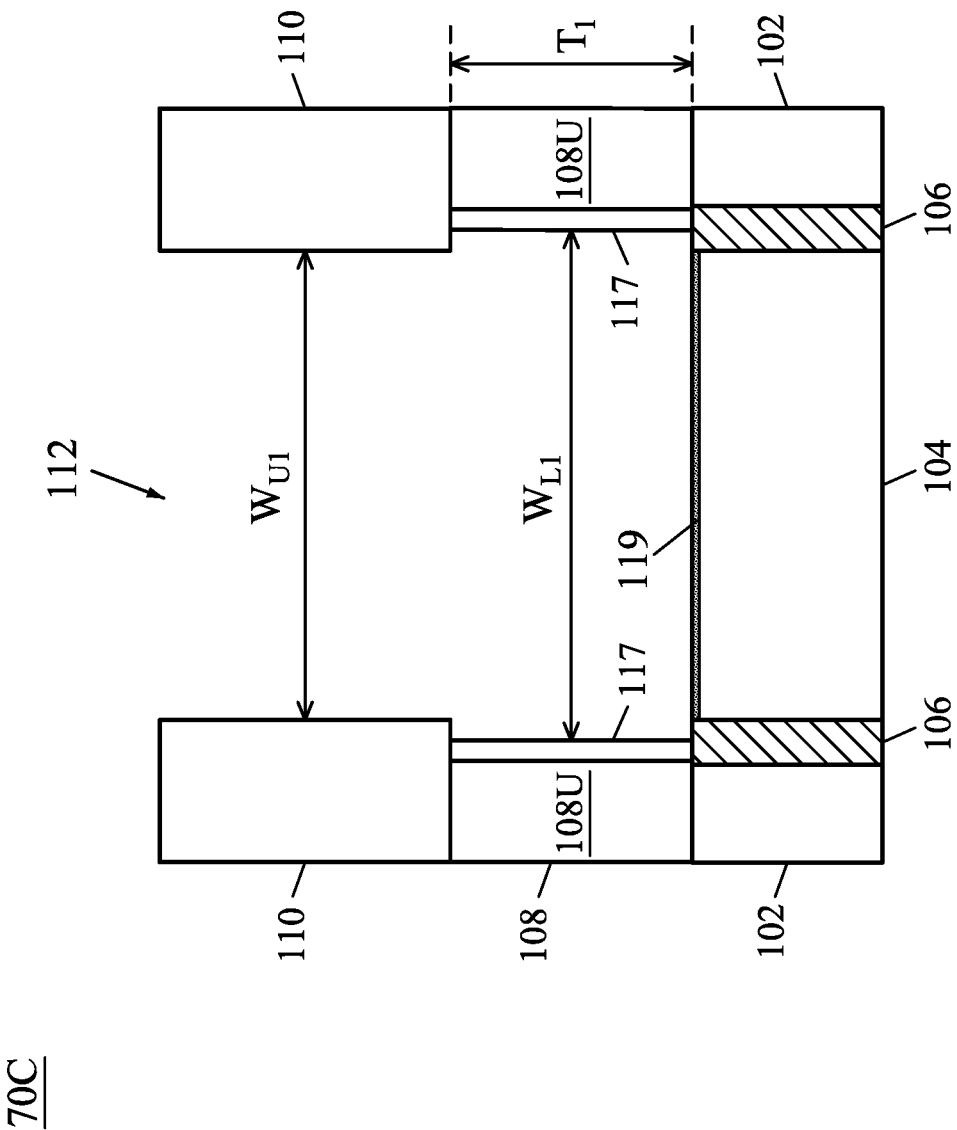
Figure 9B:
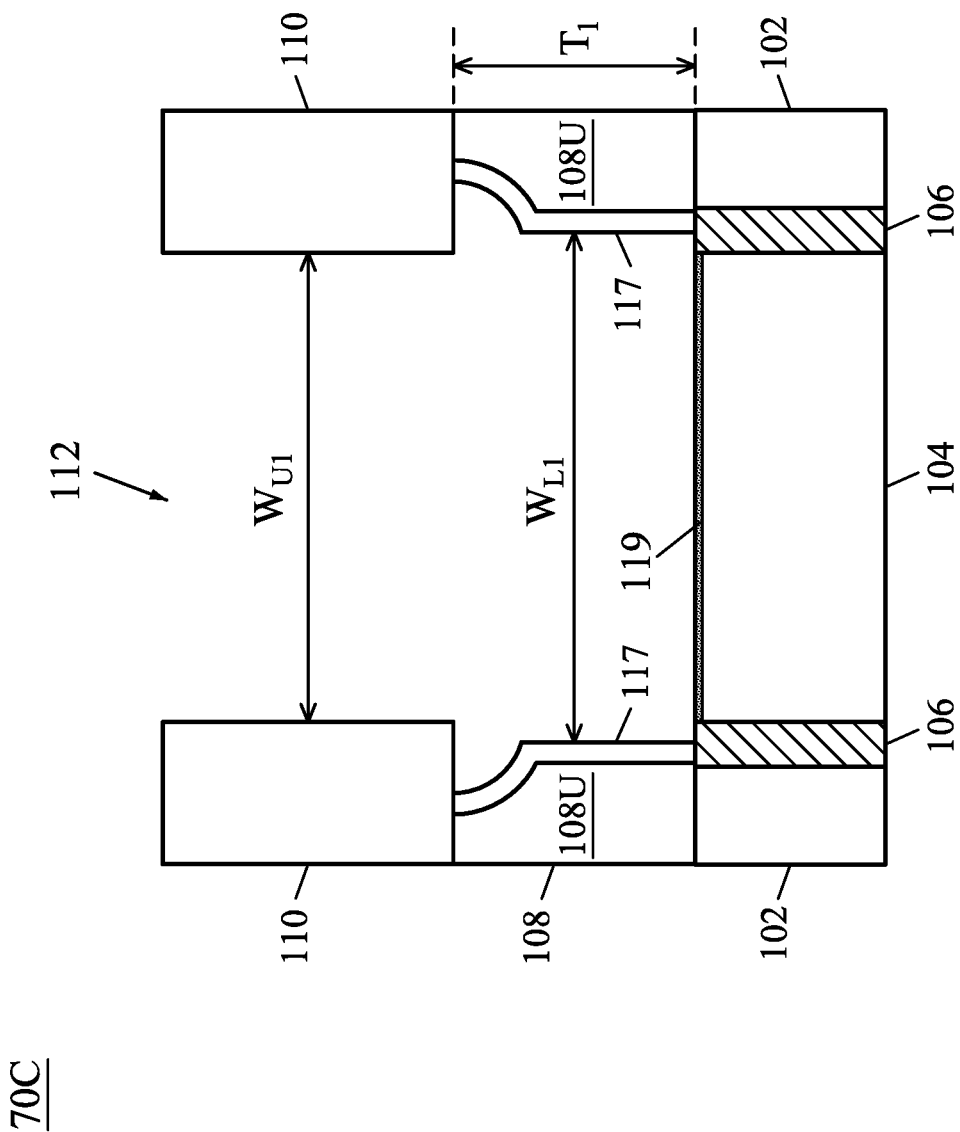

FIG. 9A illustrates additional details of the region 70C of FIG. 8, after the wet etch process 116 is performed. The wet etch process 116 is performed until the damaged etch stop layer regions 108D are removed and the lower source/drain contacts 104 are exposed. The wet etch process 116 is selective to the material of the damaged etch stop layer regions 108D (e.g., aluminum chloride or aluminum bromide), such that the damaged etch stop layer regions 108D are etched at a higher rate than the lower source/drain contacts 104 and the undamaged etch stop layer regions 108U. The wet etch process 116 can be anisotropic, but some unevenness in the profile of the sidewalls of the undamaged etch stop layer regions 108U can still occur. For example, FIG. 9B illustrates an embodiment where the undamaged etch stop layer regions 108U have a curved profile in their etched sidewalls.

The wet etch process 116 is performed by exposing the etch stop layer 108 to an etching solution that comprises an etching agent, a dielectric protective agent, and a cobalt protective agent. The etching solution can include deionized water at a concentration of about 20% to about 98% (such as about 95%), the etching agent at a concentration of about 0.1% to about 3% (such as about 2.5%), the dielectric protective agent at a concentration of about 0.01% to about 3% (such as about 2.5%), and the cobalt protective agent at a concentration of about 0.01% to about 3% (such as less than about 1%). In some embodiments, the etching solution can also include an ammonia peroxide mixture (APM) or carbonated deionized water. The etching agent reacts with the material of the damaged etch stop layer regions 108D to remove the damaged etch stop layer regions 108D while removing limited amounts of the undamaged etch stop layer regions 108U, as discussed in greater detail below. In some embodiments, the etching agent is an acid with a high alkalinity, such as hydrofluoric acid, ammonia, or the like.

The dielectric protective agent reacts with the materials of the etch stop layer 108 (e.g., aluminum oxide) to slow the etch rate of the undamaged etch stop layer regions 108U. In some embodiments, the dielectric protective agent is an oxidizer, such as hydrogen peroxide ($H_2O_2$), ozone, or the like. During the wet etch process 116, the damaged etch stop layer regions 108D are quickly removed. As sidewalls of the undamaged etch stop layer regions 108U are exposed, the dielectric protective agent reacts with the material of the undamaged etch stop layer regions 108U (e.g., aluminum oxide) to form protective layers 117. The protective layers 117 comprise a product of the dielectric protective agent and the material of the undamaged etch stop layer regions 108U. For example, when the undamaged etch stop layer regions 108U are aluminum oxide, the protective layers 117 can comprise high-density aluminum oxide or aluminum hydroxide. The density of the protective layers 117 can be greater than the density of the undamaged etch stop layer regions 108U. In some embodiments, a thermal process is performed to promote formation of the protective layers 117. For example, an anneal or baking process can be performed before the etching to thermally oxidize the sidewalls of the undamaged etch stop layer regions 108U. The protective layers 117 protect the sidewalls of the undamaged etch stop layer regions 108U. The amount of the undamaged etch stop layer regions 108U removed during the wet etch process 116 may thus be greatly reduced or controlled.

The cobalt protective agent reacts with the materials of the lower source/drain contacts 104 (e.g., cobalt) to slow the etch rate of the lower source/drain contacts 104. In some embodiments, the cobalt protective agent is a cobalt inhibitor, such as a benzotriazole (BTA) polymer having a methyl or ethyl side chain. During the wet etch process 116, the cobalt protective agent passivates exposed surfaces of the lower source/drain contacts 104 to form a protective layer 119 that covers the lower source/drain contacts 104. The protective layer 119 can be, e.g., anthracene, and can be electrically conductive. Some protective layer 119 can remain after the wet etch process 116. The lower source/drain contacts 104 may thus remain protected during the wet etch process 116. Further, because the dielectric protective agent is an oxidizer, it can form an oxide (e.g., cobalt oxide) of the material of the lower source/drain contacts 104. The cobalt protective agent may also remove the oxide from the lower source/drain contacts 104, thus decreasing contact resistance.

After formation, the source/drain contact openings 112 have upper widths $W_{U1}$ through the second ILD 110, and lower widths $W_{L1}$ through the etch stop layer 108. The upper widths $W_{U1}$ can be in the range of about 3 nm to about 100 nm. As noted above, the wet etch process 116 is selective to the material of the damaged etch stop layer regions 108D (e.g., aluminum chloride or aluminum bromide). Thus, although some lateral etching of the undamaged etch stop layer regions 108U occurs during the wet etch process 116, the amount of lateral etching is small. For example, the wet etch process 116 laterally etches the undamaged etch stop layer regions 108U by an amount that can be in the range of about 1 nm to about 9 nm (such as less than about 1.5 nm). Thus, the lower widths $W_{L1}$ can be in the range of about 4 nm to about 109 nm. Because the amount of lateral etching is small, the ratio of the upper widths $W_{U1}$ to the lower widths $W_{L1}$ is close to 1, such as in the range of about 3:4 to about 100:109. Depending on the amount of lateral etching, portions of the gate masks 102 and/or contact liners 106 may also be exposed.

In some embodiments, source/drain contact openings 112 of differing widths can be formed. For example, a first subset of the source/drain contact openings 112A can have small upper widths $W_{U1}$, such as upper widths $W_{U1}$ of about 3 nm, and a second subset of the source/drain contact openings 112B can have large upper widths $W_{U1}$, such as upper widths $W_{U1}$ of about 10 nm. The desired widths of the source/drain contact openings 112 can depend on the limits of the photolithographic processes used for initially forming the source/drain contact openings 112. When wider source/drain contact openings 112 are formed, they may also expose one or more of the gate masks 102 and/or contact liners 106. Because the wet etch process 116 is selective to the material of the undamaged etch stop layer regions 108U (e.g., aluminum oxide), etching of the material of the gate masks 102 (e.g., silicon nitride) may be avoided or reduced. For example, the ratio of the etching rate of the undamaged etch stop layer regions 108U to the etching rate of the gate masks 102, relative the wet etch process 116, can be greater than about 100:1.

Figure 10:
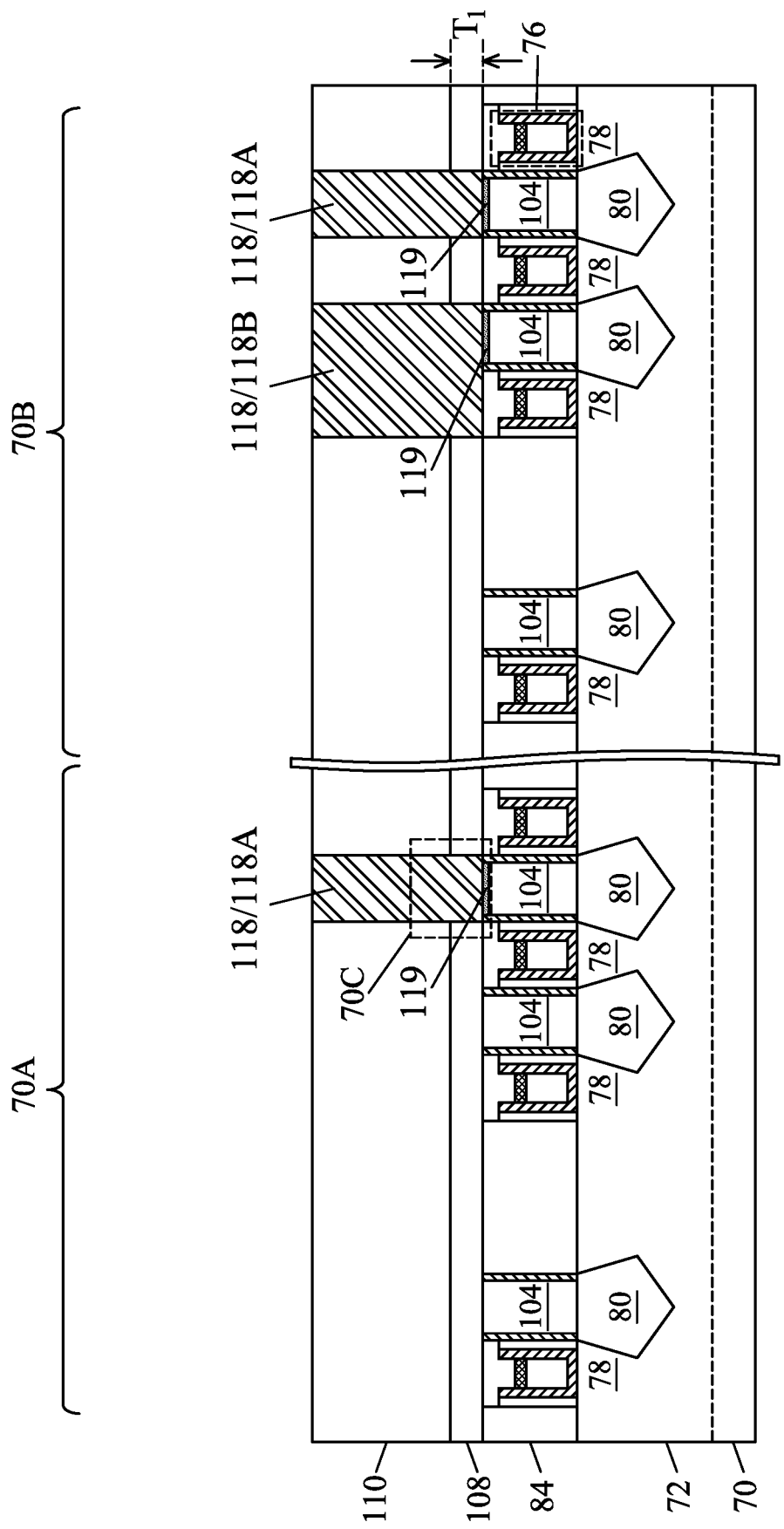

In FIG. 10, upper source/drain contacts 118 are formed through the second ILD 110 and etch stop layer 108 to be physically and electrically coupled to some of the lower source/drain contacts 104. In some embodiments, the upper source/drain contacts 118 comprises a liner, such as a diffusion barrier layer, an adhesion layer, or the like, and a conductive material formed in the source/drain contact openings 112. The liner may include titanium, titanium nitride, tantalum, tantalum nitride, or the like. The conductive material may be copper, a copper alloy, silver, gold, tungsten, cobalt, aluminum, nickel, or the like. In some embodiments, the conductive material is tungsten. In some embodiments, the lower source/drain contacts 104 are formed of a first conductive material (e.g., cobalt), and the upper source/drain contacts 118 are formed of a different second conductive material (e.g., tungsten). A planarization process, such as a CMP, may be performed to remove excess material from the top surface of the second ILD 110. The remaining liner and conductive material form the upper source/drain contacts 118.

Figure 11:
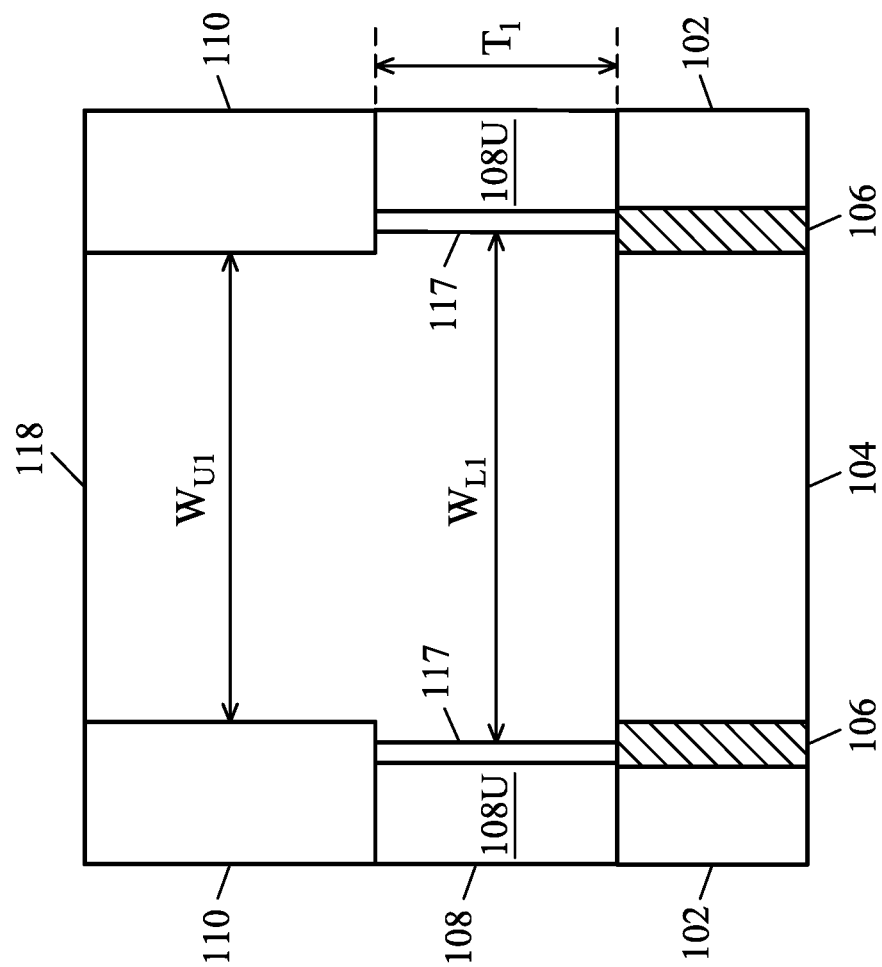

FIG. 11 illustrates additional details of the region 70C of FIG. 10, after the upper source/drain contacts 118 are formed. The portions of the upper source/drain contacts 118 that extend through the second ILD 110 have the upper widths $W_{U1}$, and the portions of the upper source/drain contacts 118 that extend through the etch stop layer 108 have the lower widths $W_{L1}$. The upper source/drain contacts 118 include upper source/drain contacts 118A in the source/drain contact openings 112A, and upper source/drain contacts 118B in the source/drain contact openings 112B.

It should be appreciated that not all lower source/drain contacts 104 have a corresponding upper source/drain contact 118. In some types of devices, a subset of the lower source/drain contacts 104 remain covered, and will be subsequently coupled to shared contacts, e.g., contacts that are shared between gate stacks 76 (see FIG. 10) and source/drain regions 80. Shared contacts can be used for forming some types of memory devices, such as static random-access memory (SRAM) devices.

Figure 12:
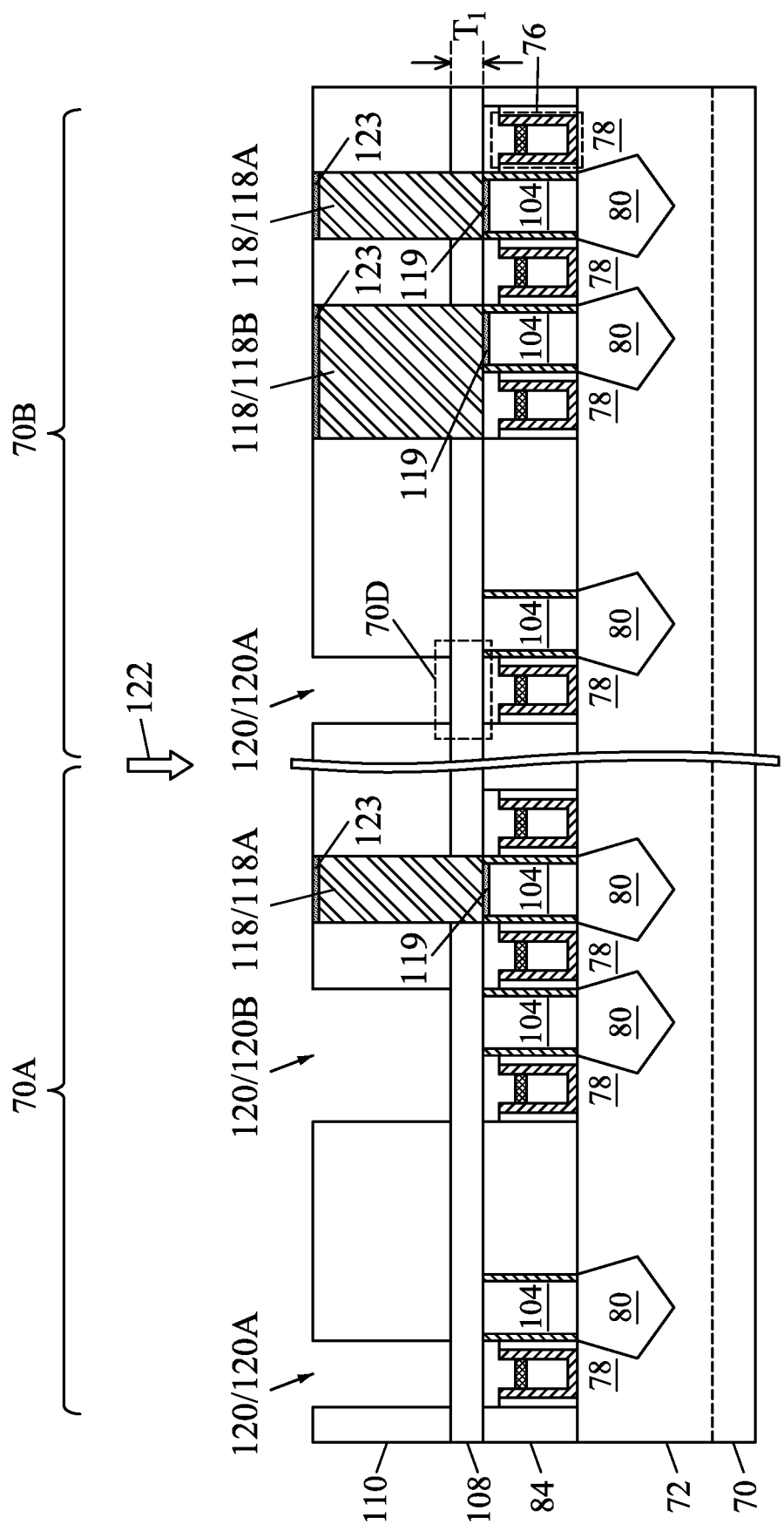

In FIG. 12, gate contact openings 120 are formed through the second ILD 110. The gate contact openings 120 expose the etch stop layer 108. The gate contact openings 120 may be formed using acceptable photolithography and etching techniques. A photoresist (not shown) is formed over the second ILD 110 and patterned with the pattern of the gate contact openings 120. In some embodiments, a dry etch process 122 is performed to transfer the pattern of the photoresist to the second ILD 110, thus forming the gate contact openings 120. The material of the etch stop layer 108 (e.g., aluminum oxide) has a high etch selectivity with the material of the second ILD 110 (e.g., silicon oxide), such that the second ILD 110 is etched at a higher rate than the etch stop layer 108 relative the dry etch process 122. As such, substantially no reduction in thickness $T_1$ of the etch stop layer 108 occurs during the dry etch process 122. Loading effects in subsequent processing may be reduced by reducing over-etching of the etch stop layer 108.

The dry etch process 122 can be similar to the dry etch process 114 (see FIG. 6). After the dry etch process 122, a post-etch cleaning process is performed. During the post-etch cleaning process, the intermediate structure is exposed to a tungsten protective agent. The tungsten protective agent adsorbs to exposed surfaces of the upper source/drain contacts 118 (e.g., tungsten) to form a protective layer 123 that protects the upper source/drain contacts 118 during subsequent processing. In some embodiments, the tungsten protective agent is a tungsten inhibitor, such as a benzotriazole (BTA) polymer having a chlorine side chain. The protective layer 123 can be, e.g., anthracene, and can be electrically conductive. Some protective layer 123 can remain after the dry etch process 122.

Figure 13:
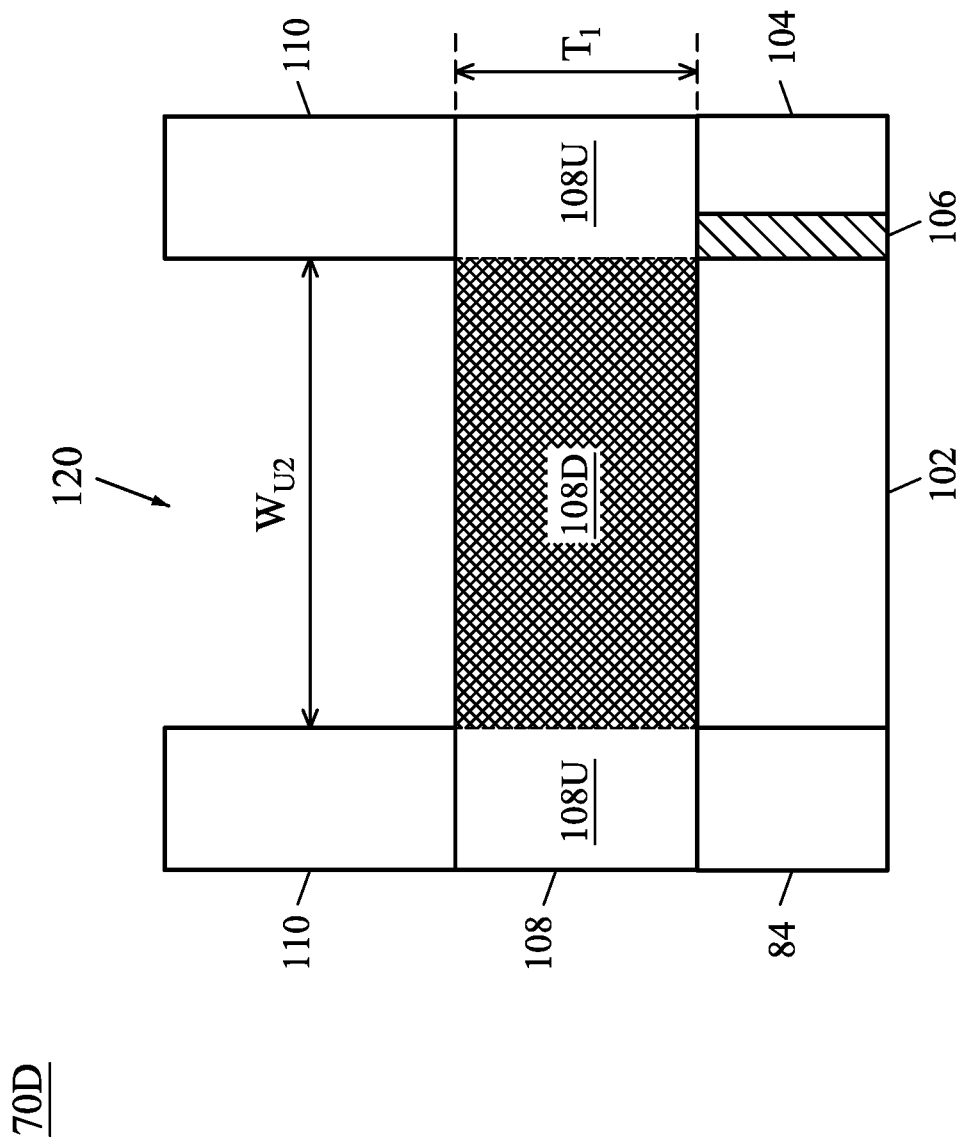

FIG. 13 illustrates additional details of a region 70D of FIG. 12, after the dry etch process 122 is performed. As discussed above, although substantially no reduction in thickness $T_1$ of the etch stop layer 108 occurs during the dry etch process 122, some regions 108D of the etch stop layer 108 are modified or damaged by the dry etch process 122. The damaged etch stop layer regions 108D are a different material than undamaged etch stop layer regions 108U, and will be more quickly etched in subsequent processing.

Figure 14:
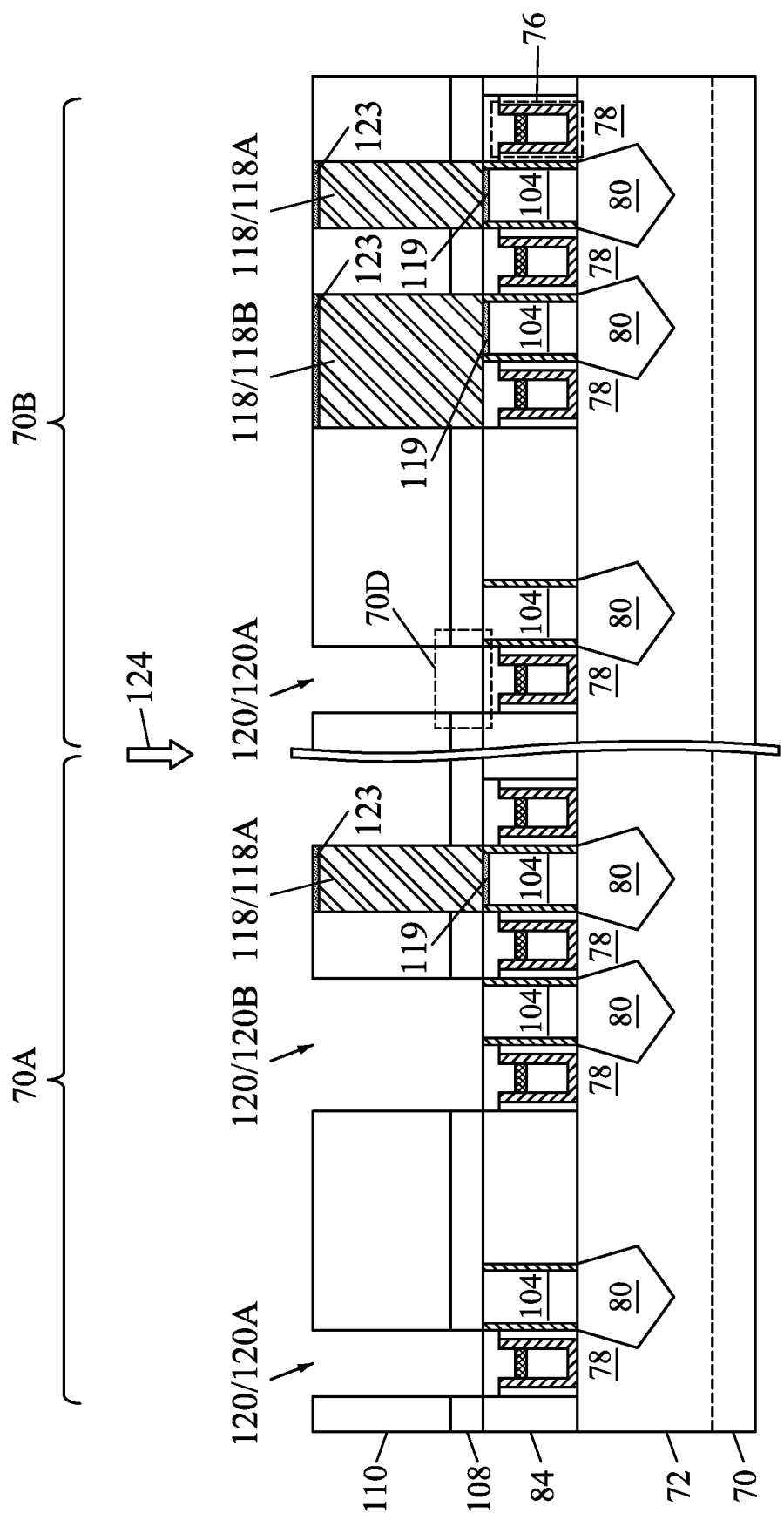

In FIG. 14, the gate contact openings 120 are extended through the etch stop layer 108. The extended gate contact openings 120 expose the gate masks 102. The gate contact openings 120 may be extended using an acceptable etching technique. In some embodiments, a wet etch process 124 is performed to extend the gate contact openings 120 through the etch stop layer 108.

Figure 15:
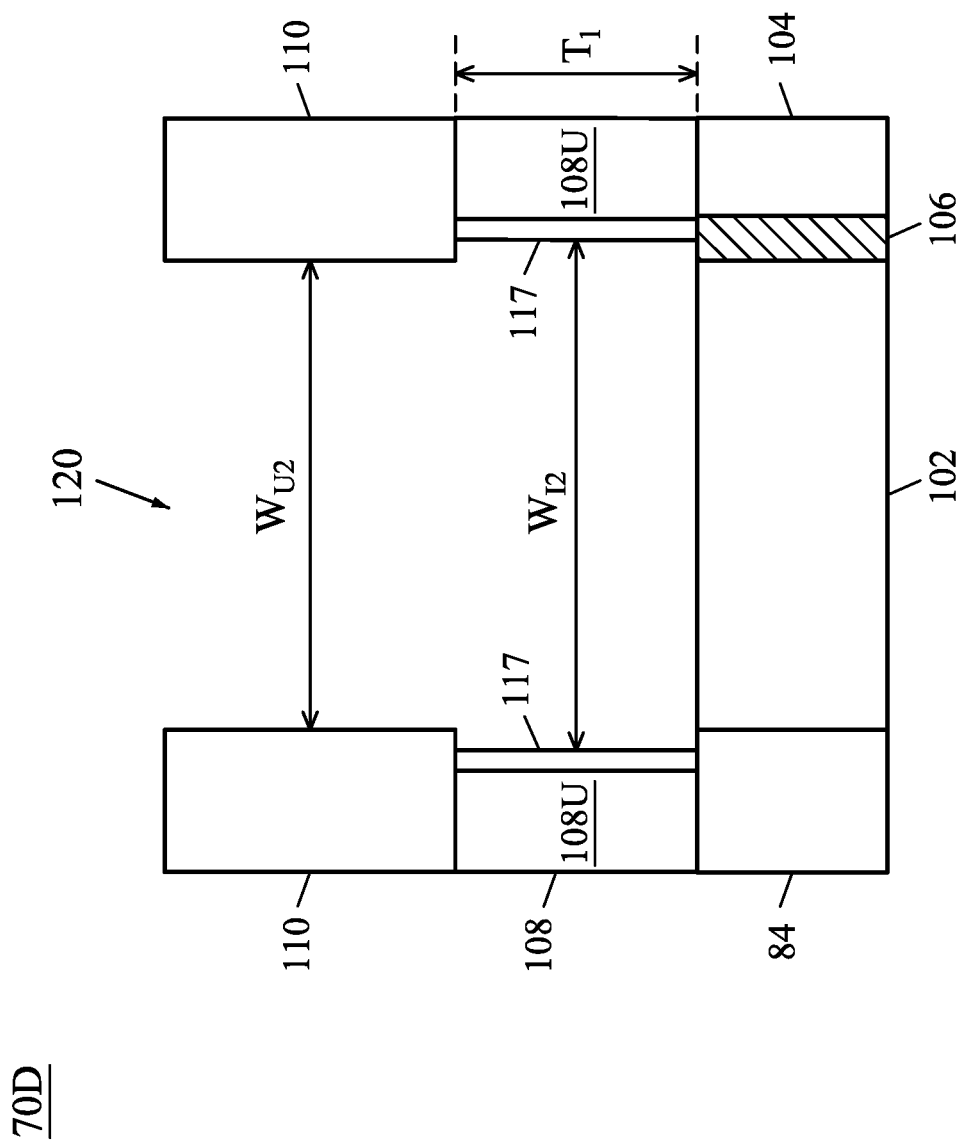

FIG. 15 illustrates additional details of the region 70D of FIG. 14, after the wet etch process 124 is performed. The wet etch process 124 is performed until the damaged etch stop layer regions 108D are removed and the gate masks 102 are exposed. The wet etch process 124 is selective to the material of the damaged etch stop layer regions 108D (e.g., aluminum chloride or aluminum bromide), such that the damaged etch stop layer regions 108D are etched at a higher rate than the lower source/drain contacts 104 and the undamaged etch stop layer regions 108U. The wet etch process 124 forms protective layers 117, which protect the undamaged etch stop layer regions 108U from etching.

The wet etch process 124 is performed by exposing the etch stop layer 108 to an etching solution that comprises an etching agent, a dielectric protective agent, and a cobalt protective agent. The etching solution can include the water at a concentration of about 20% to about 98% (such as about 95%), the etching agent at a concentration of about 0.1% to about 3% (such as about 2.5%), the dielectric protective agent at a concentration of about 0.01% to about 3% (such as about 2.5%), and the cobalt protective agent at a concentration of about 0.01% to about 3% (such as less than about 1%). The etching agent, dielectric protective agent, and cobalt protective agent are similar to the corresponding agents used in the wet etch process 116. The material of the etch stop layer 108 (e.g., aluminum oxide) has a high etch selectivity with the material of the gate masks 102 (e.g., silicon nitride), such that the etch stop layer 108 is etched at a higher rate than gate masks 102 relative the wet etch process 124. As such, substantially no reduction in height of the gate masks 102 occurs.

During the wet etch process 124, the upper source/drain contacts 118 are protected. In some embodiments, the upper source/drain contacts 118 are protected by including a tungsten protective agent in the etching solution for the wet etch process 124. The tungsten protective agent can be similar to the tungsten protective agent used during the post-etch cleaning process after the dry etch process 122. In some embodiments, the upper source/drain contacts 118 are protected by adjusting the environment of the wet etch process 124 to reduce the etch rate of tungsten. For example, the wet etch process 124 may be performed at a low temperature, such as a temperature of about 20° C. to about 40° C., and with an etching solution having a low pH, such as a pH of about 5 to about 7, thereby lowering the etch rate of tungsten and limiting or reducing any removal of tungsten. In some embodiments, both a tungsten protective agent and an adjusted environment are used during the wet etch process 124. By protecting the upper source/drain contacts 118, substantially no reduction in height of the upper source/drain contacts 118 occurs.

Figure 16:
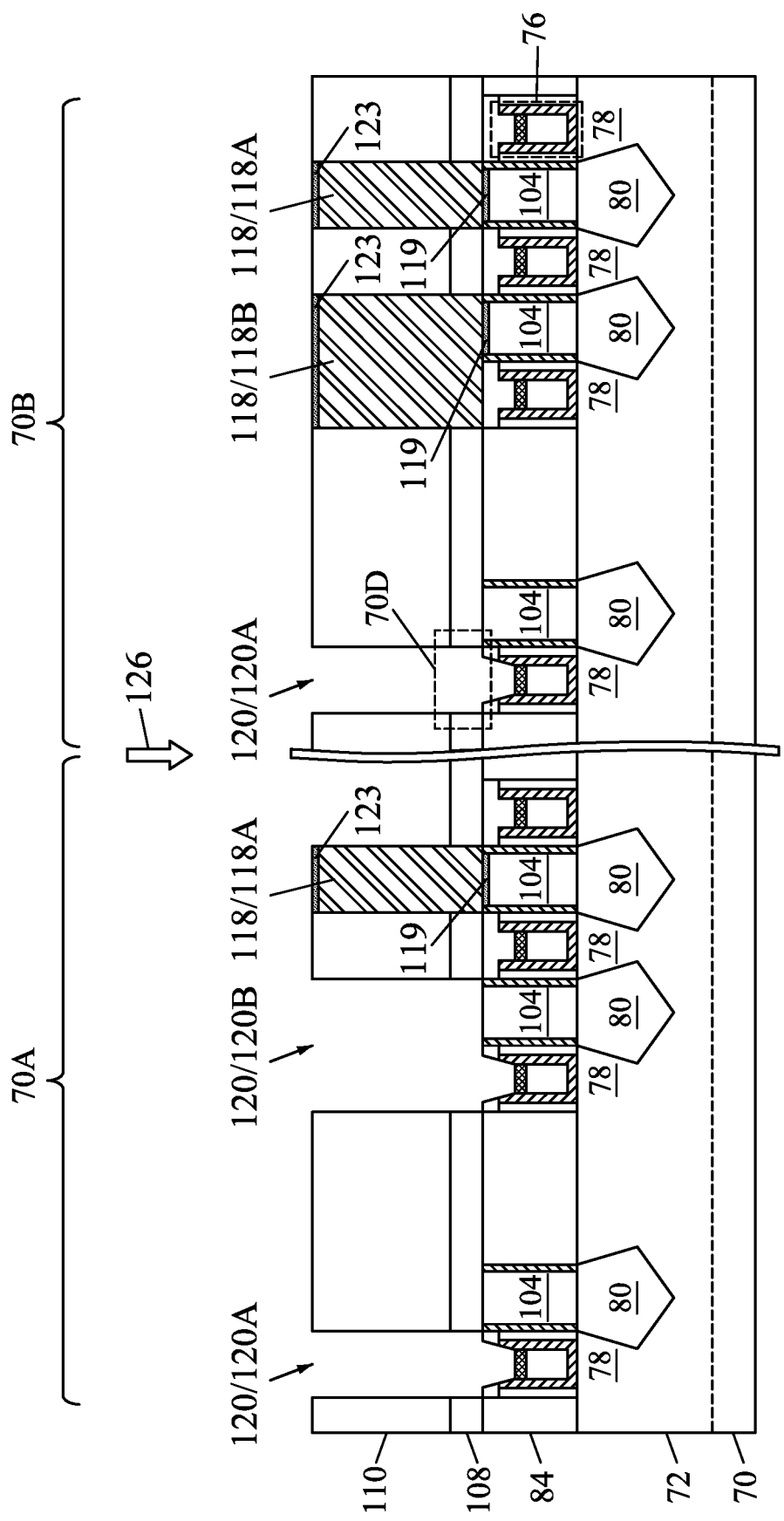

In FIG. 16, the gate contact openings 120 are extended through the gate masks 102. The extended gate contact openings 120 expose the gate stacks 76. The gate contact openings 120 may be extended using an acceptable etching technique. In some embodiments, a dry etch process 126 is performed to extend the gate contact openings 120 through the gate masks 102. For example, in some embodiments the dry etch process 126 comprises generating a plasma sheath over the second ILD 110 using a fluorocarbon (e.g., $C_xF_y$) gas. The dry etch process 126 can be performed in an environment comprising argon or nitrogen, and can be performed for a duration in the range of about 10 seconds and about 150 seconds. The dry etch process 126 is performed until portions of the gate masks 102 are removed and the gate stacks 76 are exposed. Some portions of the gate stacks 76 (e.g., portions of the capping layer 88B) may also be removed. The material of the gate masks 102 (e.g., silicon nitride) has a high etch selectivity with the material of the second ILD 110 (e.g., silicon oxide) and the material of the etch stop layer 108 (e.g., aluminum oxide) such that the gate masks 102 are etched at a higher rate than the etch stop layer 108 and the second ILD 110 relative the dry etch process 126. Thus, substantially no reduction in height of the second ILD 110 occurs, and substantially no lateral etching of the etch stop layer 108 occurs. Further, because the upper source/drain contacts 118 and lower source/drain contacts 104 were exposed to cobalt and tungsten protective agents during the wet etch process 124, substantially no reduction in height of the upper source/drain contacts 118 or lower source/drain contacts 104 occurs during the dry etch process 126.

Figure 17:
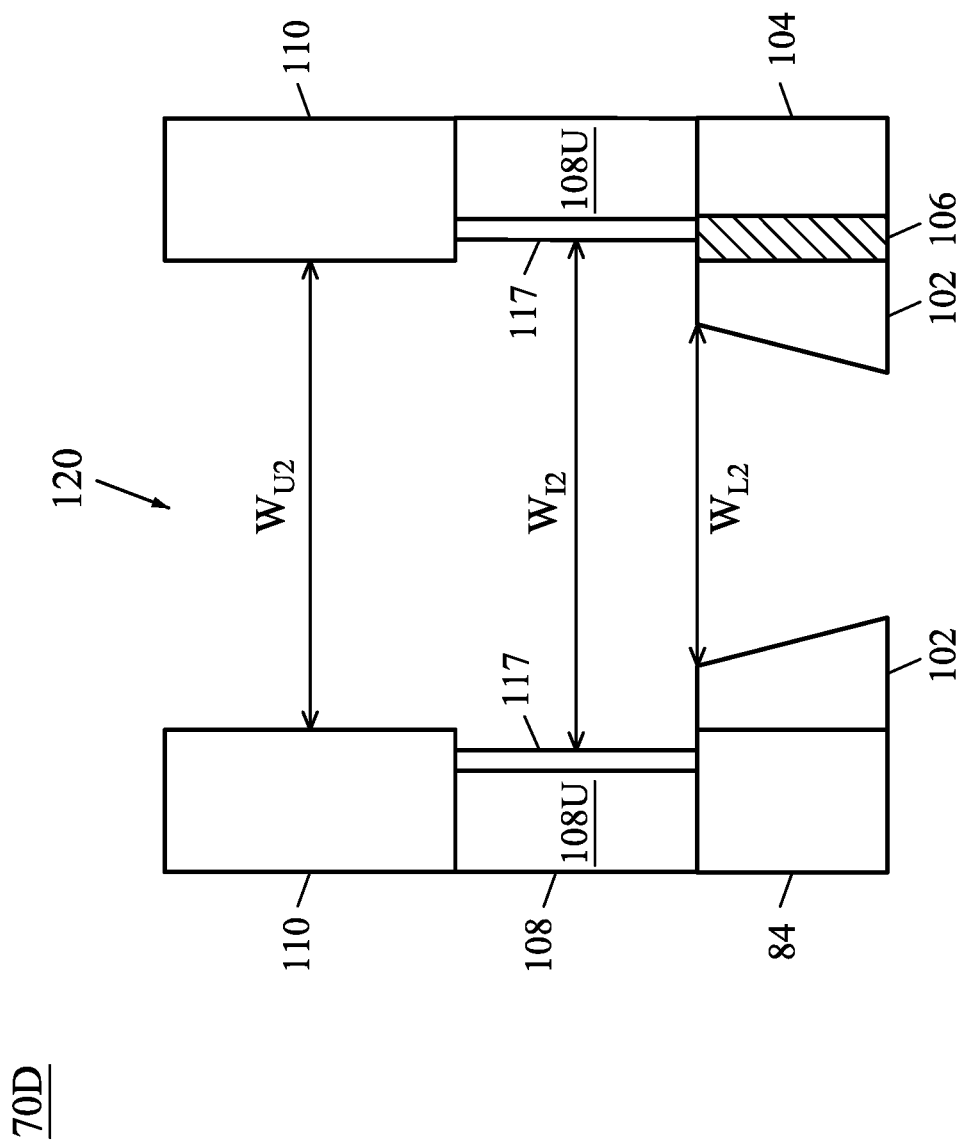

FIG. 17 illustrates additional details of the region 70D of FIG. 16, after the dry etch process 126 is performed. After formation, the gate contact openings 120 have upper widths $W_{U2}$ through the second ILD 110, intermediate widths $W_{I2}$ through the etch stop layer 108, and lower widths $W_{L2}$ through the gate masks 102. The upper widths $W_{U2}$ can be in the range of about 3 nm to about 100 nm. As noted above, the wet etch process 124 is selective to the material of the damaged etch stop layer regions 108D (e.g., aluminum chloride or aluminum bromide). Thus, although some lateral etching of the undamaged etch stop layer regions 108U occurs during the wet etch process 124, the amount of lateral etching is small. For example, the wet etch process 124 laterally etches the undamaged etch stop layer regions 108U by an amount that can be in the range of about 1 nm to about 9 nm (such as less than about 1.5 nm). Thus, the intermediate widths $W_{I2}$ can be in the range of about 4 nm to about 109 nm. Further, the lower widths $W_{L2}$ can be smaller than the intermediate widths $W_{I2}$. For example, the lower widths $W_{L2}$ can be in the range of about 2 nm to about 90 nm.

In some embodiments, gate contact openings 120 of differing widths can be formed. For example, a first subset of the gate contact openings 120A can have small upper widths $W_{U2}$, such as upper widths $W_{U2}$ of about 3 nm, and a second subset of the gate contact openings 120B can have large upper widths $W_{U2}$, such as upper widths $W_{U2}$ of about 10 nm. The first subset of the gate contact openings 120A can be for gate contacts that are only for gate stacks 76, and the second subset of the gate contact openings 120B can be for shared contacts, e.g., contacts that are shared between gate stacks 76 and source/drain regions 80. Thus, the second subset of the gate contact openings 120B may also expose one or more of the lower source/drain contacts 104 and/or contact liners 106.

Figure 18:
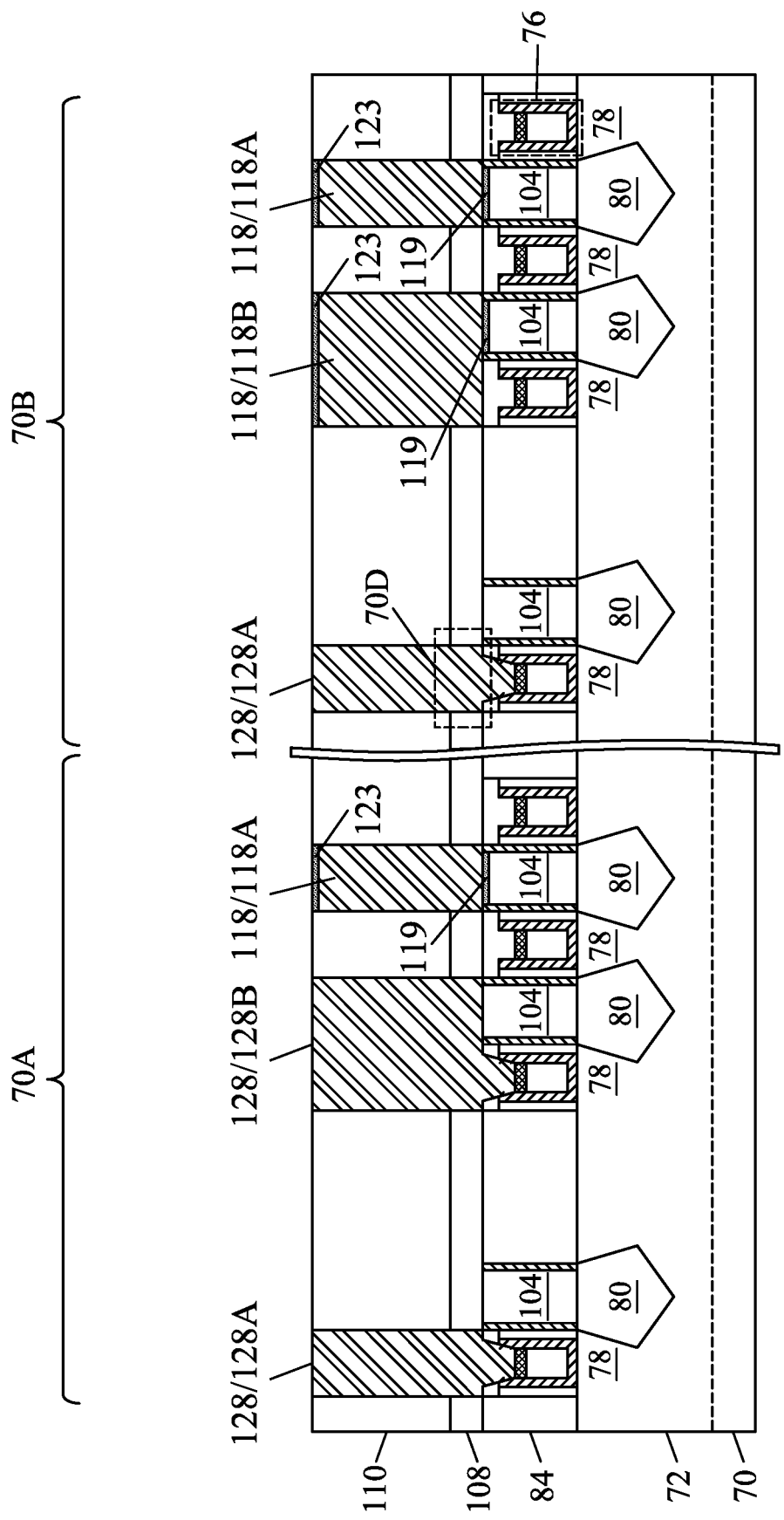

In FIG. 18, gate contacts 128 are formed through the second ILD 110, etch stop layer 108, and gate masks 102 to be physically and electrically coupled to the gate stacks 76 and optionally to some of the lower source/drain contacts 104. A liner, such as a diffusion barrier layer, an adhesion layer, or the like, and a conductive material are formed in the gate contact openings 120. The liner may include titanium, titanium nitride, tantalum, tantalum nitride, or the like. The conductive material may be copper, a copper alloy, silver, gold, tungsten, cobalt, aluminum, nickel, or the like. In some embodiments, the conductive material is tungsten. In some embodiments, the gate contacts 128 and upper source/drain contacts 118 are formed of the same conductive material (e.g., tungsten). A planarization process, such as a CMP, may be performed to remove excess material from the top surface of the second ILD 110. The remaining liner and conductive material form the gate contacts 128. The gate contacts 128 include gate contacts 128A in the gate contact openings 120A, and gate contacts 128B in the gate contact openings 120B. The gate contacts 128B may each be a shared contact that couples a source/drain region 80 to a gate stack 76.

Although the shared contacts are shown as being formed during the process for forming the gate contacts 128, it should be appreciated that shared contacts may also be formed during the process for forming the upper source/drain contacts 118. For example, a dry etch process similar to the dry etch process 126 may be performed to extend the source/drain contact openings 112B (see FIG. 8) through the gate masks 102. Some of the upper source/drain contacts 118 may thus also be shared contacts. In other words, the shared contacts may be formed concurrently with the source/drain contacts, the gate contacts, or both.

Figure 19:
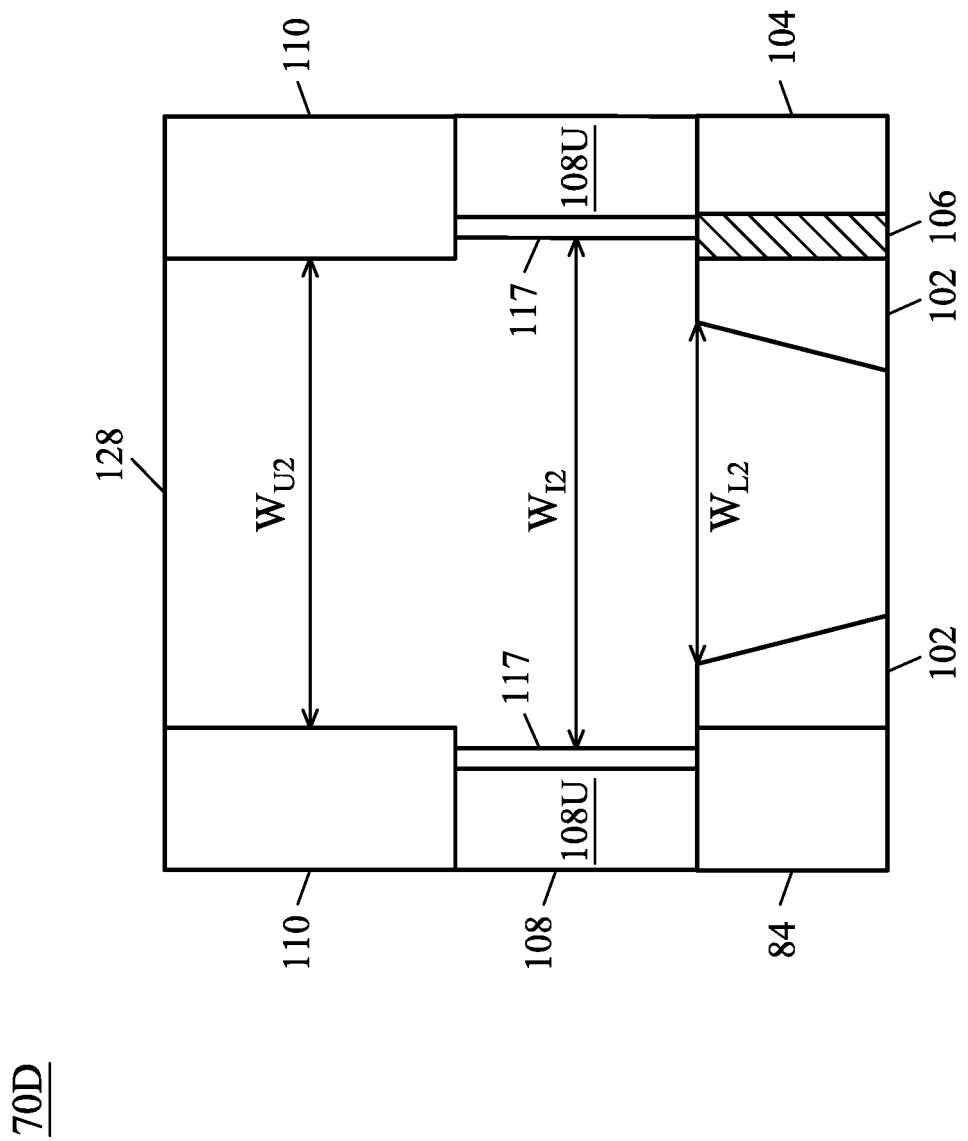

FIG. 19 illustrates additional details of the region 70D of FIG. 18, after the gate contacts 128 are formed. The portions of the gate contacts 128 that extend through the second ILD 110 have the upper widths $W_{U2}$, the portions of the gate contacts 128 that extend through the etch stop layer 108 have the intermediate widths $W_{I2}$, and the portions of the gate contacts 128 that extend through the gate masks 102 have the lower widths $W_{L2}$.

FIGS. 20 through 28 are cross-sectional views of intermediate stages in the manufacturing of contacts for FinFETs, in accordance with some other embodiments. FIGS. 20 through 28 are shown along the reference cross-section A-A illustrated in FIG. 1, except for multiple FinFETs. In this embodiment, a buffer layer 130 is formed over the etch stop layer 108, which helps protect the etch stop layer 108 from over-etching during the dry etch process 114 for the second ILD 110.

Figure 20:
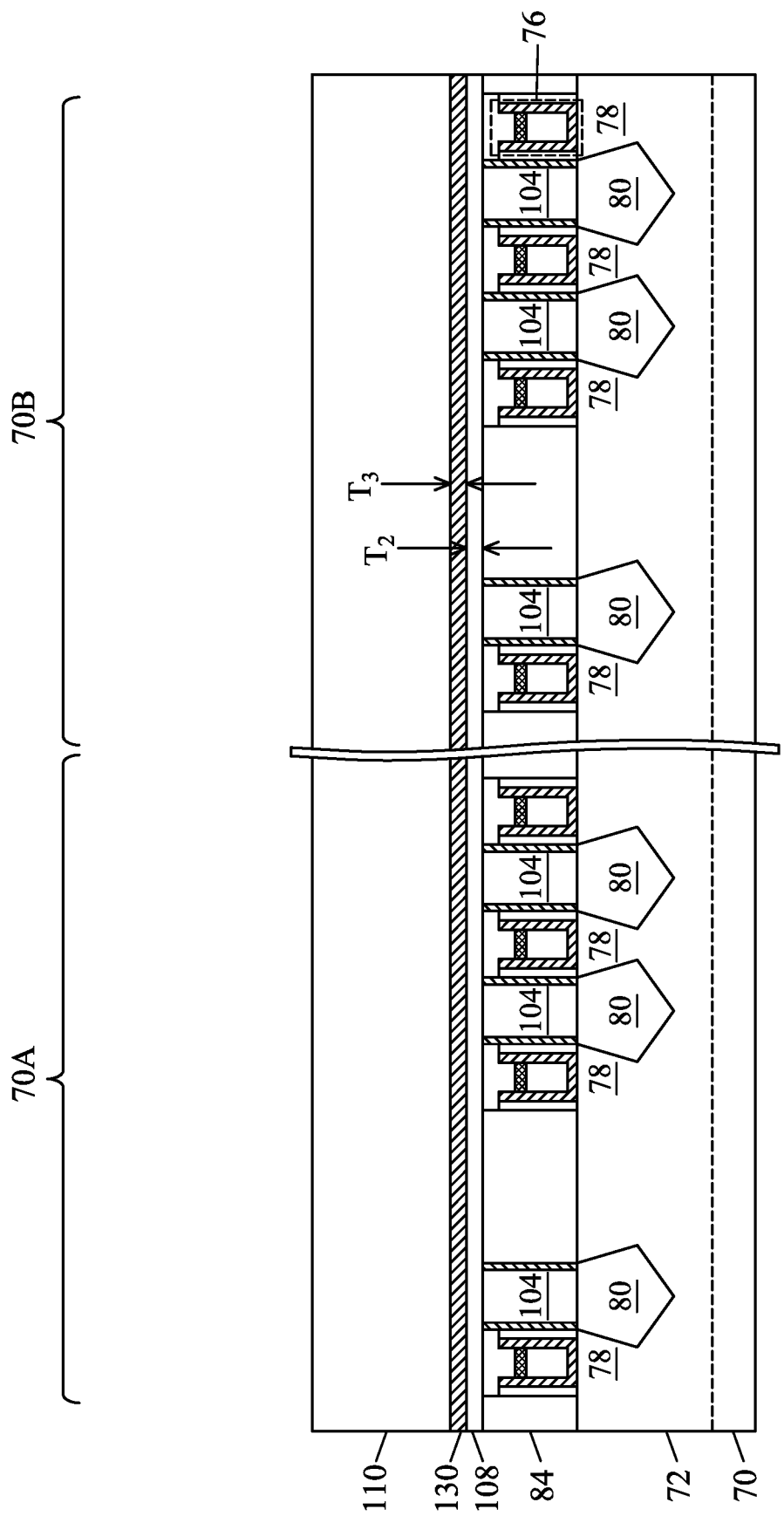
FIGS. 20 through 28 are cross-sectional views of intermediate stages in the manufacturing of contacts for FinFETs, in accordance with some other embodiments.

In FIG. 20, a structure similar to the intermediate structure of FIG. 5 is shown. A buffer layer 130 is formed between the etch stop layer 108 and the second ILD 110. The buffer layer 130 is formed of a material that has a high etch selectivity with the etch stop layer 108, such that the buffer layer 130 is etched at a higher rate than the underlying etch stop layer 108 relative a same etching process. The buffer layer 108 can help control etching of the etch stop layer 108. For example, the buffer layer 130 is formed of an insulating material, such as a layer of silicon nitride, silicon oxynitride, silicon oxycarbide, tungsten carbide, or the like. The buffer layer 130 may be formed by a deposition process such as ALD, CVD, PECVD, or the like. The buffer layer 130 may be the same material as the gate masks 102. In the embodiment shown, the buffer layer 130 is a single layer of silicon nitride. The etch stop layer 108 may be formed to a small thickness $T_2$. For example, the etch stop layer 108 can have a thickness $T_2$ in the range of about 20 Å to about 50 Å. The buffer layer 130 may also be formed to a small thickness $T_3$. For example, the buffer layer 130 can have a thickness $T_3$ in the range of about 20 Å to about 50 Å.

Figure 21:
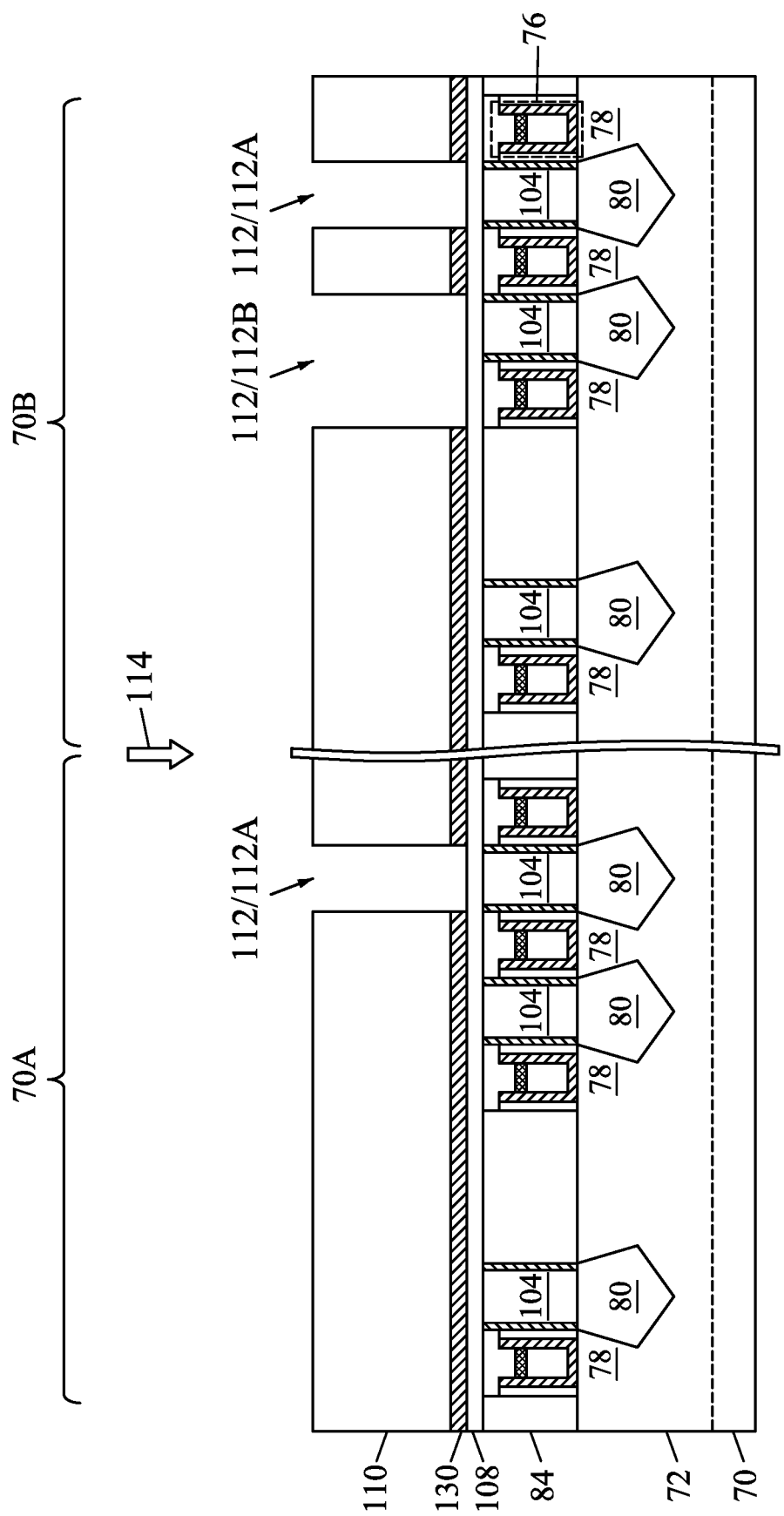

In FIG. 21, a dry etch process is performed to form the source/drain contact openings 112 through the second ILD 110 and buffer layer 130. The dry etch process may be similar to the dry etch process 114 discussed above with reference to FIG. 6. The dry etch process 114 is selective to the materials of the second ILD 110 and buffer layer 130, and removes the material of both layers, albeit at differing rates.

Figure 22:
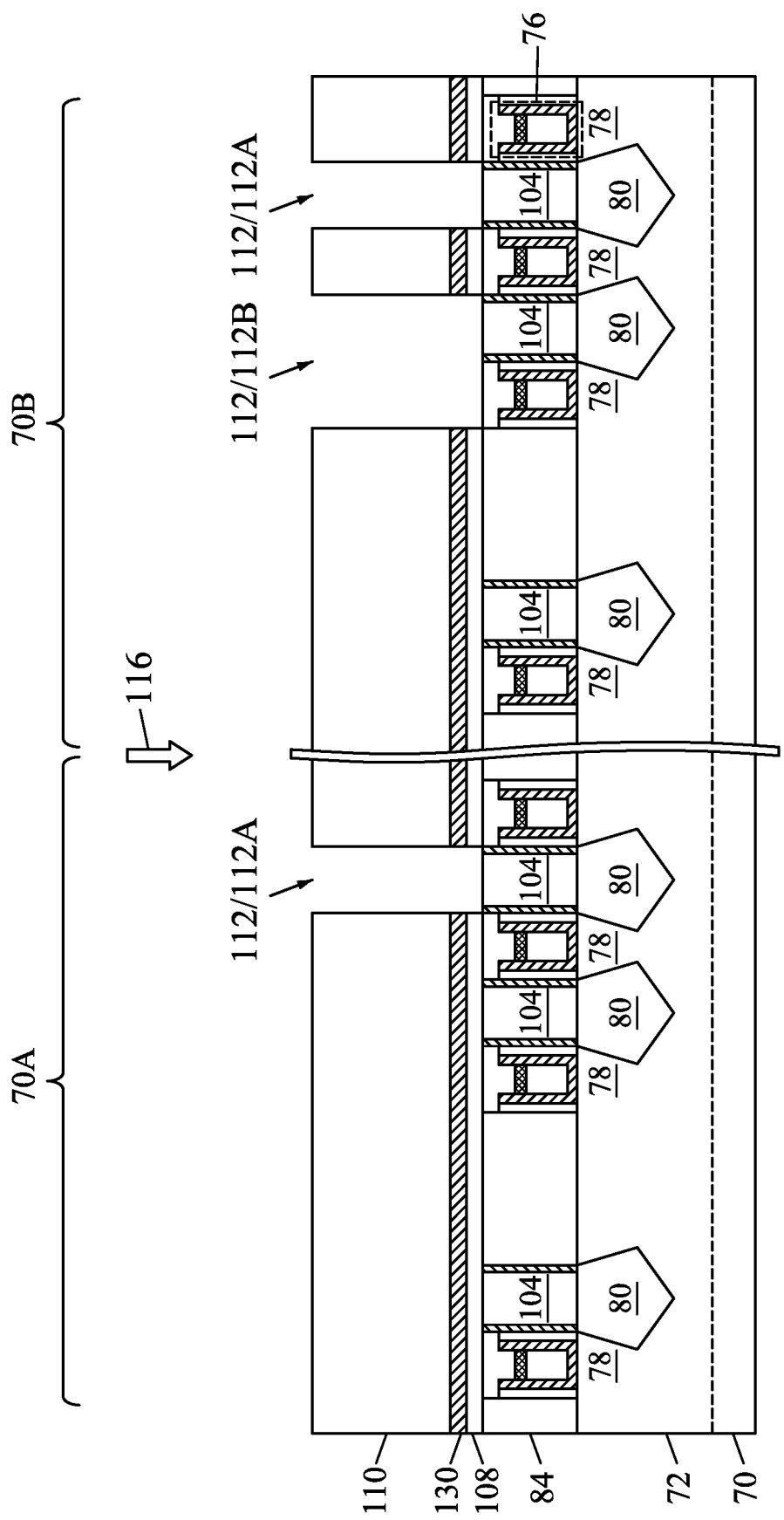

In FIG. 22, a wet etch process is performed to extend the source/drain contact openings 112 through the etch stop layer 108. The wet etch process may be similar to the wet etch process 116 discussed above with reference to FIG. 8. The wet etch process 116 is selective to the material of the damaged etch stop layer regions 108D (see FIG. 7), such that the damaged etch stop layer regions 108D are etched at a higher rate than the lower source/drain contacts 104, undamaged etch stop layer regions 108U, gate masks 102, and buffer layer 130.

Figure 23:
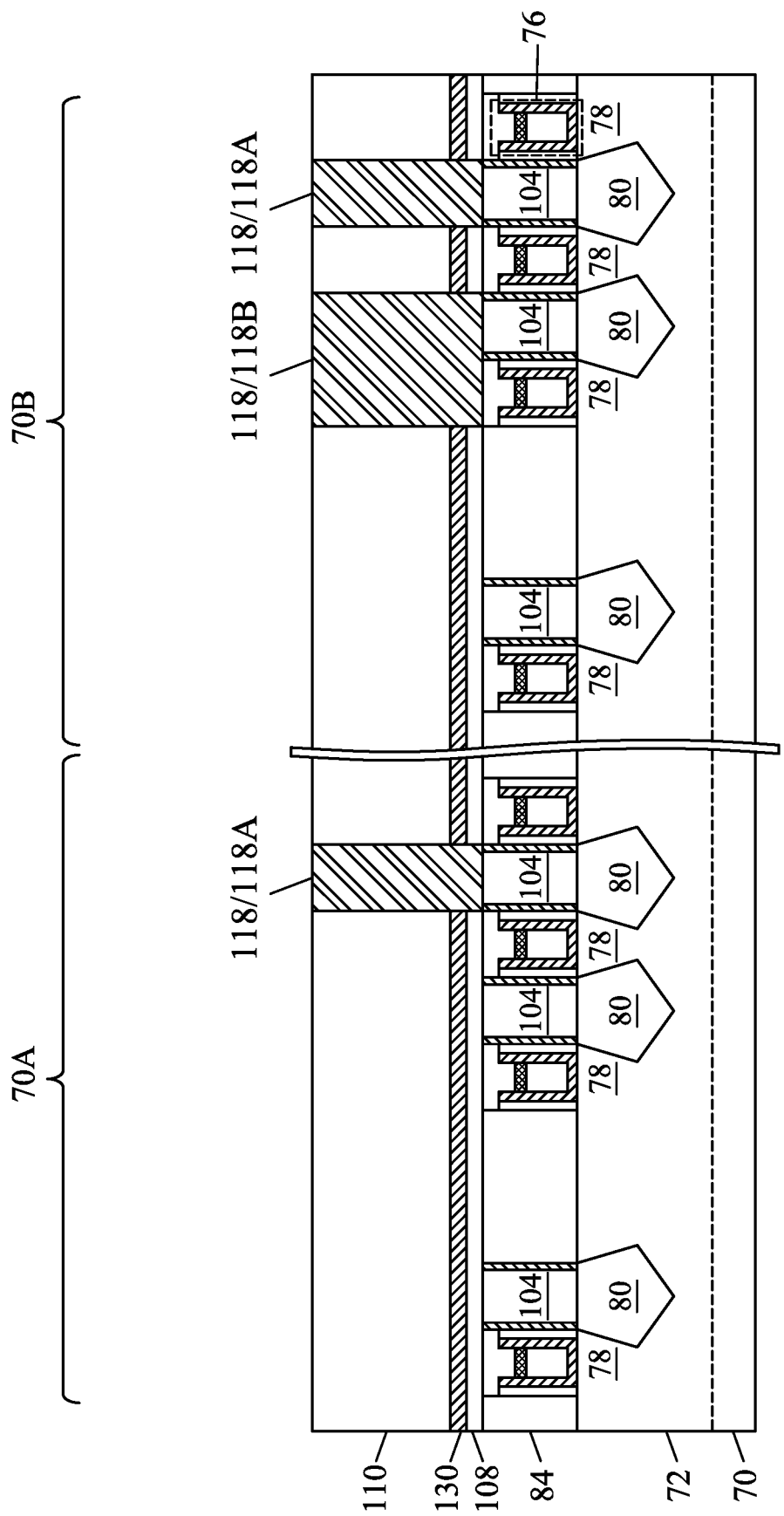

In FIG. 23, the upper source/drain contacts 118 are formed through the second ILD 110, etch stop layer 108, and buffer layer 130 to be physically and electrically coupled to some of the lower source/drain contacts 104. The upper source/drain contacts 118 may be formed in the source/drain contact openings 112 using a similar method as that discussed above with respect to FIG. 10. Although not separately illustrated, a protective layer 119 (see FIG. 9A) can be formed between the upper source/drain contacts 118 and the lower source/drain contacts 104.

Figure 24:
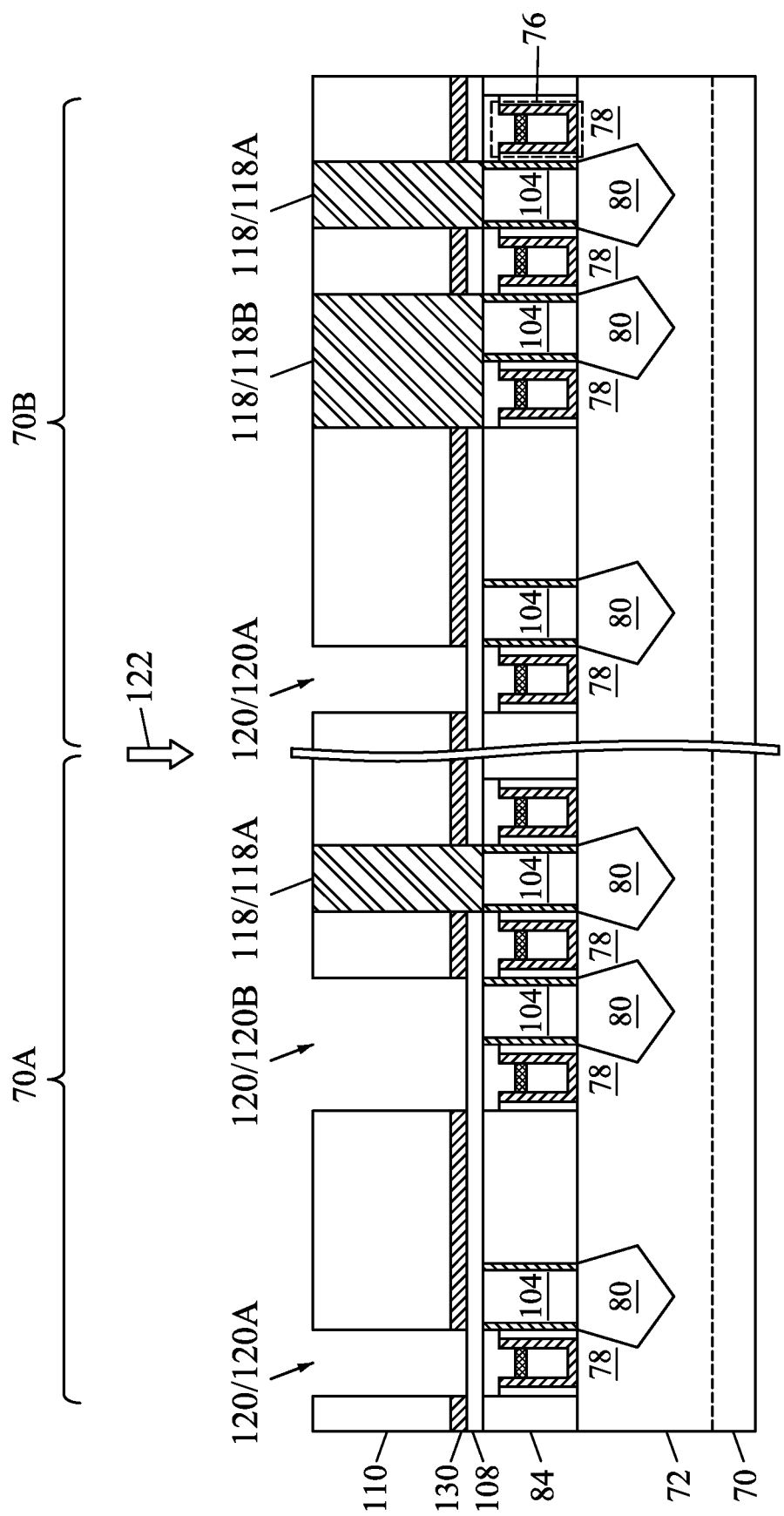

In FIG. 24, a dry etch process is performed to form the gate contact openings 120 through the second ILD 110 and buffer layer 130. The dry etch process may be similar to the dry etch process 122 discussed above with reference to FIG. 12. The dry etch process 122 is selective to the materials of the second ILD 110 and buffer layer 130, and removes the material of both layers, albeit at differing rates. Although not separately illustrated, a protective layer 123 (see FIG. 12) can be formed on the upper source/drain contacts 118 during the dry etch process.

Figure 25:
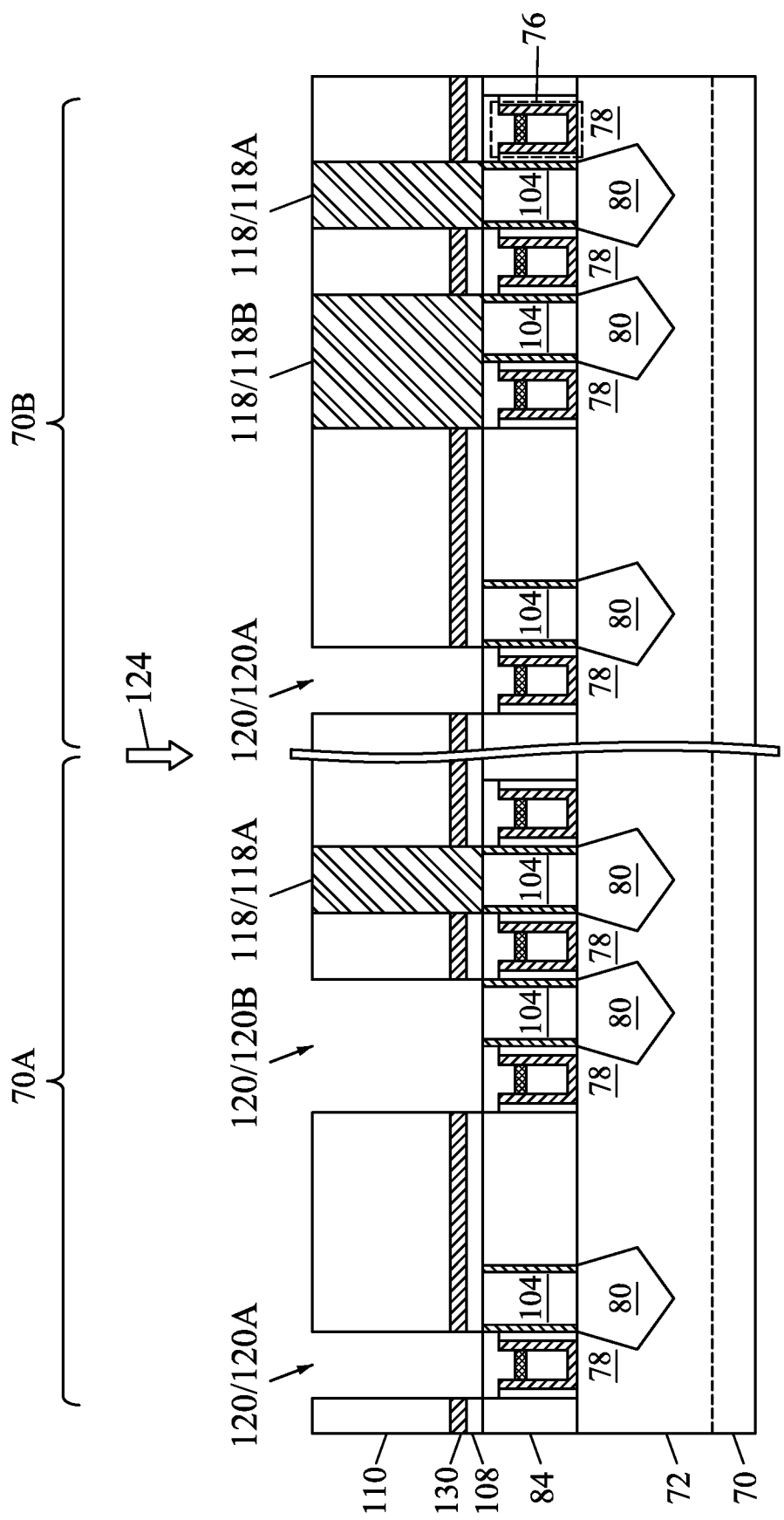

In FIG. 25, a wet etch process is performed to extend the gate contact openings 120 through the etch stop layer 108. The wet etch process may be similar to the wet etch process 124 discussed above with reference to FIG. 14. The wet etch process 124 is selective to the material of the damaged etch stop layer regions 108D (see FIG. 7), such that the damaged etch stop layer regions 108D are etched at a higher rate than the lower source/drain contacts 104, undamaged etch stop layer regions 108U, and buffer layer 130.

Figure 26:
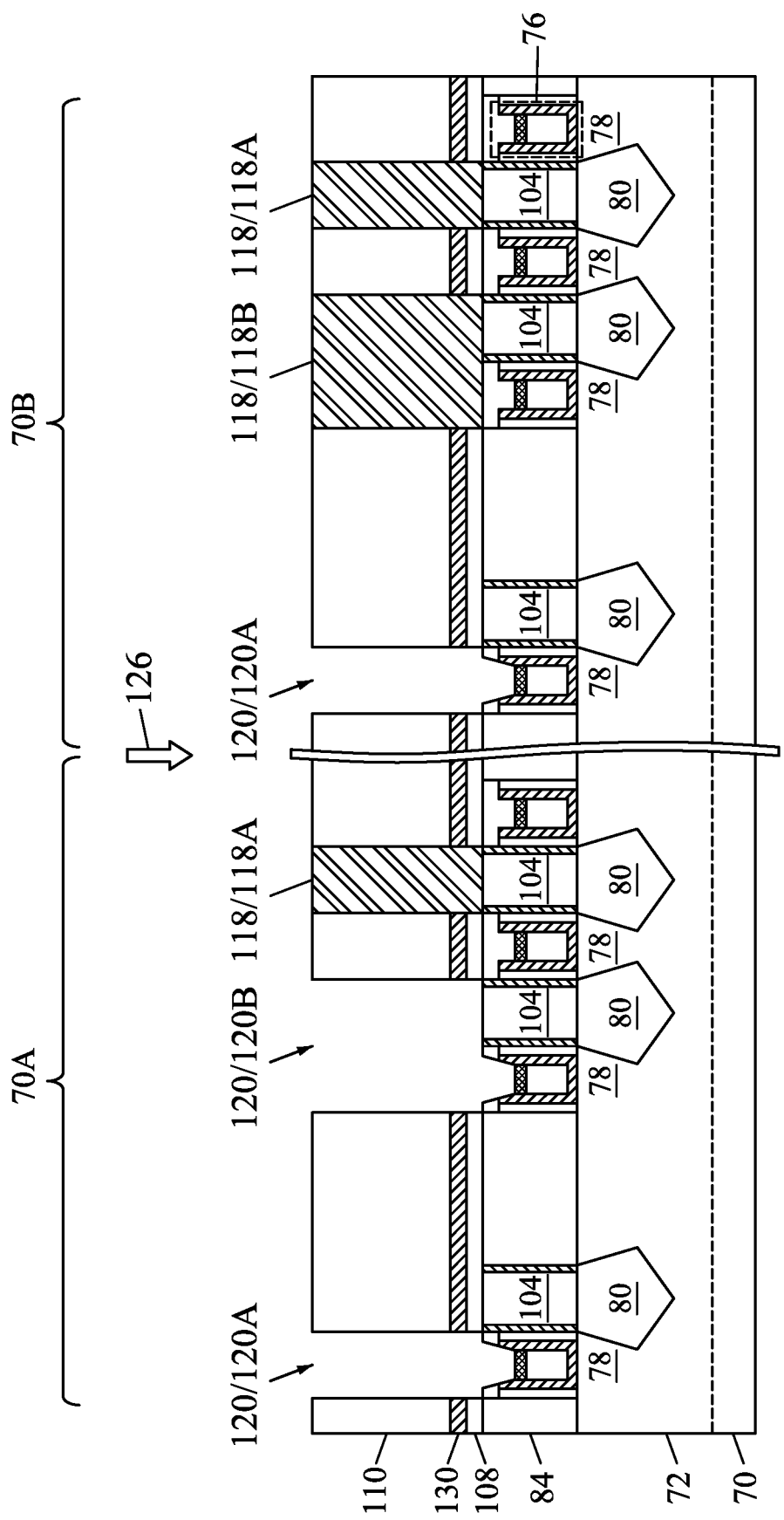

In FIG. 26, a dry etch process is performed to extend the gate contact openings 120 through the gate masks 102. The dry etch process may be similar to the dry etch process 126 discussed above with reference to FIG. 16. The extended gate contact openings 120 expose the gate stacks 76. The dry etch process may also laterally etch the etch stop layer 108, but the etching rate of the etch stop layer 108 is negligible compared to the etching rate of the gate masks 102.

Figure 27:
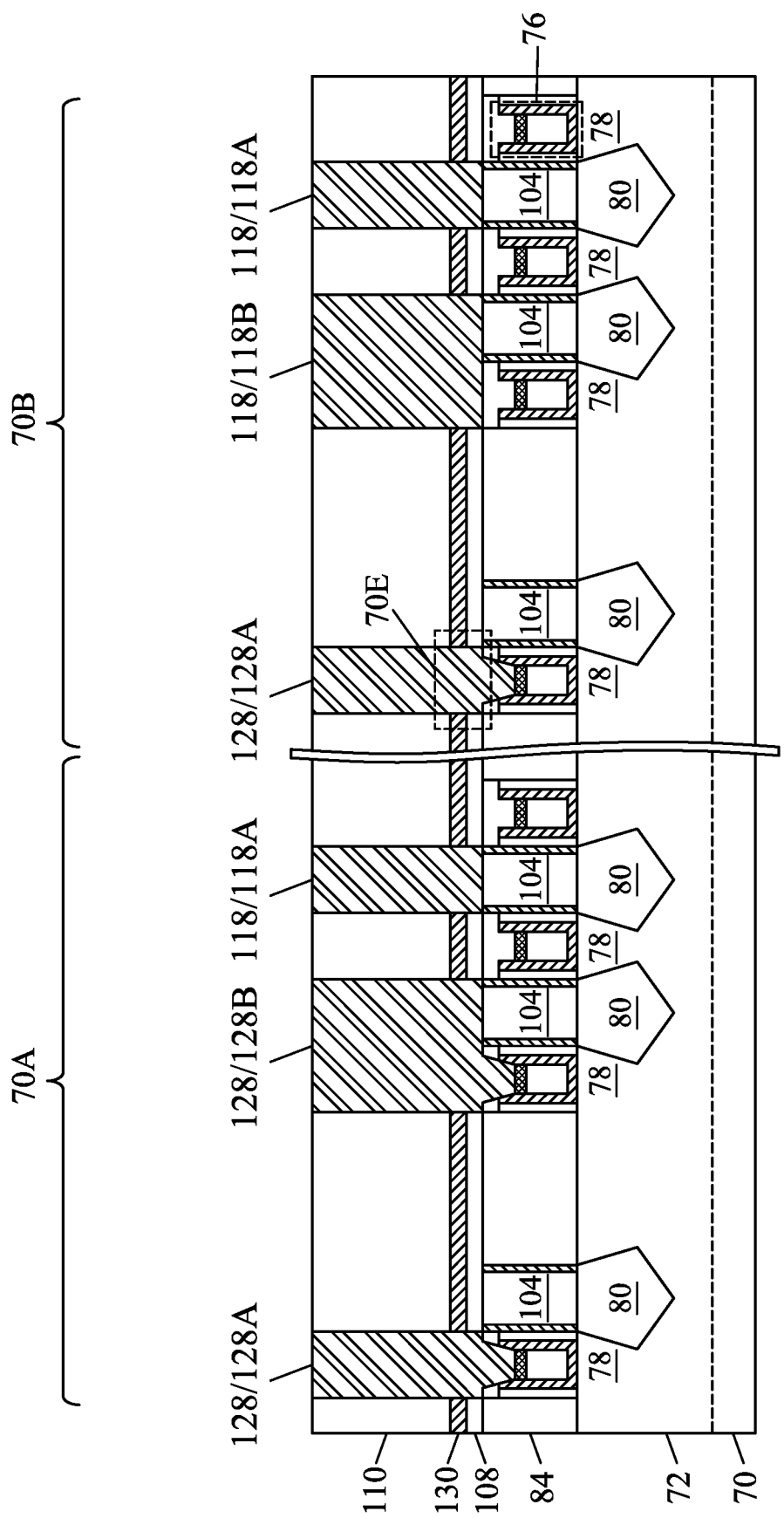

In FIG. 27, the gate contacts 128 are formed through the second ILD 110, etch stop layer 108, gate masks 102, and buffer layer 130 to be physically and electrically coupled to the gate stacks 76 and optionally to some of the lower source/drain contacts 104. The gate contacts 128 may be formed in the gate contact openings 120 using a similar method as that discussed above with respect to FIG. 18.

Figure 28:
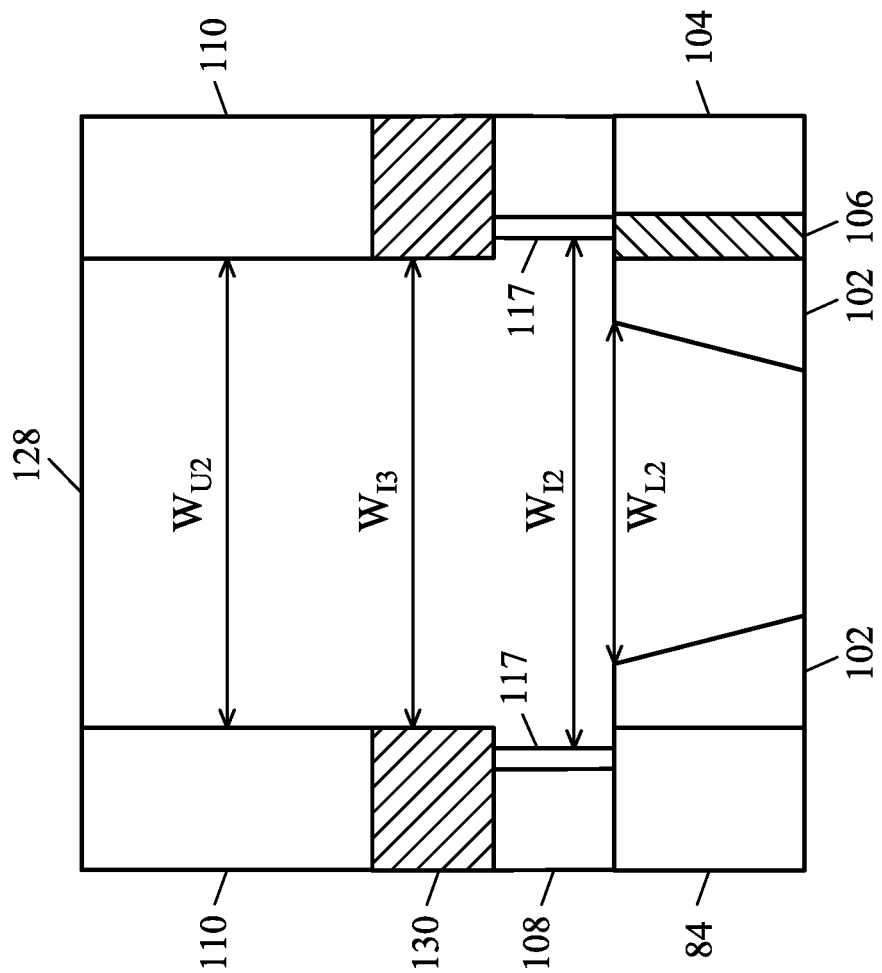

FIG. 28 illustrates additional details of a region 70E of FIG. 27, after the gate contacts 128 are formed. The portions of the gate contacts 128 that extend through the second ILD 110 have the upper widths $W_{U2}$, the portions of the gate contacts 128 that extend through the etch stop layer 108 have the intermediate widths $W_{I2}$, and the portions of the gate contacts 128 that extend through the gate masks 102 have the lower widths $W_{L2}$. Further, the portions of the gate contacts 128 that extend through the buffer layer 130 have intermediate widths $W_{I3}$, which are less than the intermediate widths $W_{I2}$. For example, the intermediate widths $W_{I3}$ can be in the range of 3 nm to 100 nm.

FIGS. 29 through 38 are cross-sectional views of intermediate stages in the manufacturing of contacts for FinFETs, in accordance with some other embodiments. FIGS. 29 through 38 are shown along the reference cross-section A-A illustrated in FIG. 1, except for multiple FinFETs. In this embodiment, a buffer layer 132 is formed beneath the etch stop layer 108, which helps protect the lower source/drain contacts 104 during the wet etch process 116.

Figure 29:
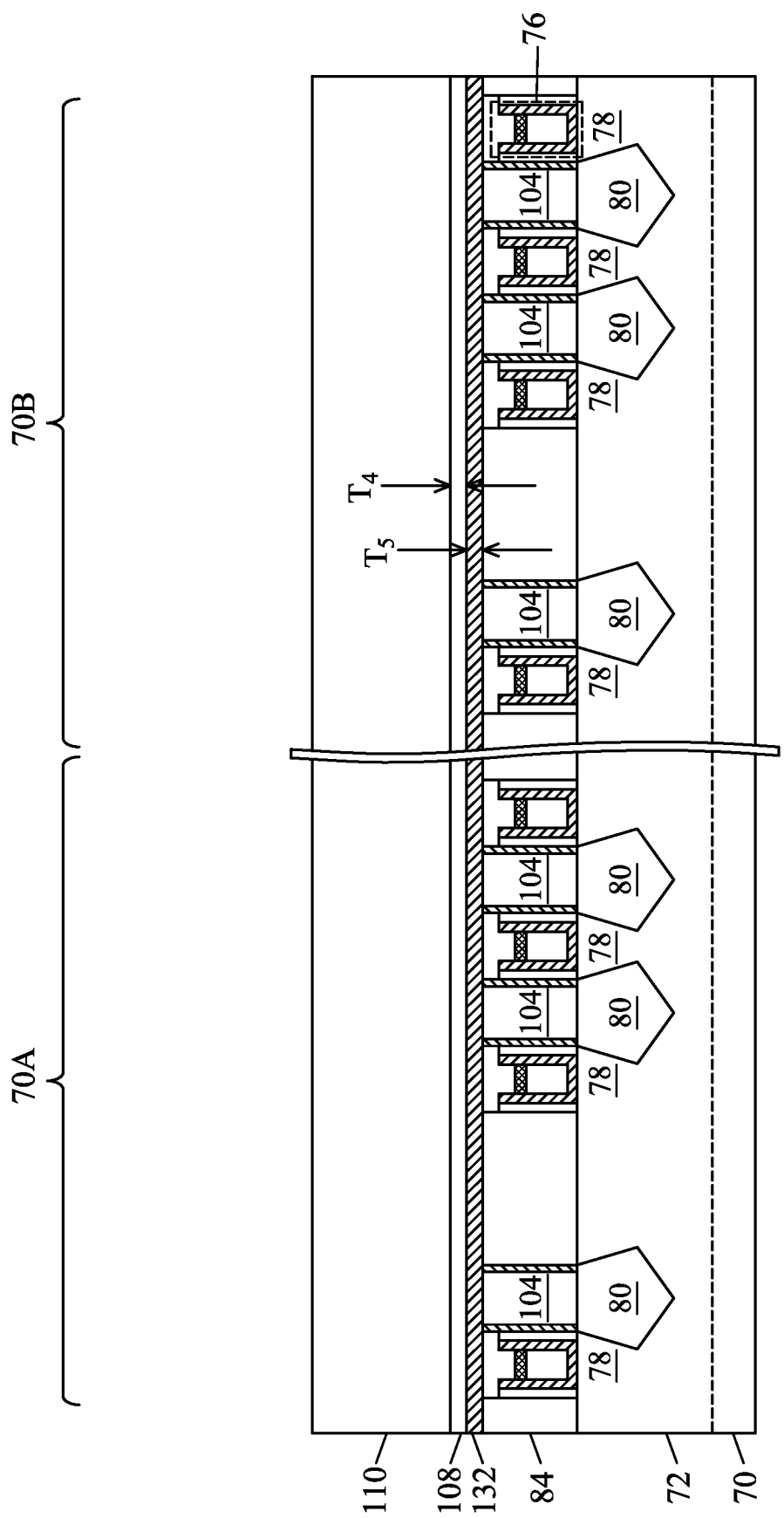
FIGS. 29 through 38 are cross-sectional views of intermediate stages in the manufacturing of contacts for FinFETs, in accordance with some other embodiments.

In FIG. 29, a structure similar to the intermediate structure of FIG. 5 is shown. A buffer layer 132 is formed over the first ILD 84, and the etch stop layer 108 is formed over the buffer layer 132. The buffer layer 132 is formed of a material that has a high etch selectivity with the etch stop layer 108, relative a same etching process. For example, the buffer layer 132 is formed of an insulating material, such as a layer of silicon nitride, silicon oxynitride, silicon oxycarbide, tungsten carbide, or the like. The buffer layer 132 may be formed by a deposition process such as ALD, CVD, PECVD, or the like. The buffer layer 132 may be the same material as the gate masks 102. In the embodiment shown, the buffer layer 132 is a single layer of silicon nitride. The etch stop layer 108 may be formed to a small thickness $T_4$. For example, the etch stop layer 108 can have a thickness $T_4$ in the range of about 20 Å to about 50 Å. The buffer layer 132 may also be formed to a small $T_5$. For example, the buffer layer 132 can have a $T_5$ in the range of about 20 Å to about 50 Å.

Figure 30:
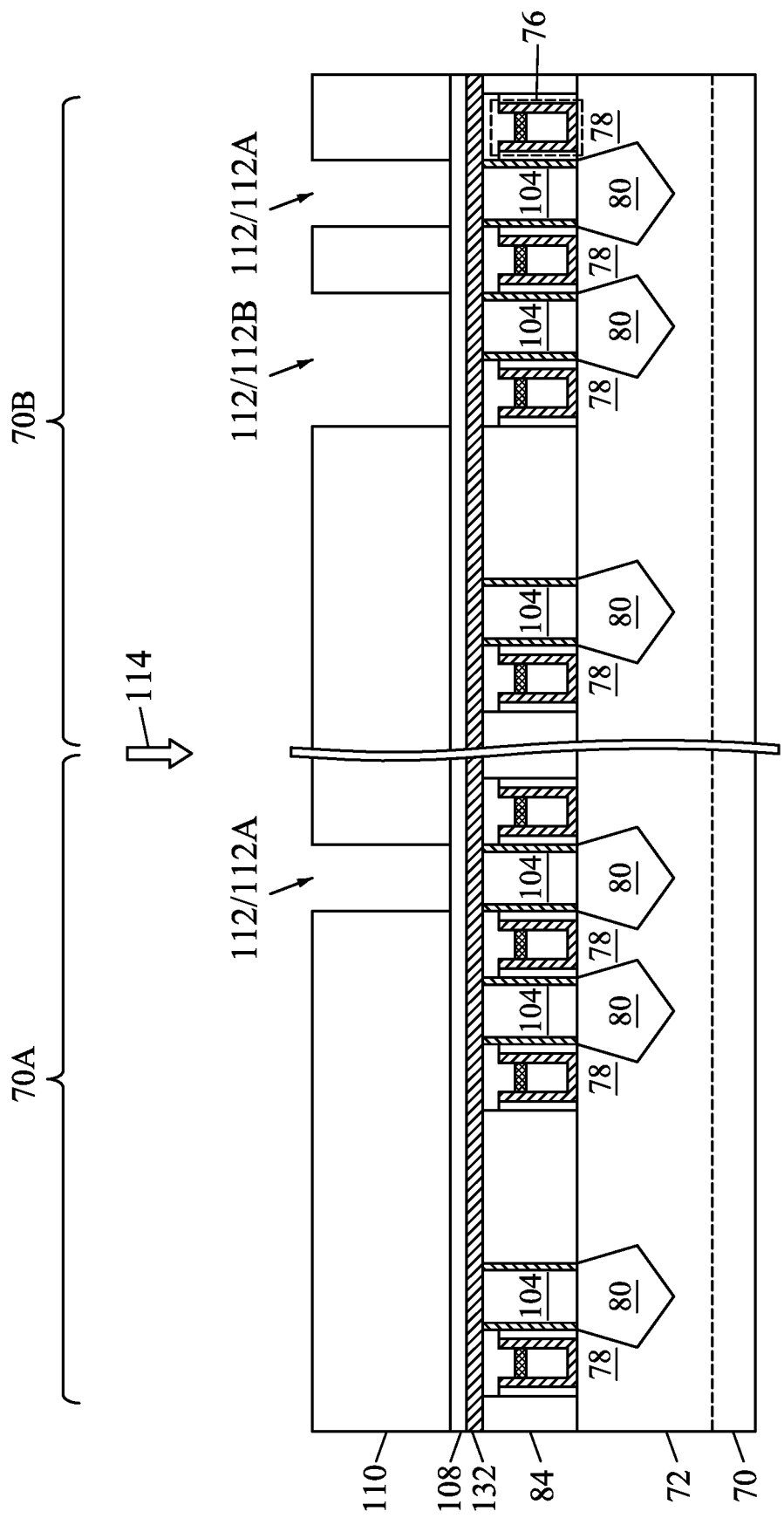

In FIG. 30, a dry etch process is performed to form the source/drain contact openings 112 through the second ILD 110. The dry etch process may be similar to the dry etch process 114 discussed above with reference to FIG. 6.

Figure 31:
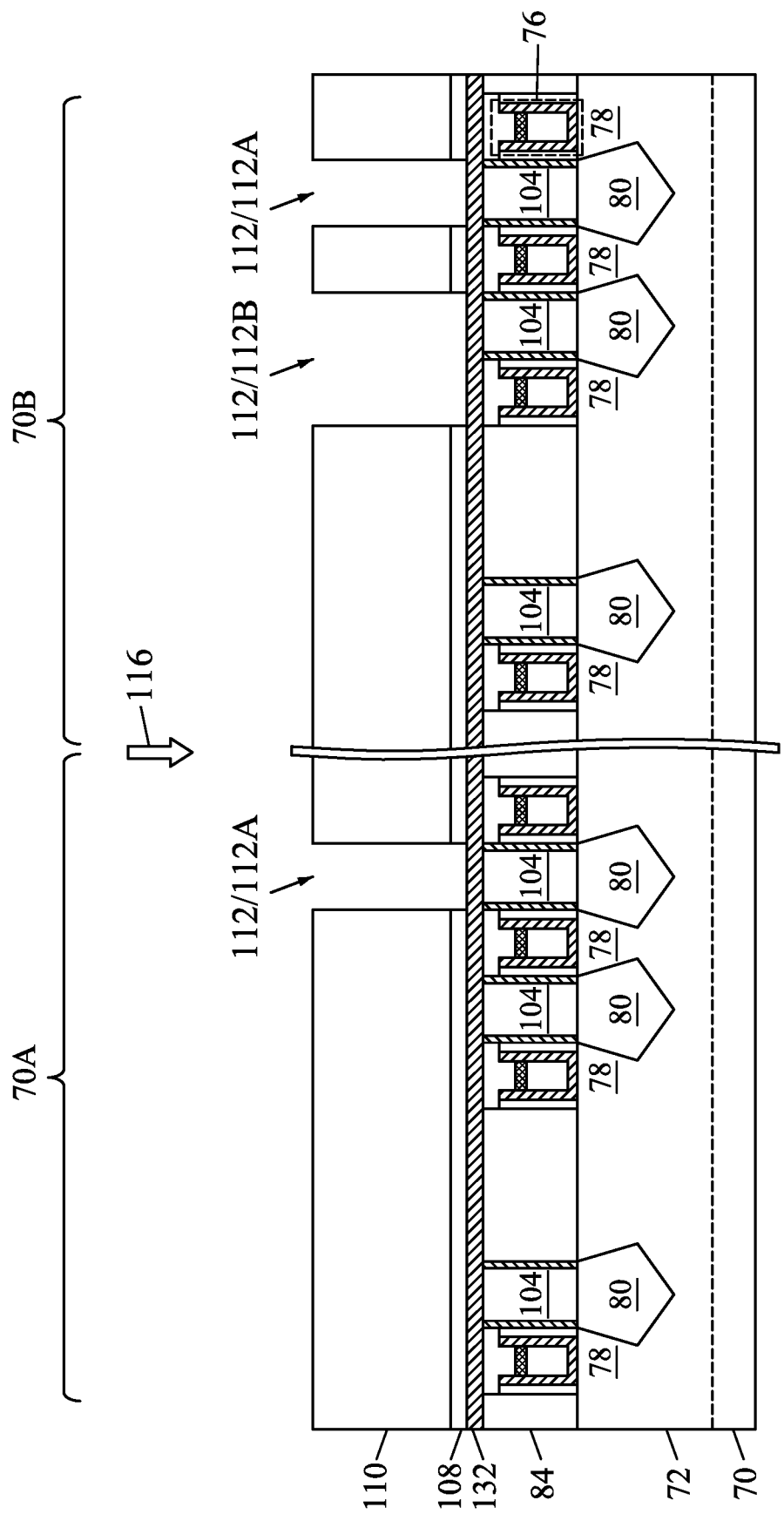

In FIG. 31, a wet etch process is performed to extend the source/drain contact openings 112 through the etch stop layer 108. The wet etch process may be similar to the wet etch process 116 discussed above with reference to FIG. 8. The wet etch process 116 is selective to the material of the damaged etch stop layer regions 108D (see FIG. 7), such that the damaged etch stop layer regions 108D are etched at a higher rate than the lower source/drain contacts 104 and undamaged etch stop layer regions 108U.

Figure 32:
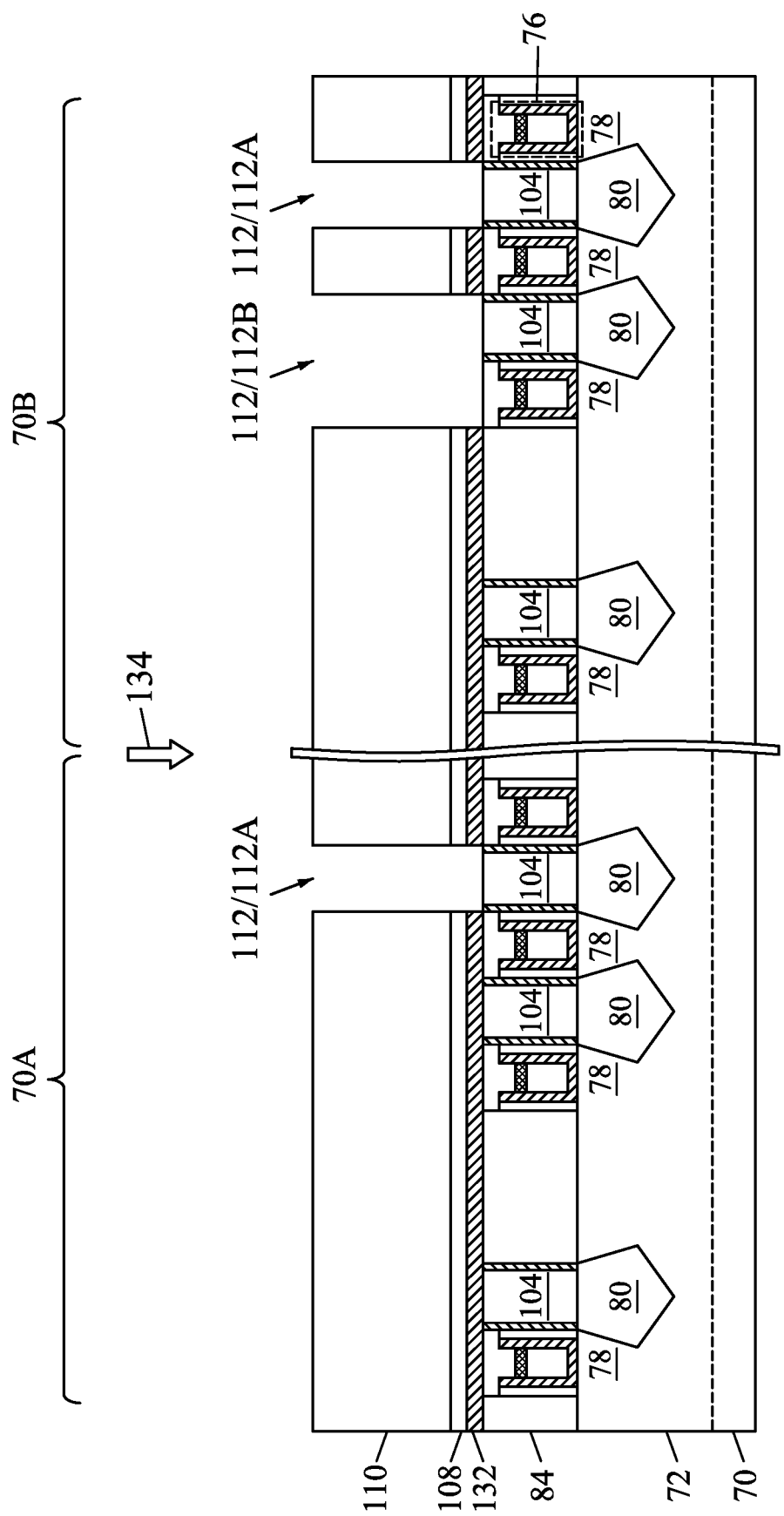

In FIG. 32, the source/drain contact openings 112 are extended through the buffer layer 132. The extended source/drain contact openings 112 expose the lower source/drain contacts 104. The source/drain contact openings 112 may be extended using an acceptable etching technique. In some embodiments, a dry etch process 134 is performed to extend the source/drain contact openings 112 through the buffer layer 132. For example, in some embodiments the dry etch process 134 comprises generating a plasma sheath over the second ILD 110 using fluorocarbon (e.g., $C_xF_y$) gas. The dry etch process 134 can be performed in an environment comprising argon or nitrogen, and can be performed for a duration in the range of about 10 seconds and about 150 seconds. The dry etch process 134 is performed until portions of the buffer layer 132 are removed and the lower source/drain contacts 104 are exposed. Some portions of the gate masks 102 may also be removed. The dry etch process 134 is similar to the dry etch process 126, but can be performed for a different duration. In embodiments in which the material of the gate masks 102 and buffer layer 132 are the same material or materials having similar etch rates, the dry etch process 134 can remove some of the gate masks 102. As such, the dry etch process 134 may be a timed etch such that the buffer layer 132 is removed, and the dry etch process 134 is stopped while removing little or no material of the gate masks 102. For example, the dry etch process 134 can be performed for a duration of about 10 seconds to about 150 seconds. Thus, substantially no reduction in height of the gate masks 102 occurs.

Figure 33:
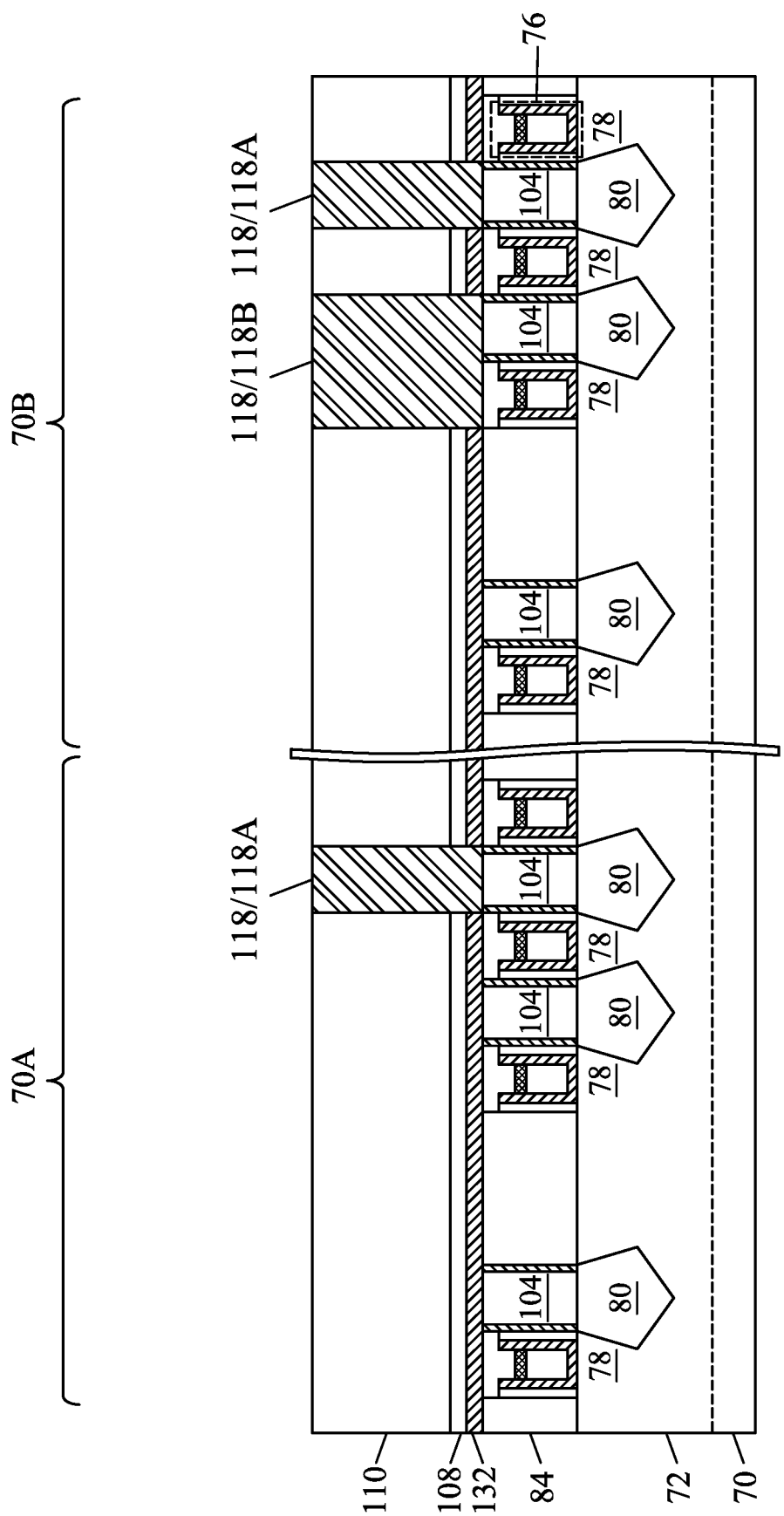

In FIG. 33, the upper source/drain contacts 118 are formed through the second ILD 110, etch stop layer 108, and buffer layer 132 to be physically and electrically coupled to some of the lower source/drain contacts 104. The upper source/drain contacts 118 may be formed in the source/drain contact openings 112 using a similar method as that discussed above with respect to FIG. 10. Although not separately illustrated, a protective layer 119 (see FIG. 9A) can be formed between the upper source/drain contacts 118 and the lower source/drain contacts 104.

Figure 34:
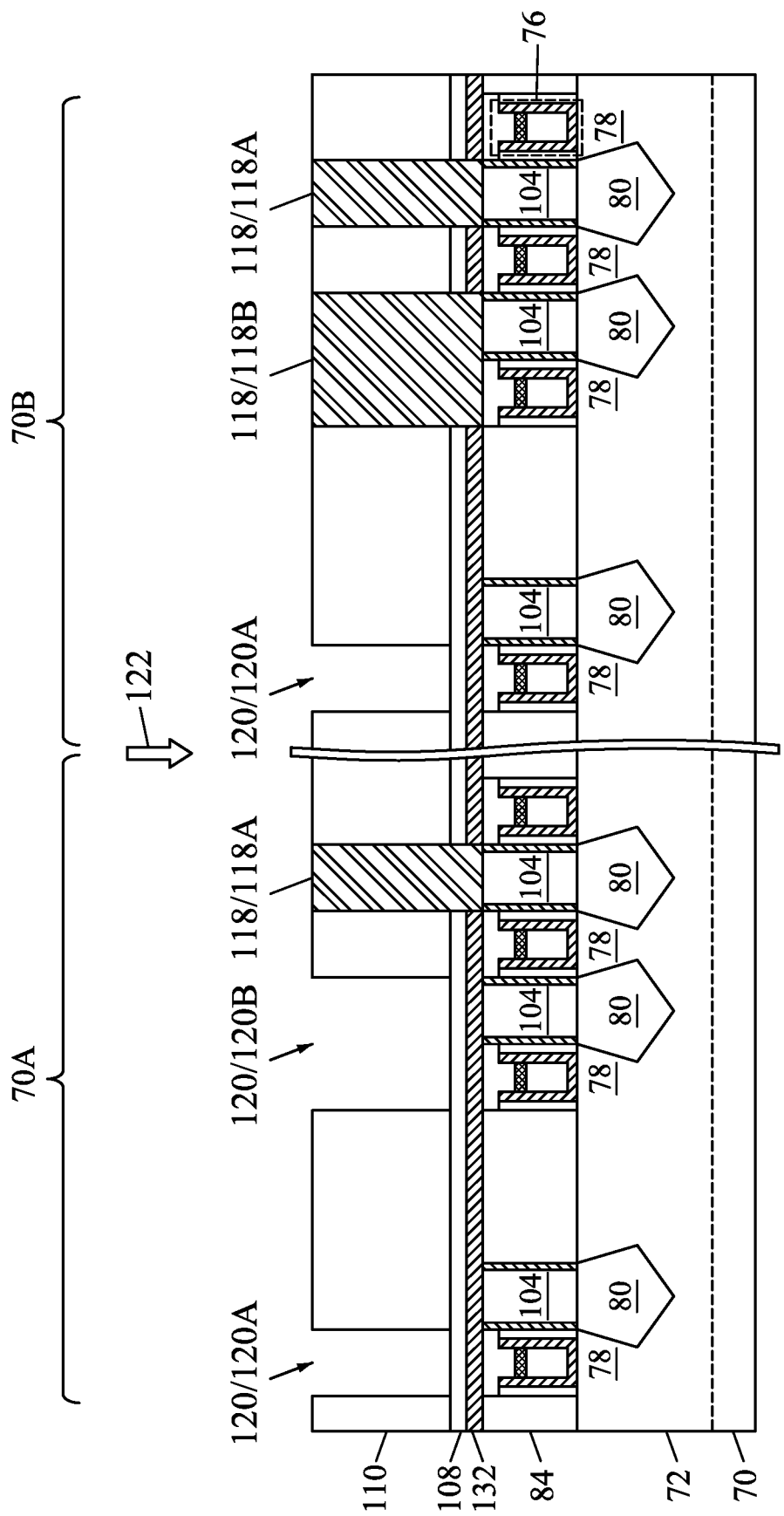

In FIG. 34, a dry etch process is performed to form the gate contact openings 120 through the second ILD 110. The dry etch process may be similar to the dry etch process 122 discussed above with reference to FIG. 12. Although not separately illustrated, a protective layer 123 (see FIG. 12) can be formed on the upper source/drain contacts 118 during the dry etch process.

Figure 35:
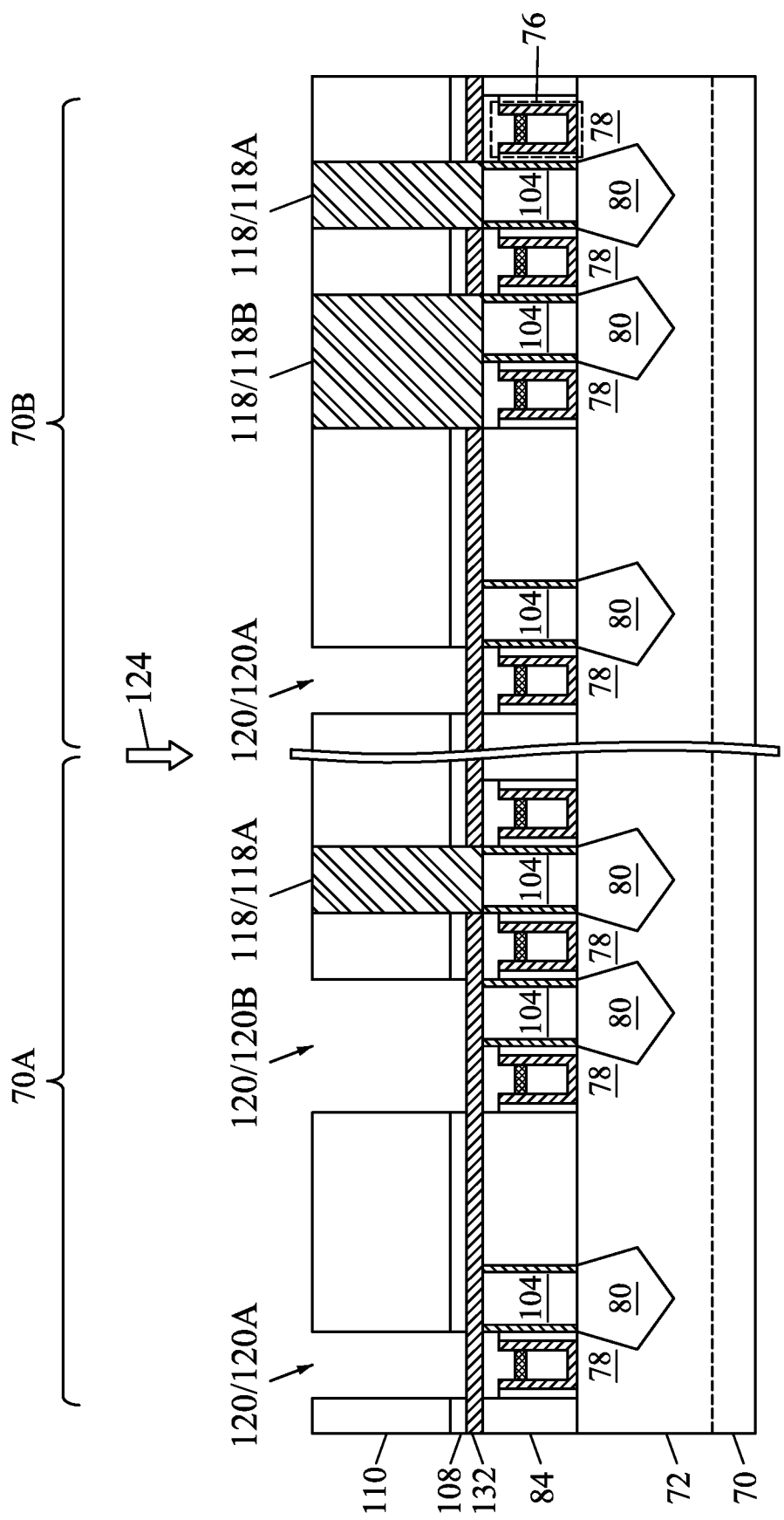

In FIG. 35, a wet etch process is performed to extend the gate contact openings 120 through the etch stop layer 108. The wet etch process may be similar to the wet etch process 124 discussed above with reference to FIG. 14. The wet etch process 124 is selective to the material of the damaged etch stop layer regions 108D (see FIG. 7), such that the damaged etch stop layer regions 108D are etched at a higher rate than the lower source/drain contacts 104, undamaged etch stop layer regions 108U, and buffer layer 132.

Figure 36:
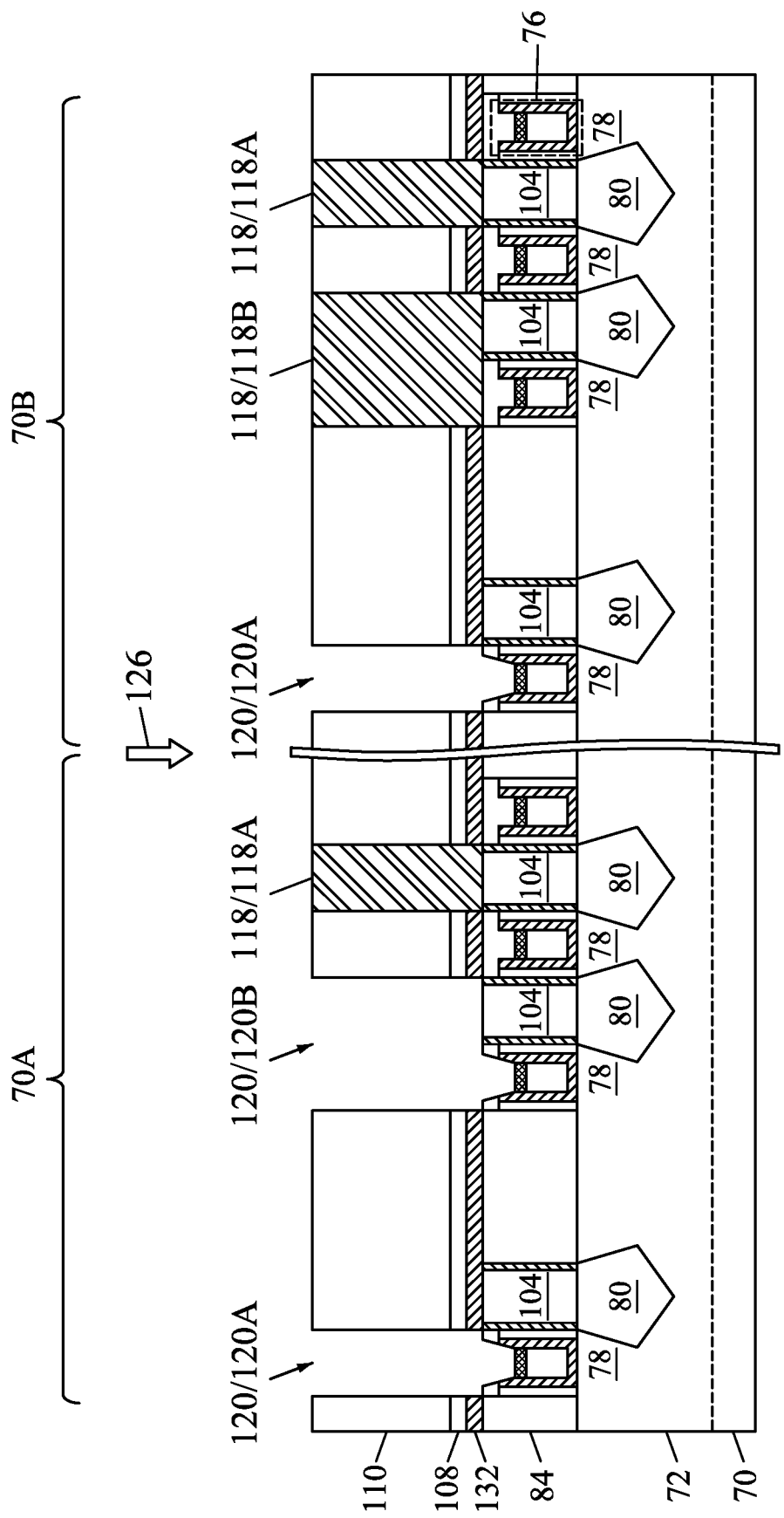

In FIG. 36, a dry etch process is performed to extend the gate contact openings 120 through the buffer layer 132 and gate masks 102. The dry etch process may be similar to the dry etch process 126 discussed above with reference to FIG. 16. The extended gate contact openings 120 expose the gate stacks 76. Because the buffer layer 132 and gate masks 102 can be formed of similar materials, the dry etch process 126 can remove the material of both layers at similar rates.

Figure 37:
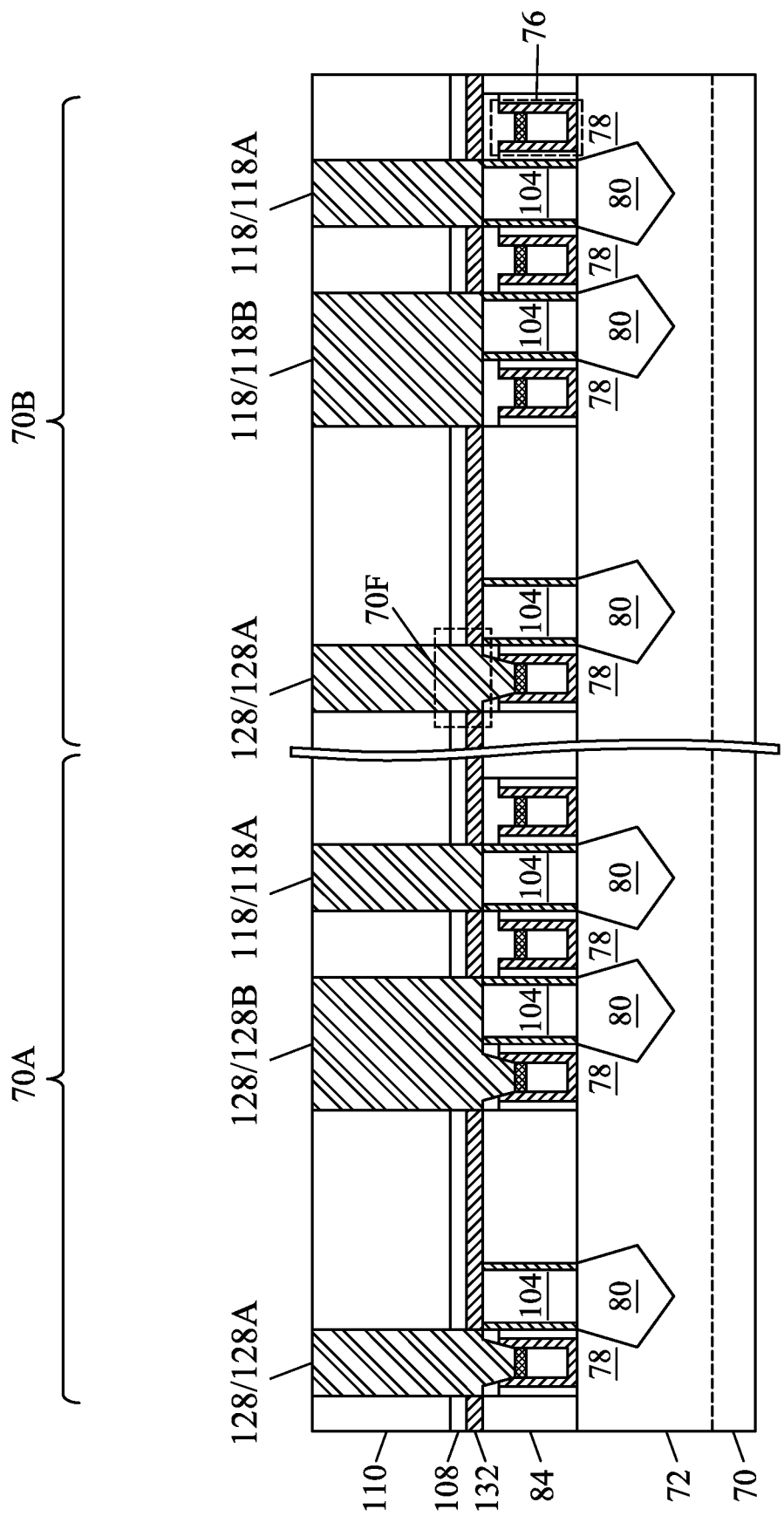

In FIG. 37, the gate contacts 128 are formed through the second ILD 110, etch stop layer 108, gate masks 102, and buffer layer 132 to be physically and electrically coupled to the gate stacks 76 and optionally to some of the lower source/drain contacts 104. The gate contacts 128 may be formed in the gate contact openings 120 using a similar method as that discussed above with respect to FIG. 18.

Figure 38:
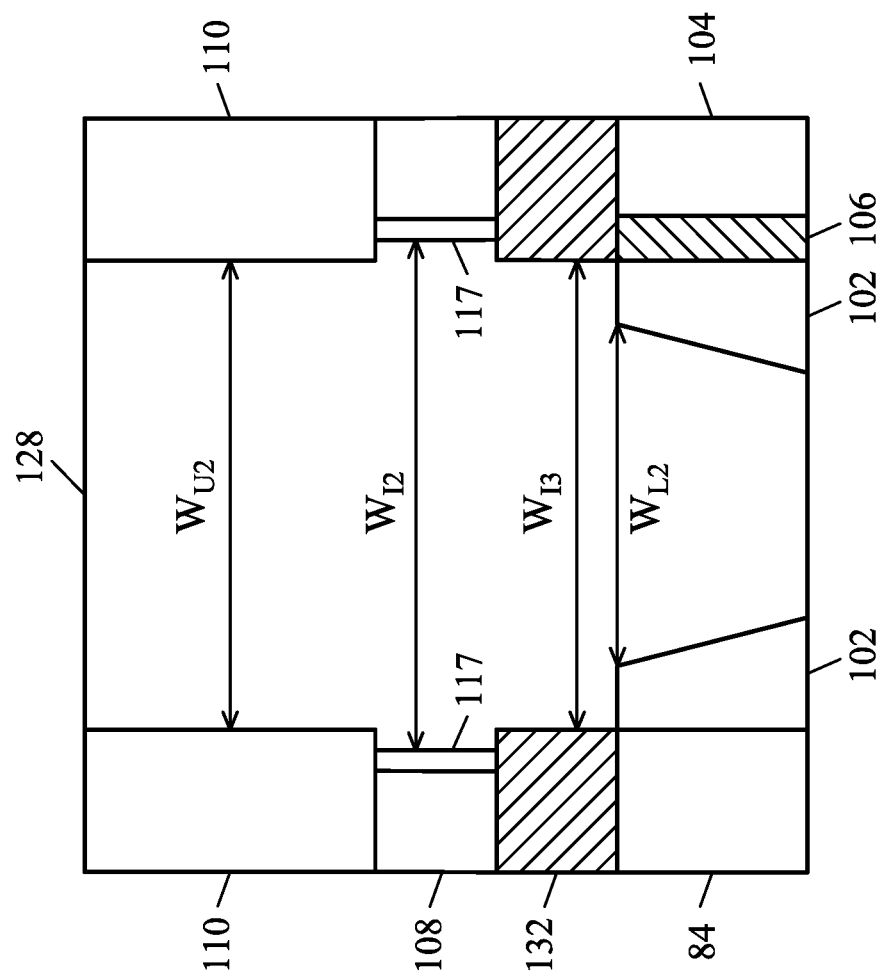

FIG. 38 illustrates additional details of a region 70F of FIG. 37, after the gate contacts 128 are formed. The portions of the gate contacts 128 that extend through the second ILD 110 have the upper widths $W_{U2}$, the portions of the gate contacts 128 that extend through the etch stop layer 108 have the intermediate widths $W_{I2}$, the portions of the gate contacts 128 that extend through the buffer layer 132 have the intermediate widths $W_{I3}$, and the portions of the gate contacts 128 that extend through the gate masks 102 have the lower widths $W_{L2}$, which can be measured at the tops of the gate masks 102.

FIGS. 39 through 47 are cross-sectional views of intermediate stages in the manufacturing of contacts for FinFETs, in accordance with some other embodiments. FIGS. 39 through 47 are shown along the reference cross-section A-A illustrated in FIG. 1, except for multiple FinFETs. In this embodiment, another etch stop layer 136 is formed, and a buffer layer 138 is formed between the etch stop layers 108 and 136.

Figure 39:
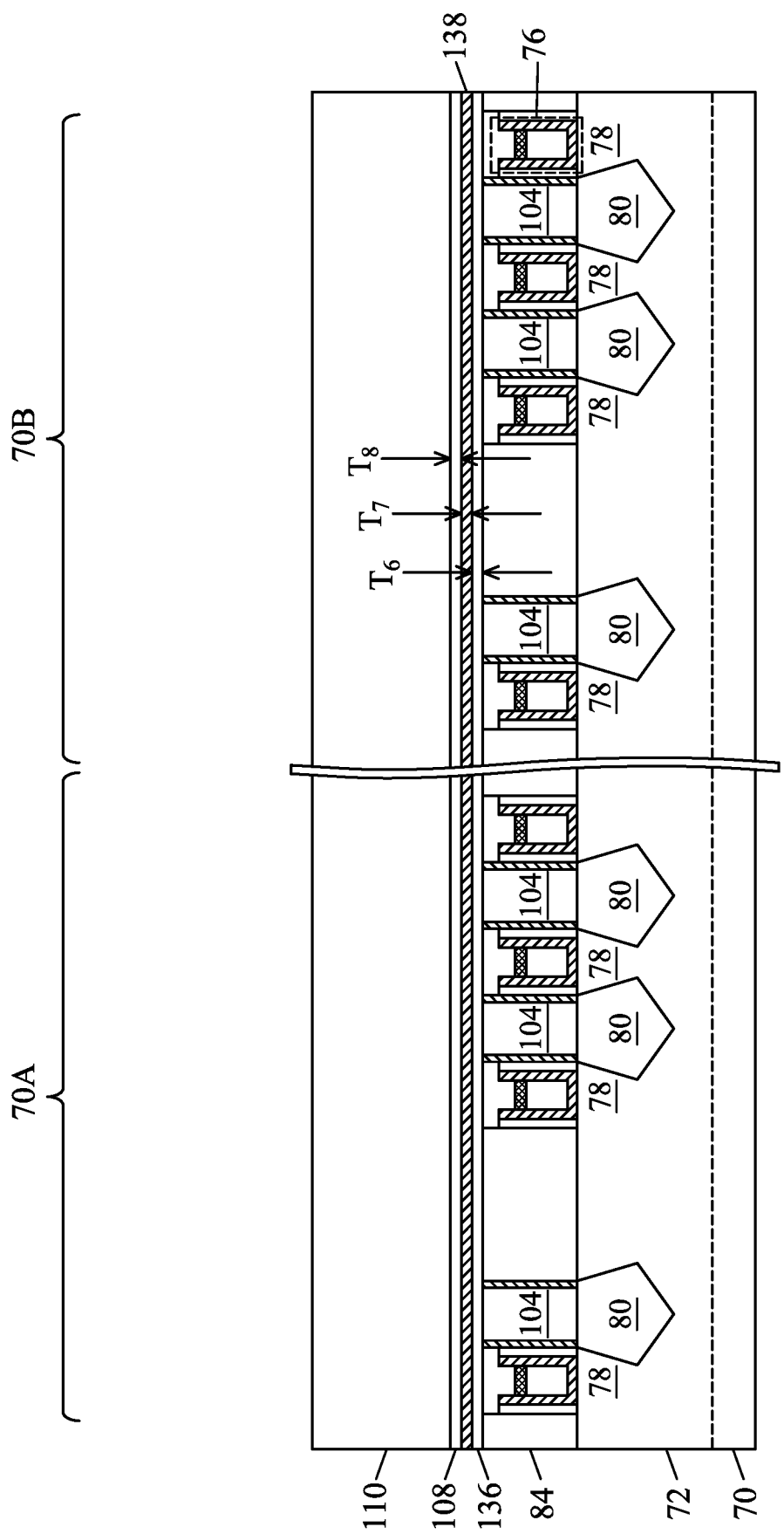
FIGS. 39 through 47 are cross-sectional views of intermediate stages in the manufacturing of contacts for FinFETs, in accordance with some other embodiments.

In FIG. 39, a structure similar to the intermediate structure of FIG. 5 is shown. An etch stop layer 136 is formed over the first ILD 84, a buffer layer 138 is formed over the etch stop layer 136, and the etch stop layer 108 is formed over the buffer layer 138. The use of multiple etch stop layers can help better control pattern loading in a subsequent process for forming source/drain contact openings. The etch stop layer 136 is formed of a material that has a high etch selectivity with the second ILD 110, relative a same etching process. For example, the etch stop layer 136 is formed of an insulating material, such as a single layer of aluminum oxide. The etch stop layer 136 may be formed by a deposition process such as ALD, CVD, PECVD, or the like. Because the etch stop layer 136 has a high etch selectivity with the second ILD 110 relative a same etching process, it can be formed to a small thickness $T_6$. For example, the etch stop layer 136 can have a thickness $T_6$ in the range of about 20 Å to about 40 Å.

The buffer layer 138 is formed of a material that has a high etch selectivity with the etch stop layers 108 and 136, relative a same etching process. For example, the buffer layer 138 is formed of an insulating material, such as a layer of silicon nitride, silicon oxynitride, silicon oxycarbide, tungsten carbide, or the like. The buffer layer 138 may be formed by a deposition process such as ALD, CVD, PECVD, or the like. The buffer layer 138 may be the same material as the gate masks 102. In the embodiment shown, the buffer layer 138 is a single layer of silicon nitride. The buffer layer 138 may also be formed to a small thickness $T_7$. For example, the buffer layer 138 can have a thickness $T_7$ in the range of about 20 Å to about 40 Å. The etch stop layer 108 may be formed to a small thickness $T_8$. For example, the etch stop layer 108 can have a thickness $T_8$ in the range of about 20 Å to about 40 Å.

Figure 40:
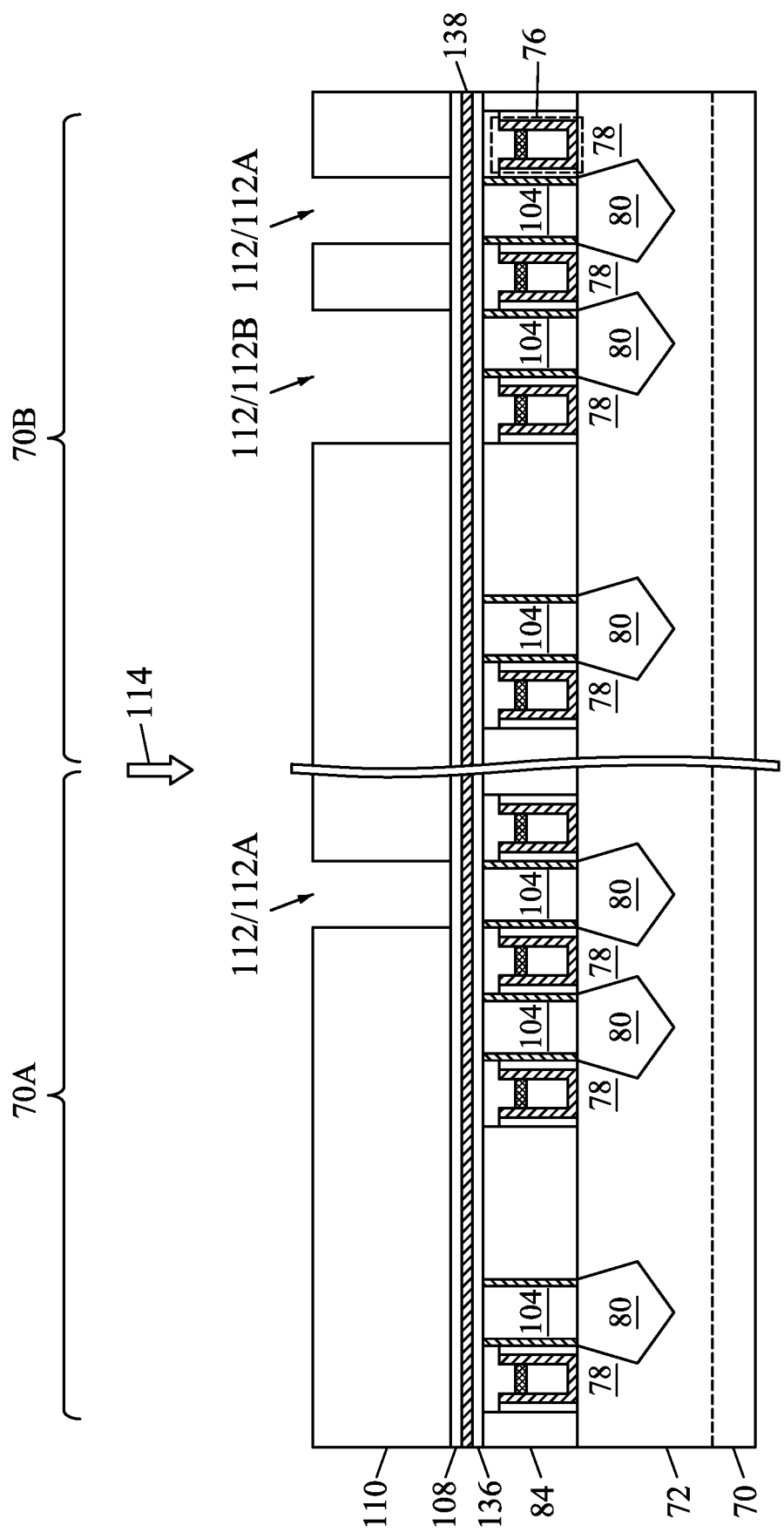

In FIG. 40, a dry etch process is performed to form the source/drain contact openings 112 through the second ILD 110. The dry etch process may be similar to the dry etch process 114 discussed above with reference to FIG. 6.

Figure 41:
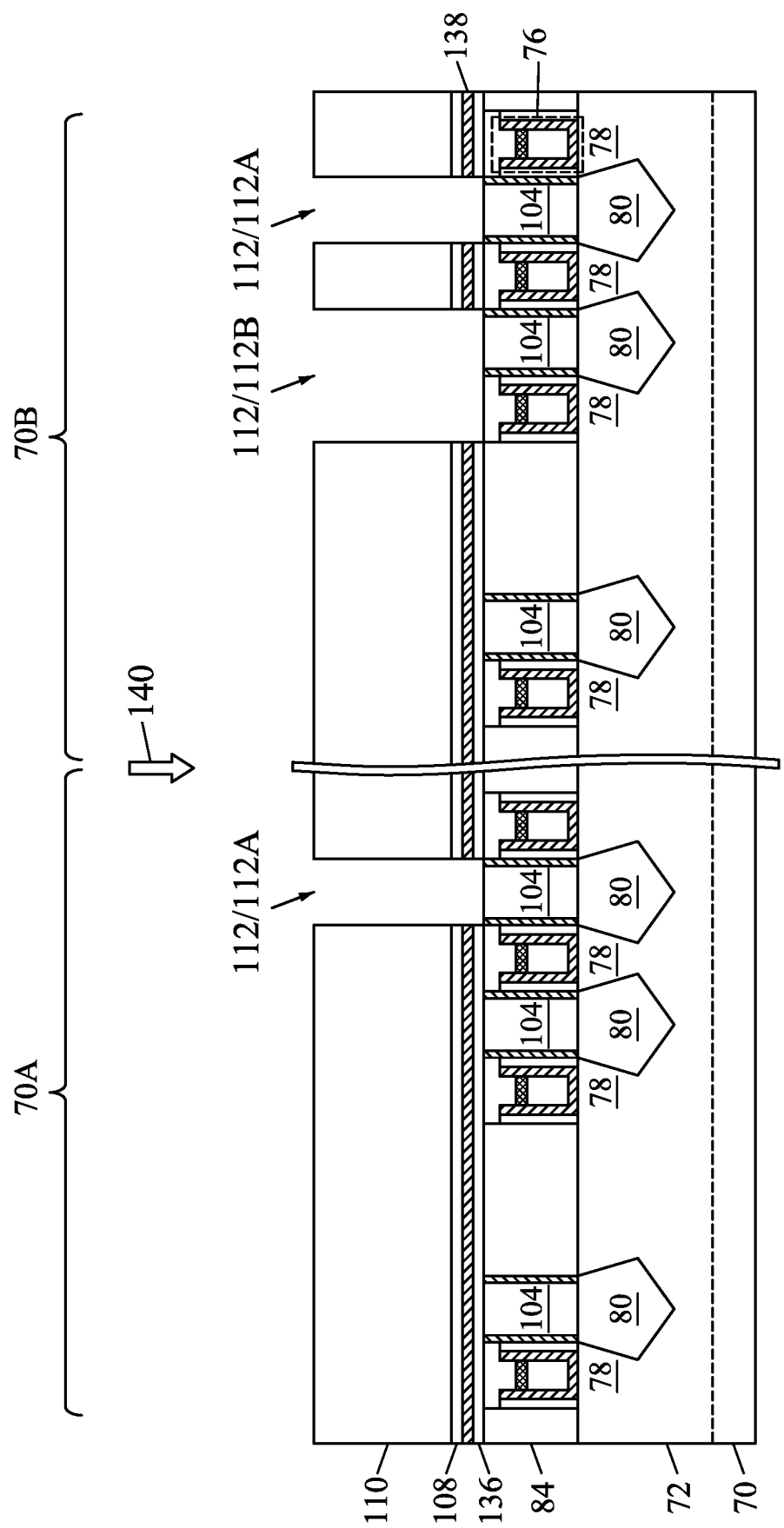

In FIG. 41, the source/drain contact openings 112 are extended through the etch stop layers 108 and 136, and through the buffer layer 138. The extended source/drain contact openings 112 expose the lower source/drain contacts 104. The source/drain contact openings 112 may be extended using an acceptable etching technique. In some embodiments, a combination etch process 140 is performed to extend the source/drain contact openings 112. The combination etch process 140 can include two wet etches and a dry etch. Each of the wet etches is similar to the wet etch process 116, and etch the etch stop layers 108 and 136 with a small amount of lateral etching. The dry etch etches the buffer layer 138 and may be similar to the dry etch process 134.

Figure 42:
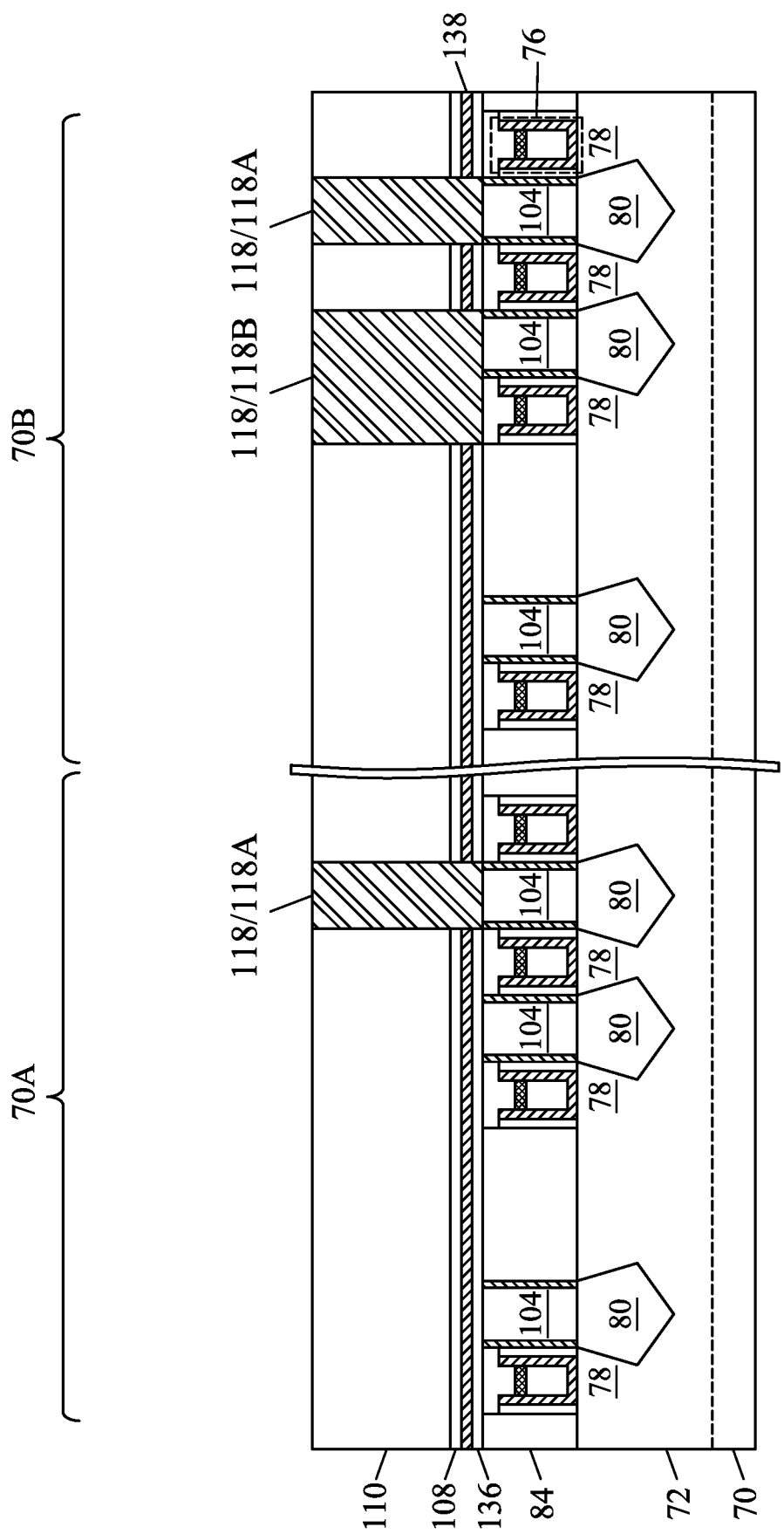

In FIG. 42, the upper source/drain contacts 118 are formed through the second ILD 110, etch stop layers 108 and 136, and buffer layer 138 to be physically and electrically coupled to some of the lower source/drain contacts 104. The upper source/drain contacts 118 may be formed in the source/drain contact openings 112 using a similar method as that discussed above with respect to FIG. 10. Although not separately illustrated, a protective layer 119 (see FIG. 9A) can be formed between the upper source/drain contacts 118 and the lower source/drain contacts 104.

Figure 43:
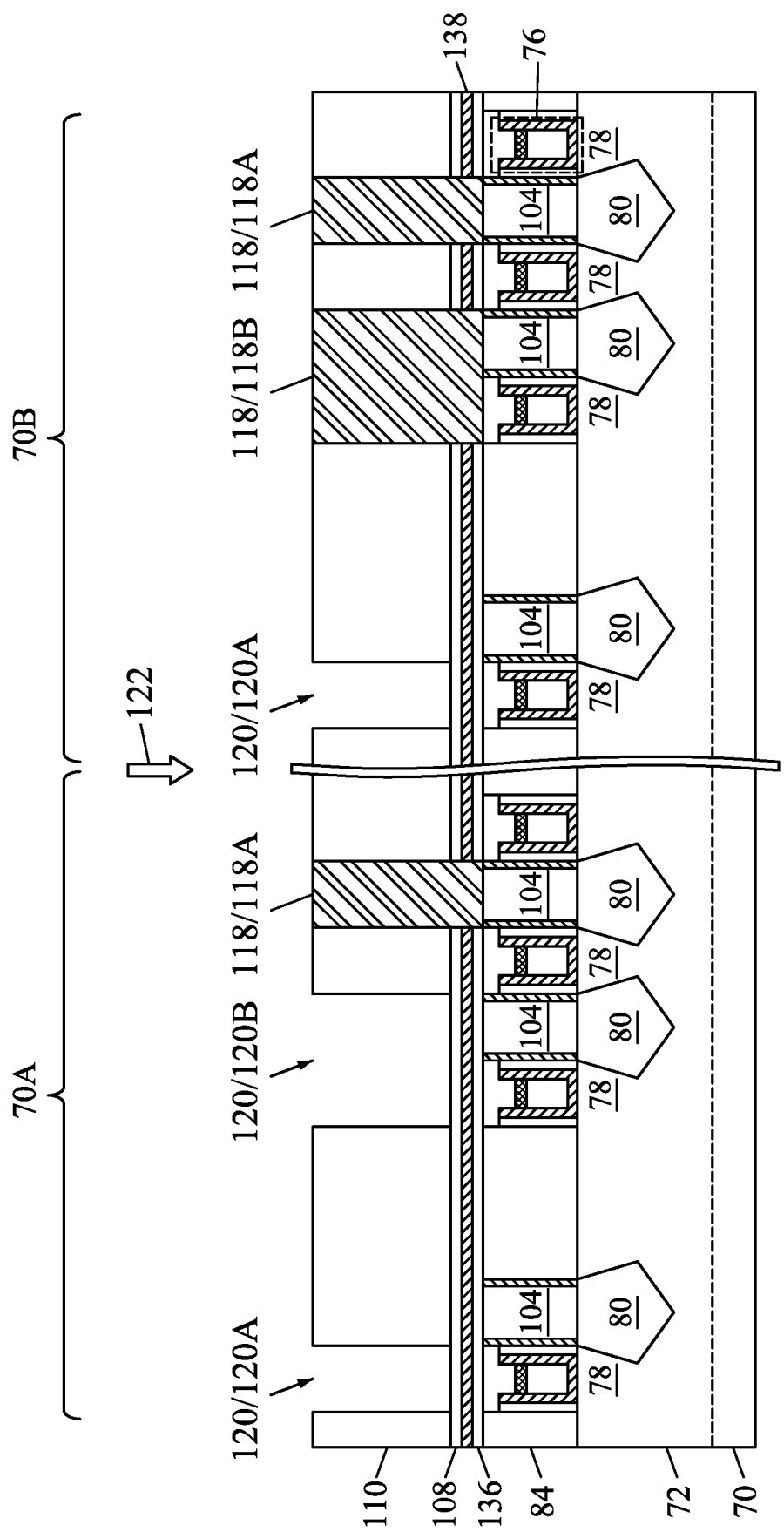

In FIG. 43, a dry etch process is performed to form the gate contact openings 120 through the second ILD 110. The dry etch process may be similar to the dry etch process 122 discussed above with reference to FIG. 12. Although not separately illustrated, a protective layer 123 (see FIG. 12) can be formed on the upper source/drain contacts 118 during the dry etch process.

Figure 44:
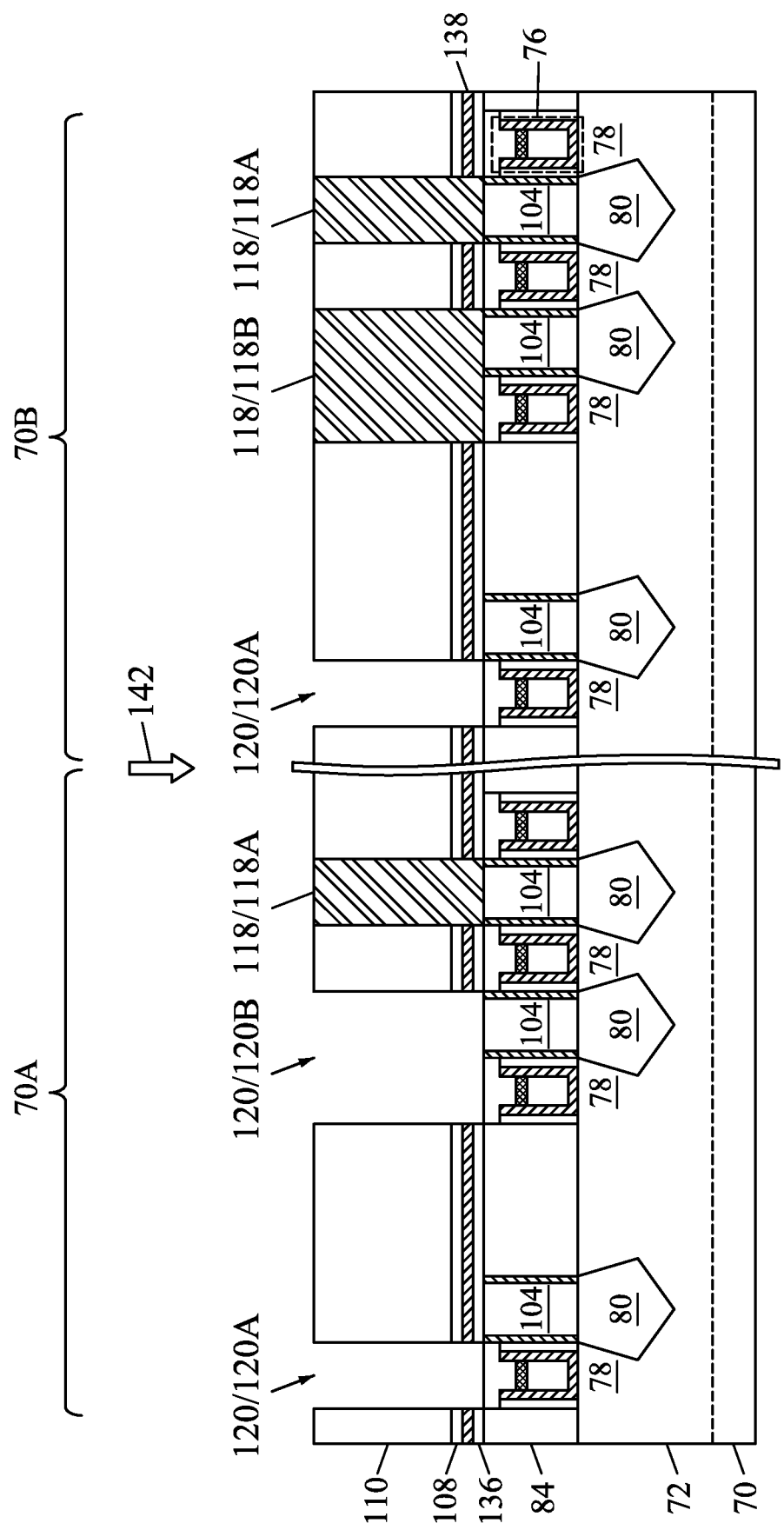

In FIG. 44, the gate contact openings 120 are extended through the etch stop layers 108 and 136, and through the buffer layer 138. The gate contact openings 120 may be extended using an acceptable etching technique. In some embodiments, a combination etch process 142 is performed to extend the gate contact openings 120. The combination etch process 142 is similar to the combination etch process 140 discussed above with respect to FIG. 41.

Figure 45:
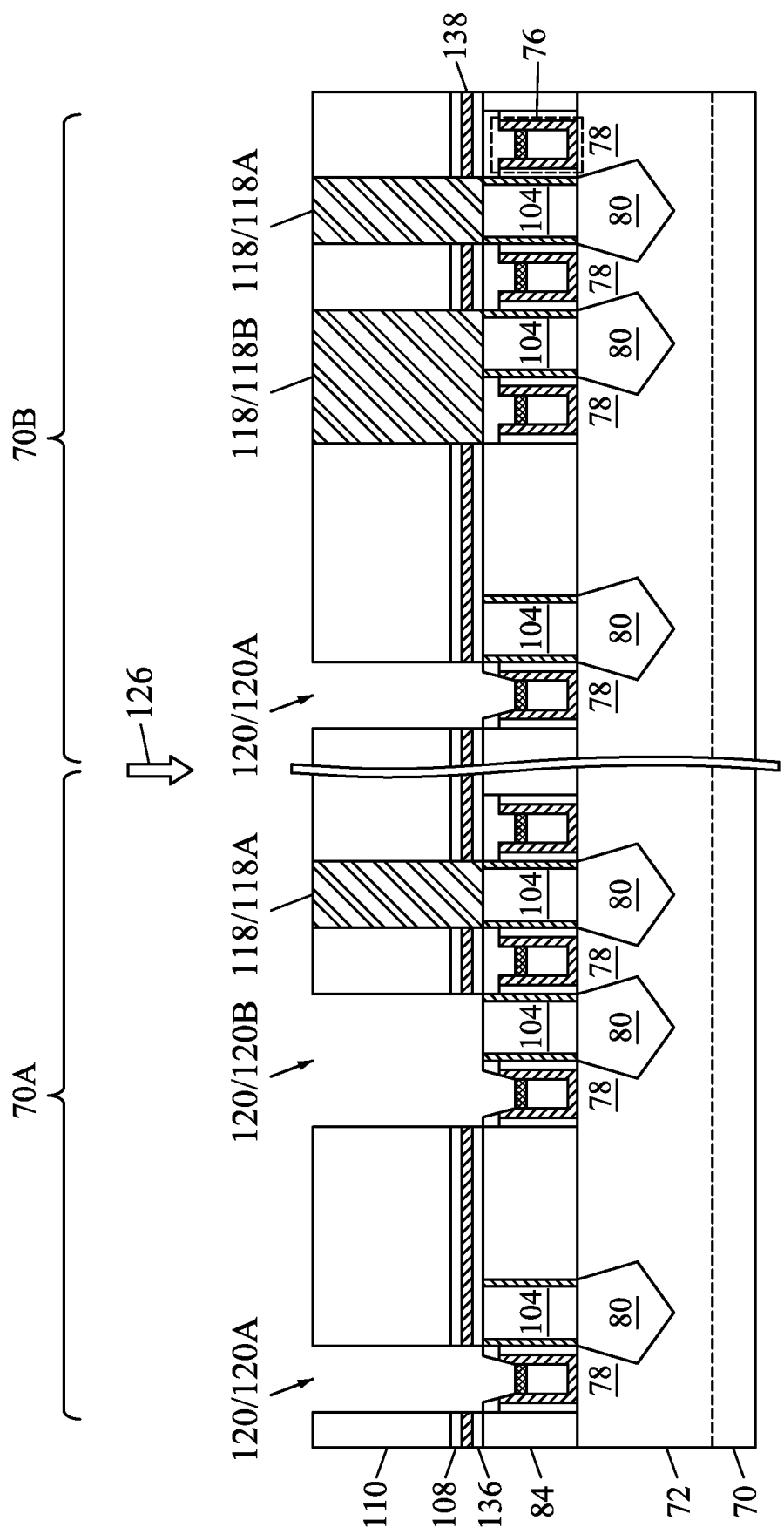

In FIG. 45, a dry etch process is performed to extend the gate contact openings 120 through the buffer layer 138 and gate masks 102. The dry etch process may be similar to the dry etch process 126 discussed above with reference to FIG. 16. The extended gate contact openings 120 expose the gate stacks 76.

Figure 46:
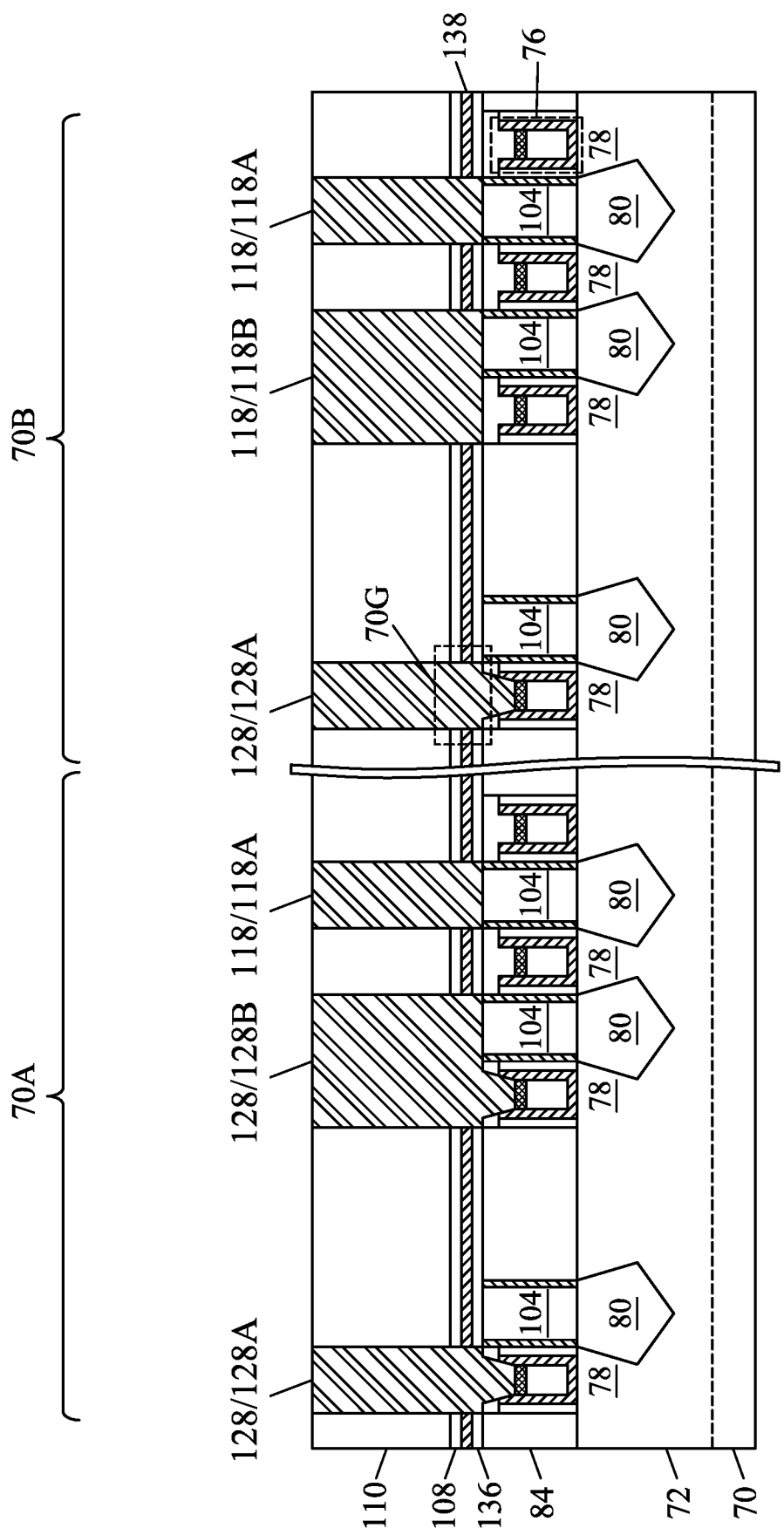

In FIG. 46, the gate contacts 128 are formed through the second ILD 110, etch stop layers 108 and 136, gate masks 102, and buffer layer 138 to be physically and electrically coupled to the gate stacks 76 and optionally to some of the lower source/drain contacts 104. The gate contacts 128 may be formed in the gate contact openings 120 using a similar method as that discussed above with respect to FIG. 18.

Figure 47:
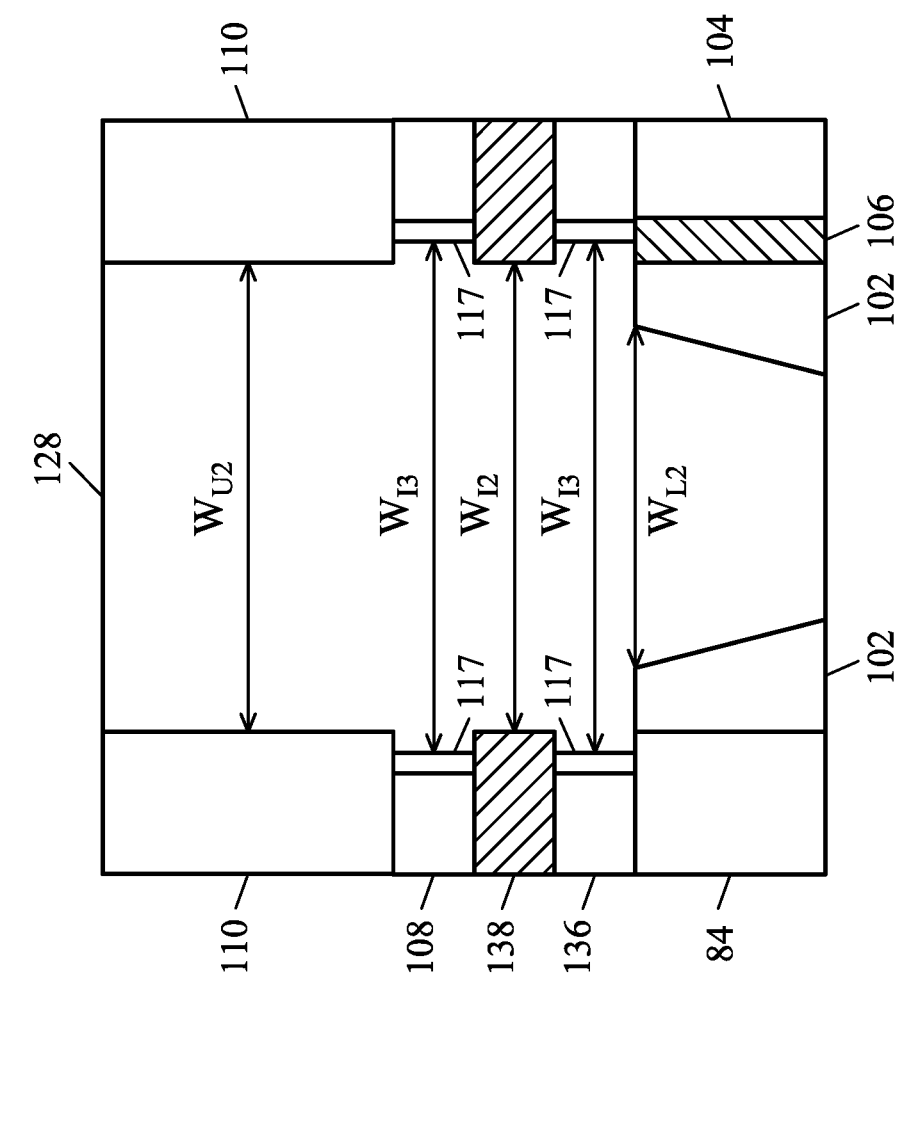

FIG. 47 illustrates additional details of a region 70G of FIG. 46, after the gate contacts 128 are formed. The portions of the gate contacts 128 that extend through the second ILD 110 have the upper widths $W_{U2}$, the portions of the gate contacts 128 that extend through the etch stop layers 108 and 136 have the intermediate widths $W_{I2}$, the portions of the gate contacts 128 that extend through the buffer layer 138 have the intermediate widths $W_{I3}$, and the portions of the gate contacts 128 that extend through the gate masks 102 have the lower widths $W_{L2}$.

FIGS. 48 through 57 are cross-sectional views of intermediate stages in the manufacturing of contacts for FinFETs, in accordance with some other embodiments. FIGS. 48 through 57 are shown along the reference cross-section A-A illustrated in FIG. 1, except for multiple FinFETs. In this embodiments, two buffer layers 144 and 146 are formed sandwiching the etch stop layer 108.

Figure 48:
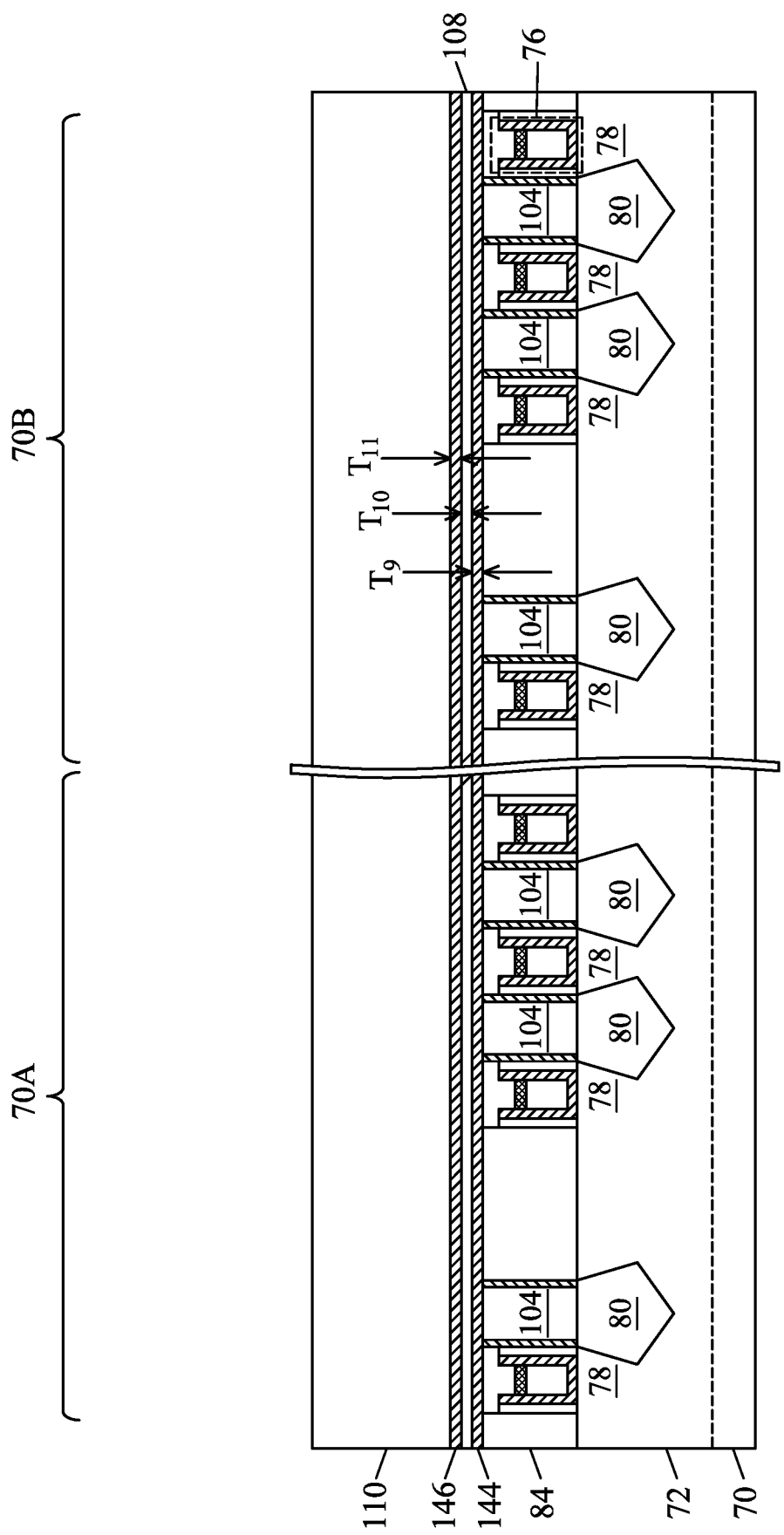
FIGS. 48 through 57 are cross-sectional views of intermediate stages in the manufacturing of contacts for FinFETs, in accordance with some other embodiments.

In FIG. 48, a structure similar to the intermediate structure of FIG. 5 is shown. A buffer layer 144 is formed over the first ILD 84, the etch stop layer 108 is formed over the buffer layer 144, and a buffer layer 146 is formed over the etch stop layer 108. The buffer layers 144 and 146 are formed of a material that has a high etch selectivity with the etch stop layer 108, relative a same etching process. For example, the buffer layers 144 and 146 are formed of an insulating material, such as a layer of silicon nitride, silicon oxynitride, silicon oxycarbide, tungsten carbide, or the like. The buffer layers 144 and 146 may be formed by a deposition process such as ALD, CVD, PECVD, or the like. The buffer layers 144 and 146 may be the same material as the gate masks 102. In the embodiment shown, the buffer layers 144 and 146 are each a single layer of silicon nitride. The buffer layer 144 is formed to a small thickness $T_9$. For example, the buffer layer 144 can have a thickness $T_9$ in the range of about 20 Å to about 40 Å. The etch stop layer 108 may be formed to a small thickness $T_{10}$. For example, the etch stop layer 108 can have a thickness $T_{10}$ in the range of about 20 Å to about 40 Å. Further, the buffer layer 146 is formed to a small thickness $T_{11}$. For example, the buffer layer 146 can have a thickness $T_{11}$ in the range of about 20 Å to about 40 Å.

Figure 49:
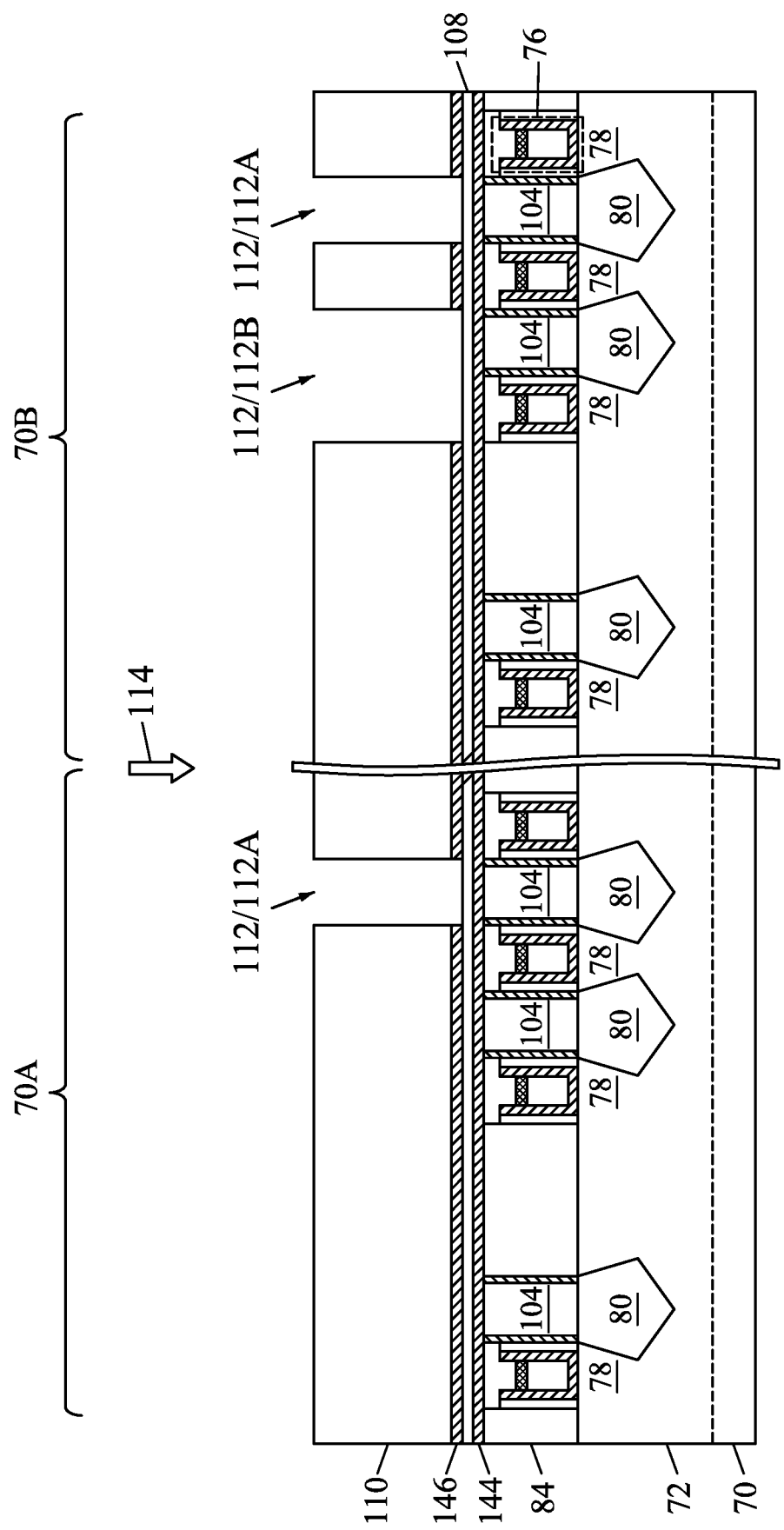

In FIG. 49, a dry etch process is performed to form the source/drain contact openings 112 through the second ILD 110 and buffer layer 146. The dry etch process may be similar to the dry etch process 114 discussed above with reference to FIG. 6. The dry etch process 114 is selective to the materials of the second ILD 110 and buffer layer 146, and removes the material of both layers, albeit at differing rates.

Figure 50:
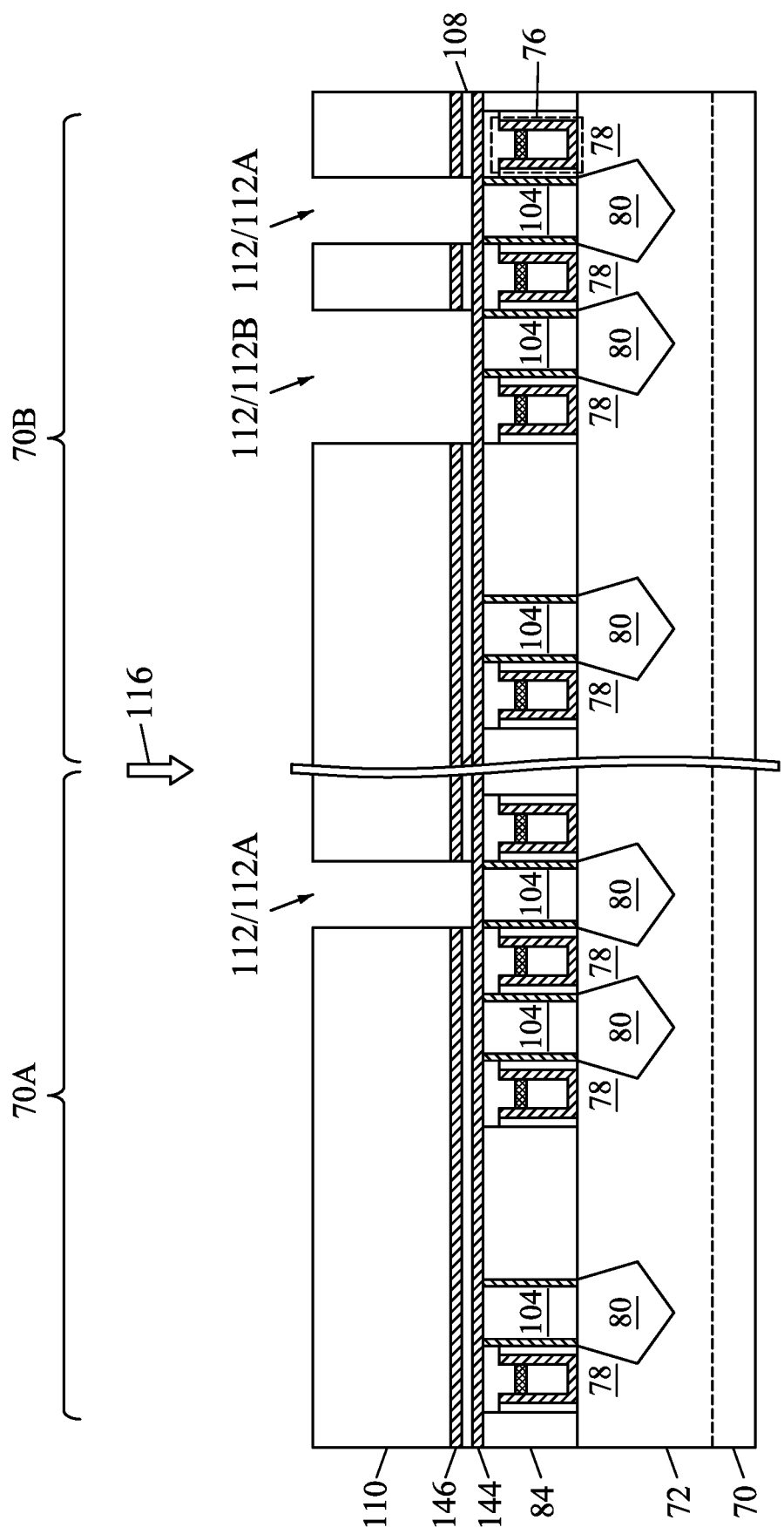

In FIG. 50, a wet etch process is performed to extend the source/drain contact openings 112 through the etch stop layer 108. The wet etch process may be similar to the wet etch process 116 discussed above with reference to FIG. 8. The wet etch process 116 is selective to the material of the damaged etch stop layer regions 108D (see FIG. 7), such that the damaged etch stop layer regions 108D are etched at a higher rate than the undamaged etch stop layer regions 108U and the buffer layers 144 and 146.

Figure 51:
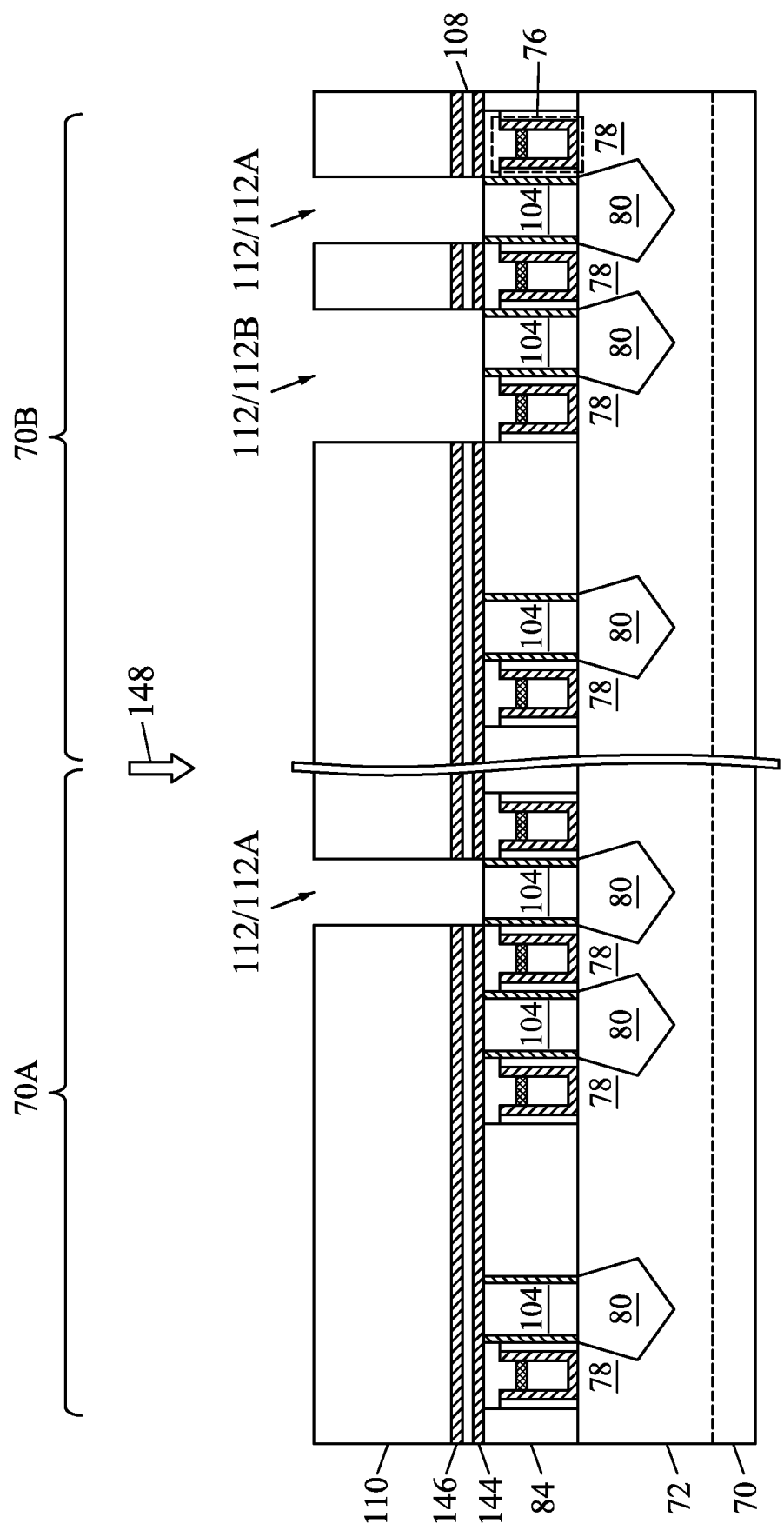

In FIG. 51, the source/drain contact openings 112 are extended through the buffer layer 144. The extended source/drain contact openings 112 expose the lower source/drain contacts 104. The source/drain contact openings 112 may be extended using an acceptable etching technique. In some embodiments, a dry etch process 148 is performed to extend the source/drain contact openings 112 through the buffer layer 144. For example, in some embodiments the dry etch process 148 comprises generating a plasma sheath over the second ILD 110 using fluorocarbon (e.g., $C_xF_y$) gas. The dry etch process 148 can be performed in an environment comprising argon or nitrogen, and can be performed for a duration in the range of about 10 seconds and about 150 seconds. The dry etch process 148 is performed until portions of the buffer layer 144 are removed and the lower source/drain contacts 104 are exposed. Some portions of the gate masks 102 may also be removed. The dry etch process 148 is similar to the dry etch process 126, but can be performed for a different duration. Because the material of the gate masks 102 and buffer layer 144 are similar, the dry etch process 148 can remove some of the gate masks 102. As such, the dry etch process 148 may be a timed etch such that the buffer layer 144 is removed, and the dry etch process 148 is stopped while removing little or no material of the gate masks 102. For example, the dry etch process 148 can be performed for a duration of about 10 seconds to about 150 seconds. Thus, substantially no reduction in height of the gate masks 102 occurs.

Figure 52:
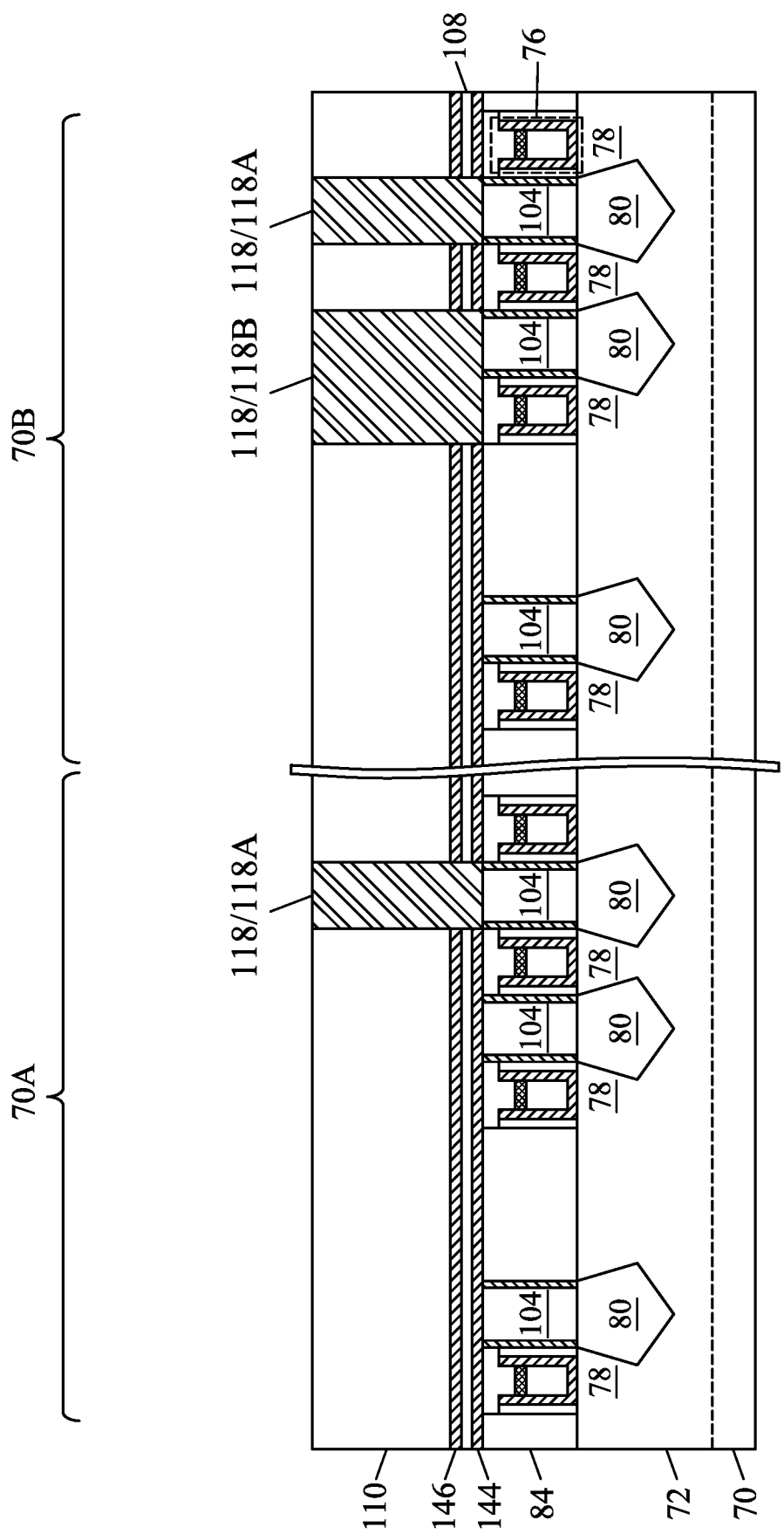

In FIG. 52, the upper source/drain contacts 118 are formed through the second ILD 110, etch stop layer 108, and buffer layers 144 and 146 to be physically and electrically coupled to some of the lower source/drain contacts 104. The upper source/drain contacts 118 may be formed in the source/drain contact openings 112 using a similar method as that discussed above with respect to FIG. 10. Although not separately illustrated, a protective layer 119 (see FIG. 9A) can be formed between the upper source/drain contacts 118 and the lower source/drain contacts 104.

Figure 53:
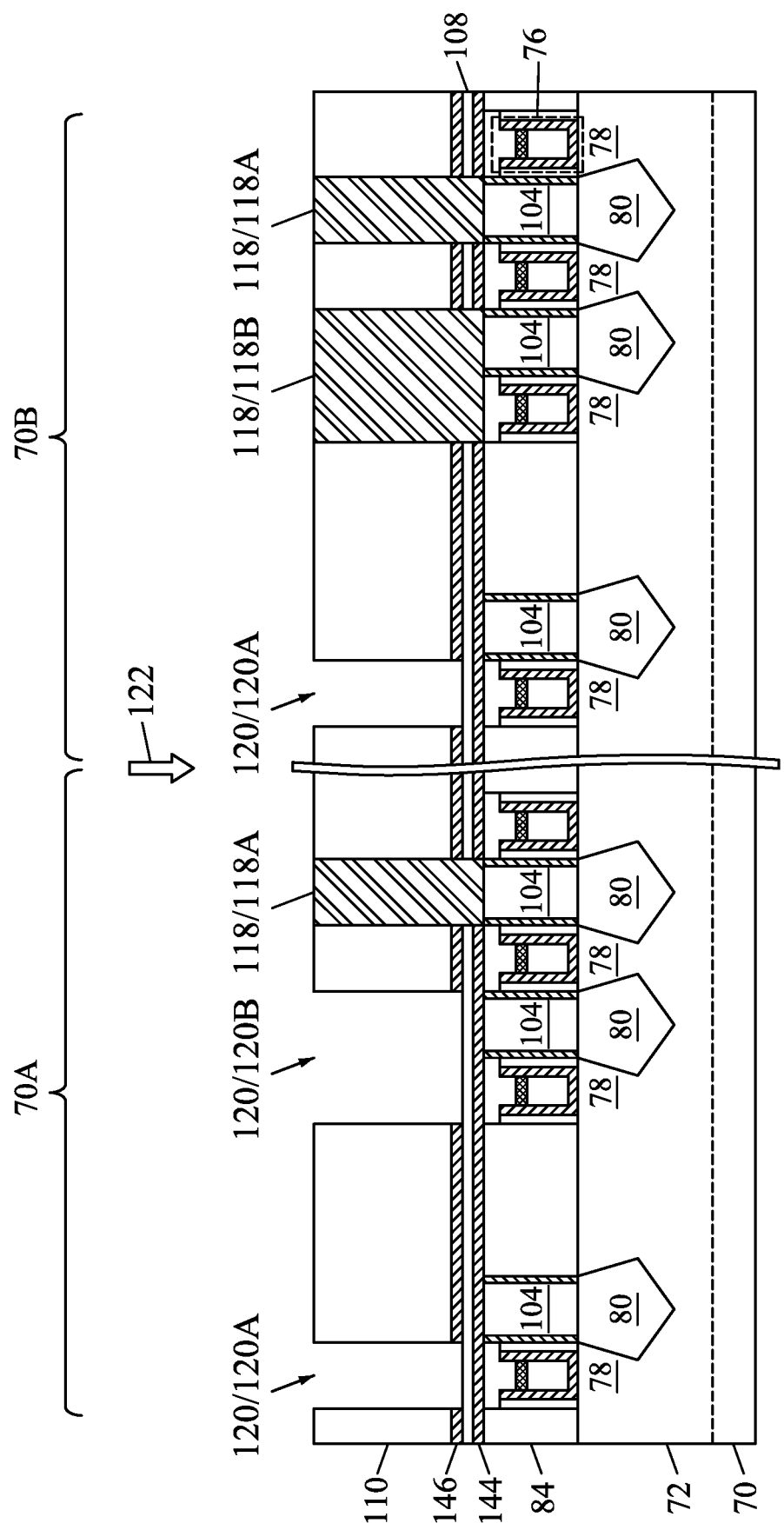

In FIG. 53, a dry etch process is performed to form the gate contact openings 120 through the second ILD 110 and buffer layer 146. The dry etch process may be similar to the dry etch process 122 discussed above with reference to FIG. 12. The dry etch process 122 is selective to the materials of the second ILD 110 and buffer layer 146, and removes the material of both layers, albeit at differing rates. Although not separately illustrated, a protective layer 123 (see FIG. 12) can be formed on the upper source/drain contacts 118 during the dry etch process.

Figure 54:
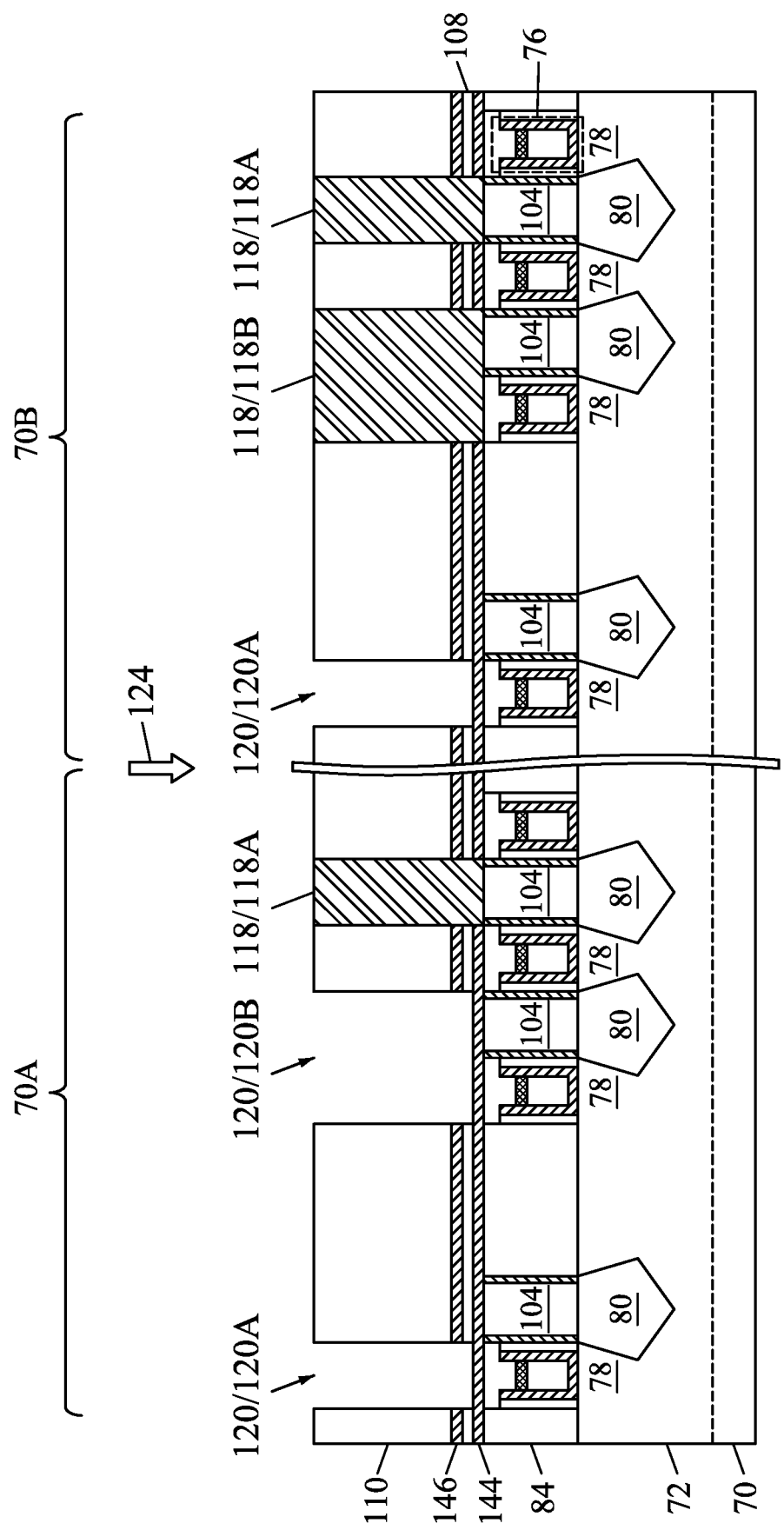

In FIG. 54, a wet etch process is performed to extend the gate contact openings 120 through the etch stop layer 108. The wet etch process may be similar to the wet etch process 124 discussed above with reference to FIG. 14. The wet etch process 124 is selective to the material of the damaged etch stop layer regions 108D (see FIG. 7), such that the damaged etch stop layer regions 108D are etched at a higher rate than the undamaged etch stop layer regions 108U and the buffer layers 144 and 146.

Figure 55:
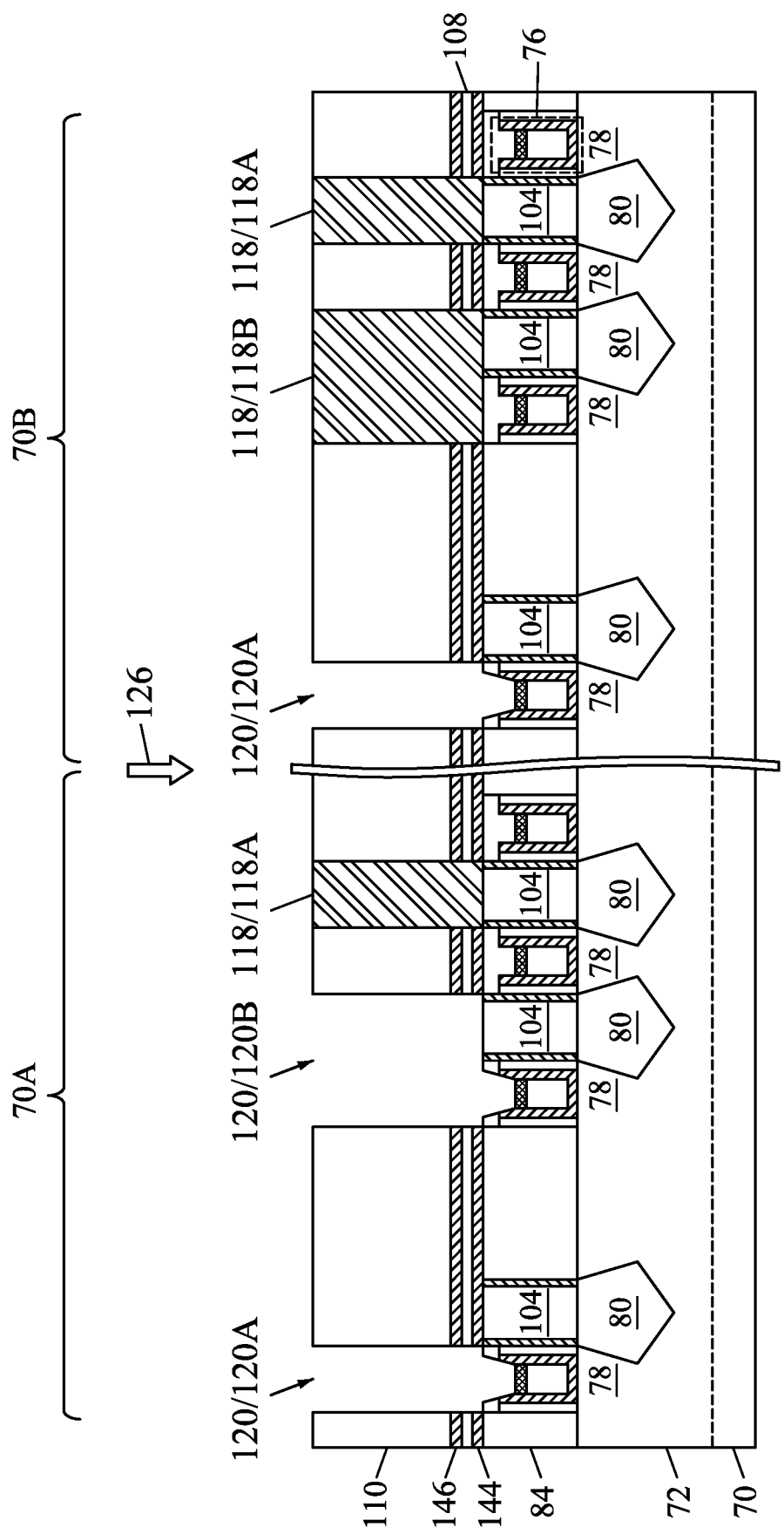

In FIG. 55, a dry etch process is performed to extend the gate contact openings 120 through the buffer layer 144 and gate masks 102. The dry etch process may be similar to the dry etch process 126 discussed above with reference to FIG. 16. The extended gate contact openings 120 expose the gate stacks 76. Because the buffer layer 144 and gate masks 102 can be formed of similar materials, the dry etch process 126 can remove the material of both layers at similar rates.

Figure 56:
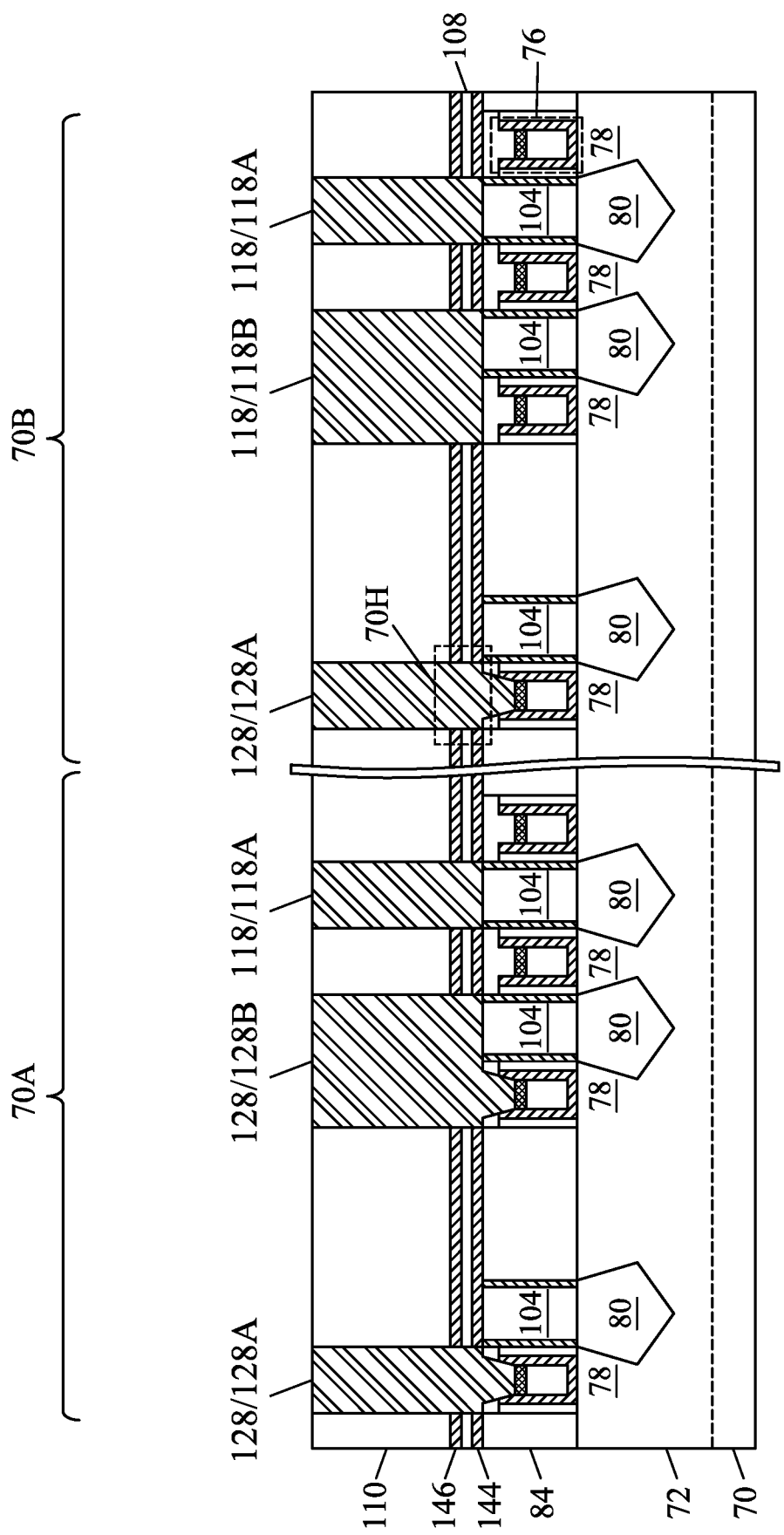

In FIG. 56, the gate contacts 128 are formed through the second ILD 110, etch stop layer 108, gate masks 102, and buffer layers 144 and 146 to be physically and electrically coupled to the gate stacks 76 and optionally to some of the lower source/drain contacts 104. The gate contacts 128 may be formed in the gate contact openings 120 using a similar method as that discussed above with respect to FIG. 18.

Figure 57:
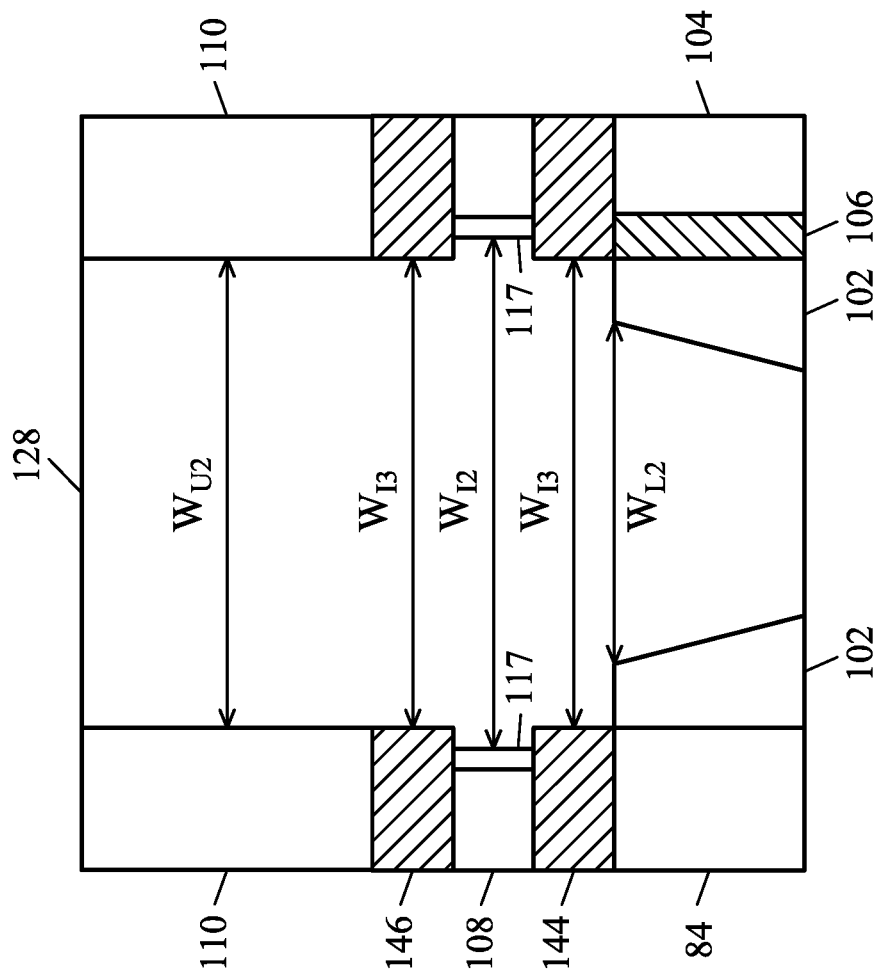

FIG. 57 illustrates additional details of a region 70H of FIG. 56, after the gate contacts 128 are formed. The portions of the gate contacts 128 that extend through the second ILD 110 have the upper widths $W_{U2}$, the portions of the gate contacts 128 that extend through the etch stop layer 108 have the intermediate widths $W_{I2}$, the portions of the gate contacts 128 that extend through the buffer layers 144 and 146 have the intermediate widths $W_{I3}$, and the portions of the gate contacts 128 that extend through the gate masks 102 have the lower widths $W_{L2}$.

Embodiments may achieve advantages. By forming the etch stop layer 108 of a material that has a high etch selectivity with the gate masks 102 and second ILD 110, relative the same etching processes, the amount of over-etching of the etch stop layer 108 may be reduced. Loading effects in subsequent processing may be reduced by reducing over-etching of the etch stop layer 108. Further, by opening the etch stop layer 108 with an etching solution that includes a dielectric protective agent, the amount of lateral etching of the etch stop layer 108 may be reduced when forming the source/drain contact openings 112 and gate contact openings 120. Reducing the lateral etching of the etch stop layer 108 may allow the amount of current leakage of the upper source/drain contacts 118 and gate contacts 128 to be reduced.

In an embodiment, a method includes: depositing a etch stop layer over a first inter-layer dielectric (ILD), the etch stop layer including a first dielectric material; depositing a second ILD over the etch stop layer; etching a first opening through the second ILD with a first dry etching process, the first opening exposing a first region of the etch stop layer, the first region being modified by the first dry etching process to be a second dielectric material, a second region of the etch stop layer remaining covered by the second ILD, the second region being the first dielectric material after the first dry etching process; and extending the first opening through the etch stop layer with a first wet etching process, the etch stop layer being exposed to a first etching solution during the first wet etching process, the first etching solution including a dielectric protective agent for the first dielectric material and an etching agent for the second dielectric material.

In some embodiments of the method, the first dielectric material is aluminum oxide and the second dielectric material is aluminum chloride or aluminum bromide. In some embodiments of the method, the etching agent is hydrofluoric acid or ammonia, and the dielectric protective agent is hydrogen peroxide or ozone. In some embodiments, the method further includes: forming a first conductive feature over a semiconductor substrate, the first conductive feature including a first conductive material; and depositing the first ILD over the first conductive feature, where the first etching solution further includes a first metal protective agent for the first conductive material. In some embodiments, the method further includes: forming a first contact in the first opening, the first contact being physically and electrically coupled to the first conductive feature, the first contact including a second conductive material; etching a second opening through the second ILD with a second dry etching process; and extending the second opening through the etch stop layer with a second wet etching process, the etch stop layer being exposed to a second etching solution during the second wet etching process, the second etching solution including the dielectric protective agent, the etching agent, the first metal protective agent, and a second metal protective agent for the second conductive material. In some embodiments of the method, the first conductive material is cobalt and the second conductive material is tungsten. In some embodiments of the method, the first metal protective agent is a benzotriazole polymer having a methyl or ethyl side chain, and the second metal protective agent is a benzotriazole polymer having a chlorine side chain. In some embodiments, the method further includes: forming a second conductive feature over the semiconductor substrate; depositing a mask over the second conductive feature; and depositing the etch stop layer over the mask. In some embodiments, the method further includes: extending the second opening through the mask with a third dry etching process; and forming a second contact in the second opening, the second contact being physically and electrically coupled to the second conductive feature. In some embodiments, the method further includes: depositing a buffer layer over the mask, the etch stop layer being deposited over the buffer layer; and extending the second opening through the buffer layer with the third dry etching process. In some embodiments, the method further includes: depositing a buffer layer over the etch stop layer, the second ILD being deposited over the buffer layer; and extending the first opening through the buffer layer with the first dry etching process.

In an embodiment, a device includes: a semiconductor substrate; a first inter-layer dielectric (ILD) over the semiconductor substrate; a first conductive feature extending through the first ILD; a first etch stop layer over the first conductive feature and the first ILD, the first etch stop layer being a first dielectric material; a second ILD over the first etch stop layer; a contact having a first portion extending through the second ILD and a second portion extending through the first etch stop layer, the contact being physically and electrically coupled to the first conductive feature; and a first protective layer surrounding the second portion of the contact, the first portion of the contact being free from the first protective layer, the first protective layer being a second dielectric material, the second dielectric material being different from the first dielectric material.

In some embodiments of the device, the first etch stop layer is aluminum oxide. In some embodiments of the device, the first protective layer is aluminum hydroxide. In some embodiments of the device, the first portion of the contact has a first width, the second portion of the contact has a second width, the second width is larger than the first width by a first distance, and the first distance is in a range of 1 nm to 9 nm. In some embodiments, the device further includes: a buffer layer disposed between the first conductive feature and the first etch stop layer, the contact having a third portion extending through the buffer layer, the third portion of the contact being free from the first protective layer. In some embodiments, the device further includes: a buffer layer disposed between the first etch stop layer and the second ILD, the contact having a third portion extending through the buffer layer, the third portion of the contact being free from the first protective layer. In some embodiments, the device further includes: a second etch stop layer disposed between the buffer layer and the second ILD the second etch stop layer being the first dielectric material, the contact having a fourth portion extending through the second etch stop layer; and a second protective layer surrounding the fourth portion of the contact, the second protective layer being the second dielectric material. In some embodiments, the device further includes: a first buffer layer disposed between the first ILD and the first etch stop layer, the contact having a third portion extending through the first buffer layer, the third portion of the contact being free from the first protective layer; and a second buffer layer disposed between the first etch stop layer and the second ILD, the contact having a fourth portion extending through the second buffer layer, the fourth portion of the contact being free from the first protective layer.

In an embodiment, a device includes: a semiconductor substrate; a first conductive feature over the semiconductor substrate; a first etch stop layer over the first conductive feature, the first etch stop layer being a first dielectric material; an inter-layer dielectric (ILD) over the first etch stop layer; and a contact having a first portion extending through the ILD and a second portion extending through the first etch stop layer, the contact being physically and electrically coupled to the first conductive feature, where the first portion of the contact has a first width, the second portion of the contact has a second width, the second width is larger than the first width by a first distance, and the first distance is in a range of 1 nm to 9 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first inter-layer dielectric over a semiconductor substrate;
   a conductive feature extending through the first inter-layer dielectric;
   a first etch stop layer over the conductive feature and the first inter-layer dielectric, the first etch stop layer being a first dielectric material;
   a second inter-layer dielectric over the first etch stop layer;
   a contact having a first portion extending through the second inter-layer dielectric and a second portion extending through the first etch stop layer, the contact being physically and electrically coupled to the conductive feature, the first portion of the contact and the second portion of the contact comprising a continuous conductive material; and
   a first protective layer surrounding the second portion of the contact, the first portion of the contact being free from the first protective layer, the first protective layer being a second dielectric material, the second dielectric material being different from the first dielectric material.

2. The device of claim 1, wherein the first etch stop layer is aluminum oxide.

3. The device of claim 1, wherein the first protective layer is aluminum hydroxide.

4. The device of claim 1, wherein the first portion of the contact has a first width, the second portion of the contact has a second width, the second width is larger than the first width by a first distance, and the first distance is in a range of 1 nm to 9 nm.

5. The device of claim 1 further comprising:
   a buffer layer between the first inter-layer dielectric and the first etch stop layer, the contact having a third portion extending through the buffer layer, the third portion of the contact being free from the first protective layer.

6. The device of claim 1 further comprising:
a buffer layer between the first etch stop layer and the second inter-layer dielectric, the contact having a third portion extending through the buffer layer, the third portion of the contact being free from the first protective layer.

7. The device of claim 6 further comprising:
a second etch stop layer between the buffer layer and the second inter-layer dielectric, the second etch stop layer being the first dielectric material, the contact having a fourth portion extending through the second etch stop layer; and
a second protective layer surrounding the fourth portion of the contact, the second protective layer being the second dielectric material.

8. The device of claim 1 further comprising:
a first buffer layer between the first inter-layer dielectric and the first etch stop layer, the contact having a third portion extending through the first buffer layer, the third portion of the contact being free from the first protective layer; and
a second buffer layer between the first etch stop layer and the second inter-layer dielectric, the contact having a fourth portion extending through the second buffer layer, the fourth portion of the contact being free from the first protective layer.

9. A device comprising:
a conductive feature over a semiconductor substrate;
a first etch stop layer over the conductive feature;
an inter-layer dielectric over the first etch stop layer; and
a contact having a first portion extending through the inter-layer dielectric and a second portion extending through the first etch stop layer, the contact being physically and electrically coupled to the conductive feature,
wherein the first portion of the contact has a first width, the second portion of the contact has a second width, the second width is larger than the first width by a first distance, and the first distance is in a range of 1 nm to 9 nm.

10. The device of claim 9 further comprising:
a buffer layer between the first etch stop layer and the inter-layer dielectric, the contact having a third portion extending through the buffer layer, the third portion of the contact having a third width, the second width larger than the third width.

11. The device of claim 9 further comprising:
a buffer layer between the first etch stop layer and the conductive feature, the contact having a third portion extending through the buffer layer, the third portion of the contact having a third width, the second width larger than the third width.

12. The device of claim 9 further comprising:
a second etch stop layer between the first etch stop layer and the conductive feature, the contact having a third portion extending through the second etch stop layer; and
a buffer layer between the second etch stop layer and the first etch stop layer, the contact having a fourth portion extending through the buffer layer,
wherein the third portion of the contact has a third width, the fourth portion of the contact has a fourth width, and the fourth width is larger than the third width.

13. The device of claim 9, wherein the conductive feature is a gate electrode.

14. The device of claim 9, wherein the conductive feature is a source/drain contact.

15. The device of claim 9 further comprising:
a first protective layer surrounding the second portion of the contact, the first portion of the contact being free from the first protective layer, the first protective layer comprising a first dielectric material, the first etch stop layer comprising a second dielectric material, the second dielectric material different from the first dielectric material; and
a second protective layer between the contact and the conductive feature, the second protective layer comprising anthracene.

16. A device comprising:
a first conductive feature over a semiconductor substrate;
an etch stop layer over the first conductive feature, the etch stop layer comprising a first dielectric material;
an inter-layer dielectric over the etch stop layer;
a second conductive feature having a first portion extending through the inter-layer dielectric and a second portion extending through the etch stop layer, the second conductive feature being coupled to the first conductive feature; and
a first protective layer surrounding the second portion of the second conductive feature, the first portion of the second conductive feature being free from the first protective layer, the first protective layer comprising a second dielectric material, the second dielectric material being a product of the first dielectric material and a dielectric protective agent.

17. The device of claim 16, wherein the first conductive feature comprises a first conductive material, the device further comprising:
a second protective layer between the first conductive feature and the second conductive feature, the second protective layer comprising a second conductive material, the second conductive material being a product of the first conductive material and a metal protective agent.

18. The device of claim 17, wherein the first conductive material is cobalt and the second conductive material is anthracene.

19. The device of claim 16, wherein the first dielectric material is aluminum oxide and the second dielectric material is aluminum hydroxide.

20. The device of claim 16, wherein a density of the first protective layer is greater than a density of the etch stop layer.

* * * * *